(12) United States Patent
Date

(10) Patent No.: US 10,622,079 B2
(45) Date of Patent: *Apr. 14, 2020

(54) MEMORY DEVICE AND MEMORY SYSTEM

(71) Applicant: TOSHIBA MEMORY CORPORATION, Minato-ku, Tokyo (JP)

(72) Inventor: Hiroki Date, Chigasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/528,318

(22) Filed: Jul. 31, 2019

(65) Prior Publication Data

US 2019/0355430 A1  Nov. 21, 2019

Related U.S. Application Data

(62) Division of application No. 15/917,281, filed on Mar. 9, 2018, now Pat. No. 10,418,118.

(30) Foreign Application Priority Data

Mar. 27, 2017 (JP) .................... 2017-060387

(51) Int. Cl.
*G11C 16/34* (2006.01)
*G11C 16/30* (2006.01)
(Continued)

(52) U.S. Cl.
CPC ...... *G11C 16/3454* (2013.01); *G11C 16/0483* (2013.01); *G11C 16/10* (2013.01); *G11C 16/14* (2013.01); *G11C 16/16* (2013.01); *G11C 16/30* (2013.01); *G11C 16/344* (2013.01); *G11C 16/3495* (2013.01); *H01L 27/11556* (2013.01);
(Continued)

(58) Field of Classification Search
CPC . G11C 16/3454; G11C 16/16; G11C 16/3495; G11C 16/344; G11C 16/0483; G11C 16/10; G11C 16/14; G11C 16/30; G11C 16/26; G11C 16/08
See application file for complete search history.

(56) References Cited

U.S. PATENT DOCUMENTS 6,111,789 A  8/2000 Choi et al.
6,580,643 B1  6/2003 Satoh et al.
(Continued)

FOREIGN PATENT DOCUMENTS

JP  2008027511 A  2/2008
JP  2008047273 A  2/2008
JP  2010129104 A  6/2010

*Primary Examiner* — Mohammed A Bashar
(74) *Attorney, Agent, or Firm* — Holtz, Holtz & Volek PC

(57) ABSTRACT

According to one embodiment, a memory device comprises a first memory cell configured to store data, a first word line connected to the first memory cell, a first circuit configured to supply a voltage to the first word line, a second circuit configured to control the first circuit, and a sequencer configured to control the first circuit and the second circuit. The sequencer, when data is written to the first memory cell, determines whether a condition is satisfied or not. The sequencer causes the second circuit to generate a first voltage, when the sequencer determines that the condition is not satisfied, and causes the second circuit to generate a second voltage which is higher than the first voltage, when the sequencer determines that the condition is satisfied.

7 Claims, 53 Drawing Sheets

(51) Int. Cl.
  *H01L 27/11556* (2017.01)
  *G11C 16/10* (2006.01)
  *G11C 16/04* (2006.01)
  *H01L 27/11582* (2017.01)
  *G11C 16/14* (2006.01)
  *G11C 16/16* (2006.01)
  *G11C 16/08* (2006.01)
  *G11C 16/26* (2006.01)

(52) U.S. Cl.
  CPC .... *H01L 27/11582* (2013.01); *G11C 16/0408* (2013.01); *G11C 16/0466* (2013.01); *G11C 16/08* (2013.01); *G11C 16/26* (2013.01)

(56) References Cited

U.S. PATENT DOCUMENTS

| | | |
|---|---|---|
| 8,599,614 B2 | 12/2013 | Miida et al. |
| 2002/0036317 A1 | 3/2002 | Matsui et al. |
| 2006/0223201 A1 | 10/2006 | Liu et al. |
| 2008/0019182 A1 | 1/2008 | Yanagidaira et al. |
| 2008/0205137 A1 | 8/2008 | Yanagidaira et al. |
| 2009/0267128 A1 | 10/2009 | Maejima |
| 2009/0268522 A1 | 10/2009 | Maejima |
| 2009/0316494 A1 | 12/2009 | Uehara et al. |
| 2010/0034023 A1 | 2/2010 | Shingu et al. |
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0069663 A1 | 3/2012 | Itagaki et al. |
| 2012/0201083 A1 | 8/2012 | Fujiu |
| 2012/0307557 A1 | 12/2012 | Itagaki |
| 2013/0033938 A1 | 2/2013 | Park et al. |
| 2014/0022008 A1 | 1/2014 | Noorlag et al. |

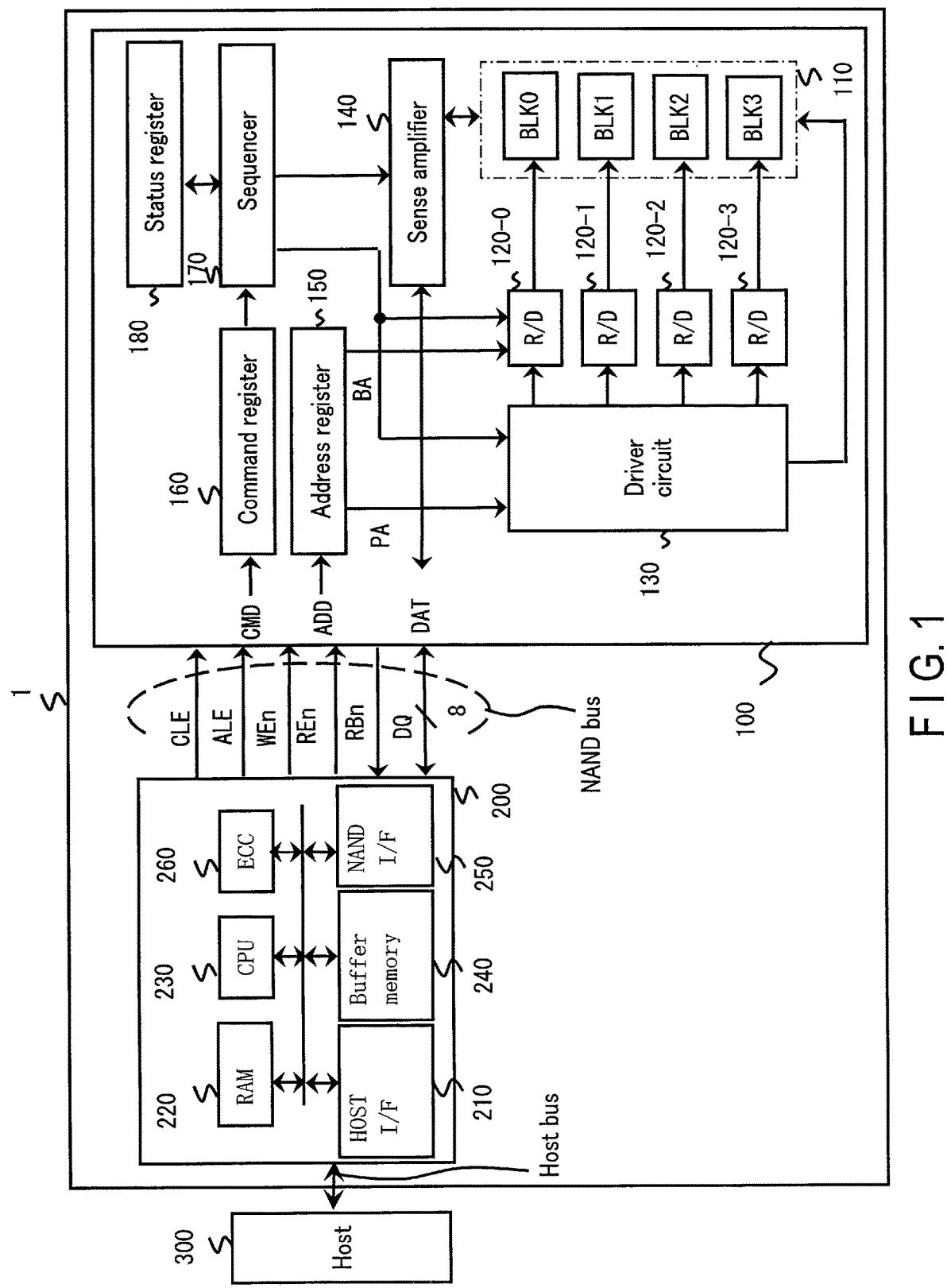
F I G. 1

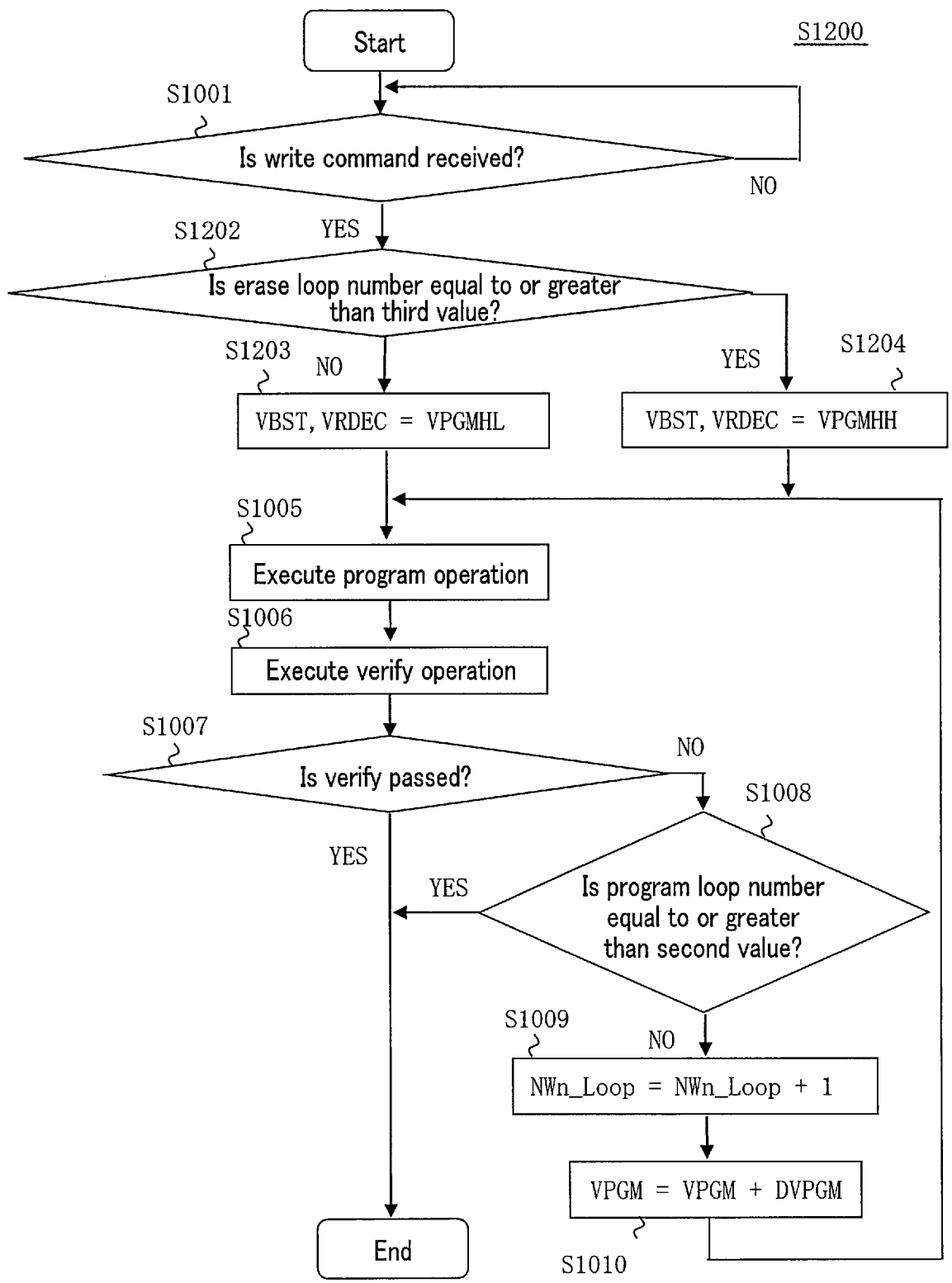
F I G. 15

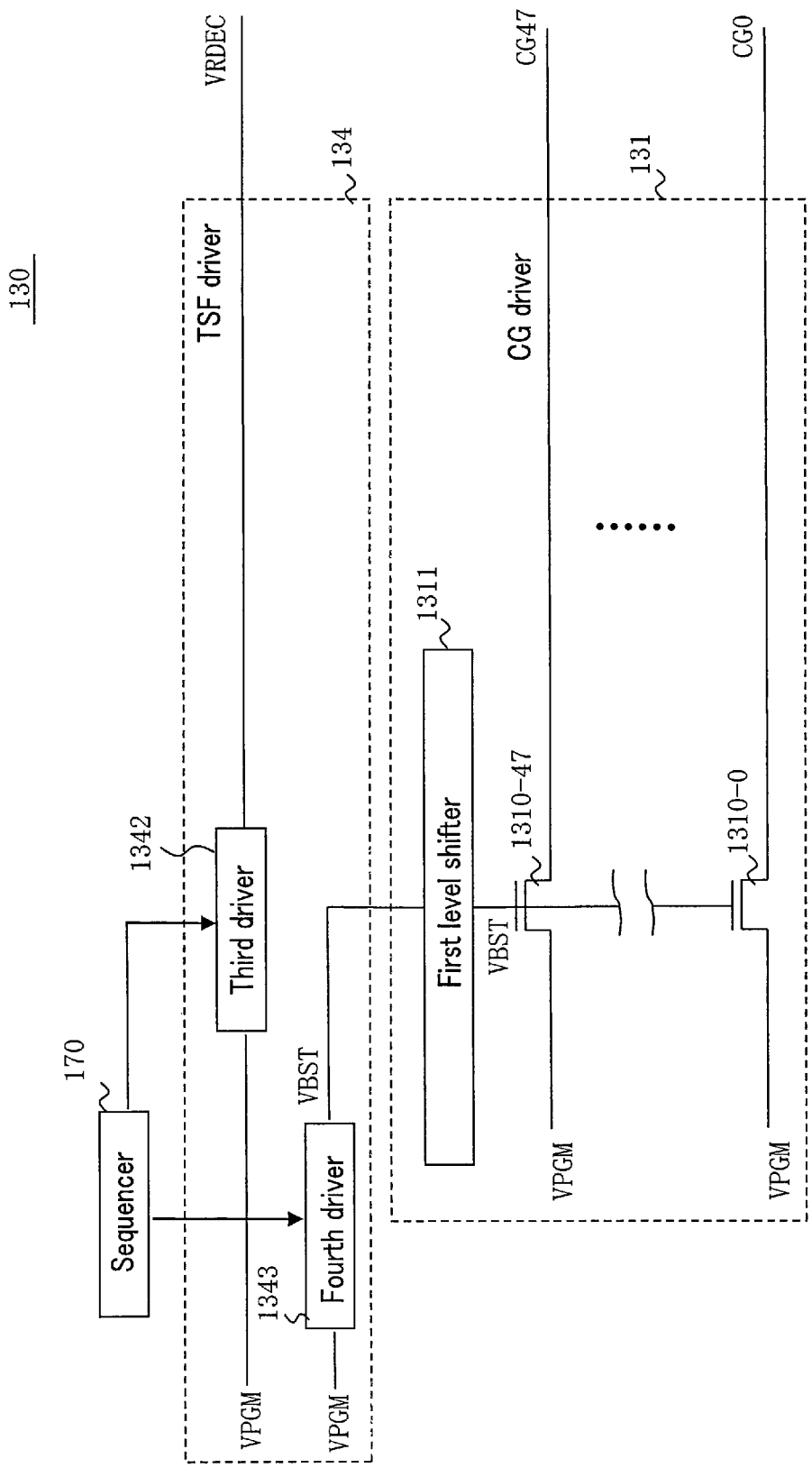
F I G. 20

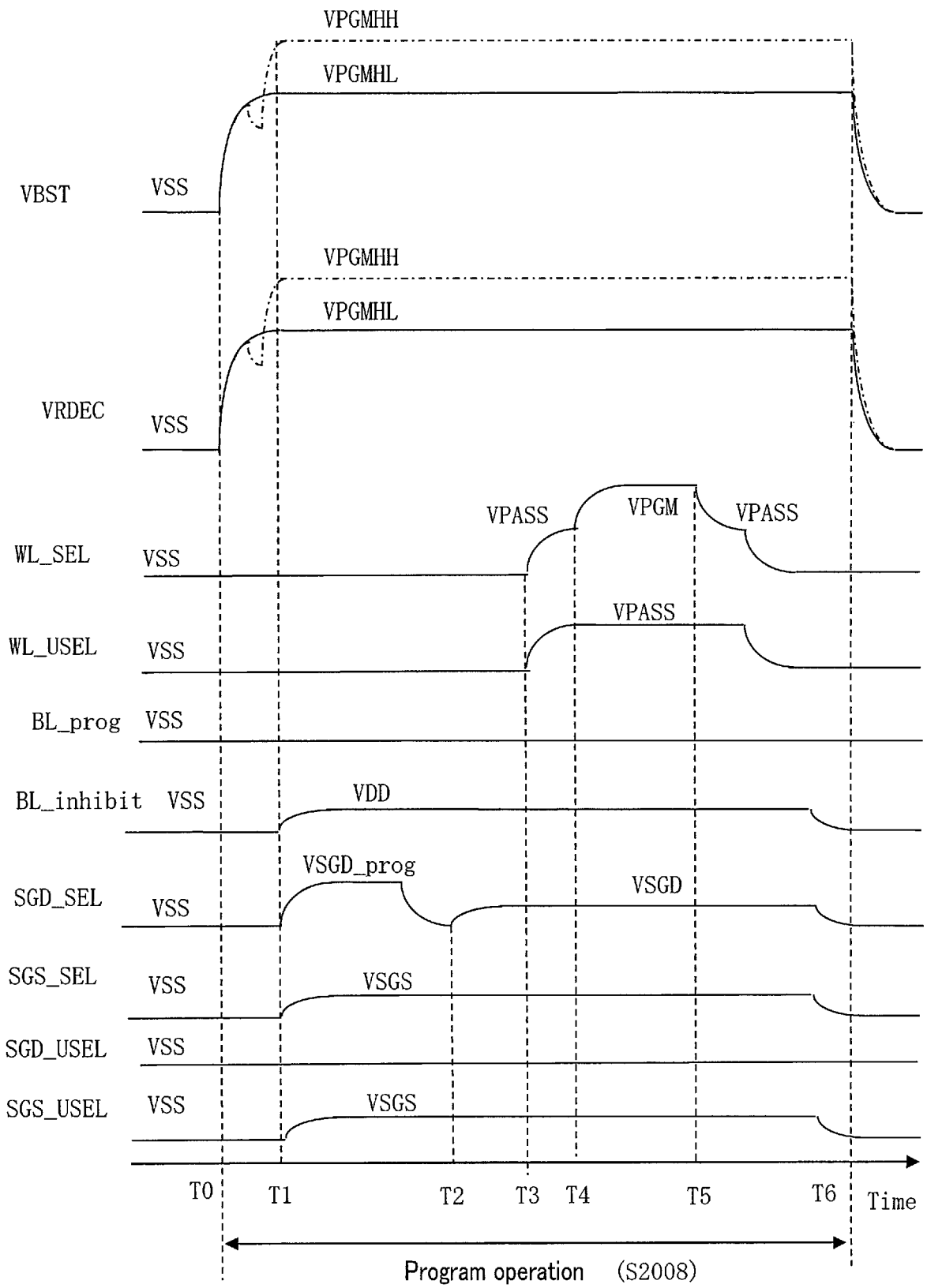
F I G. 23

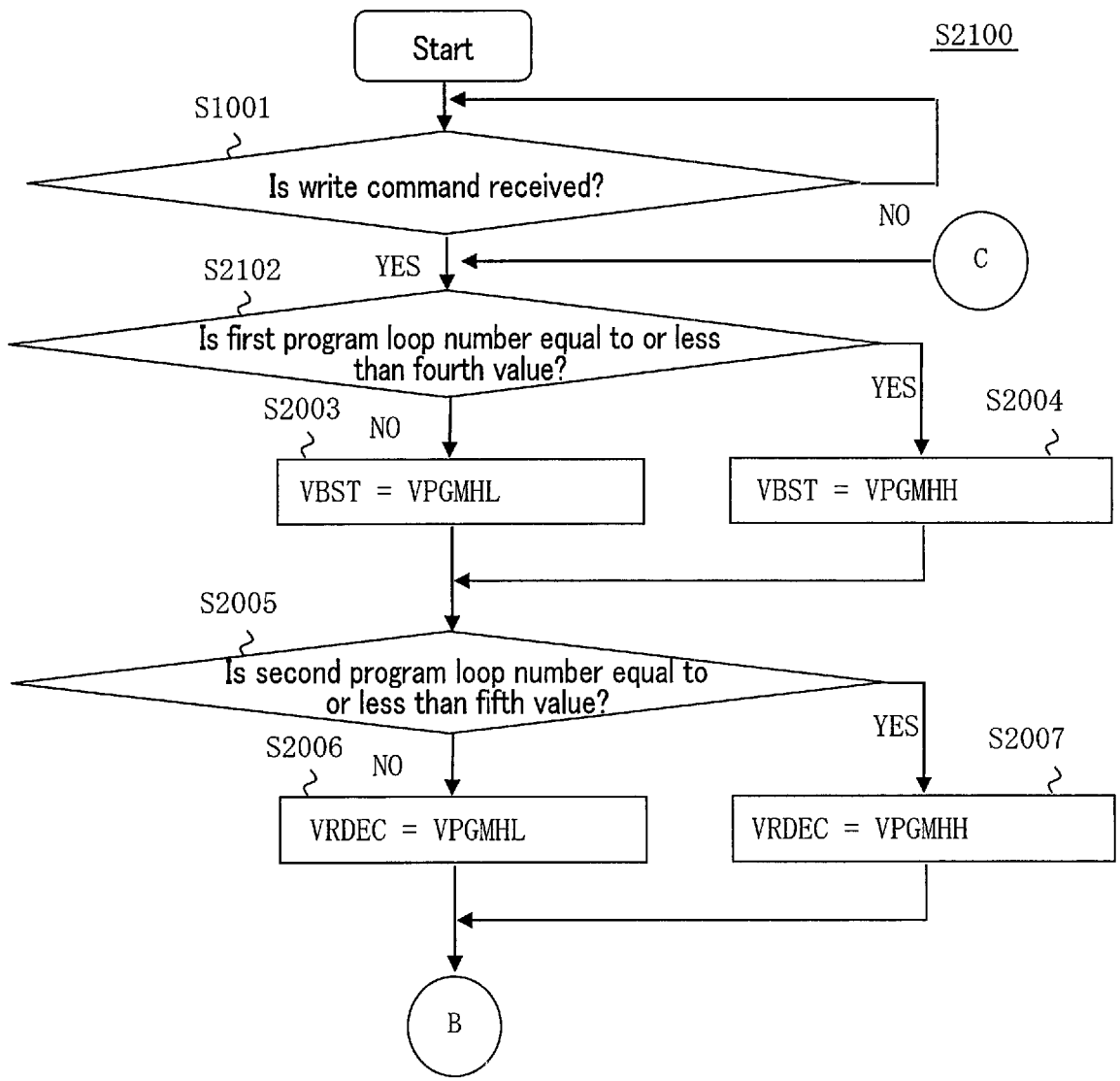
F I G. 25

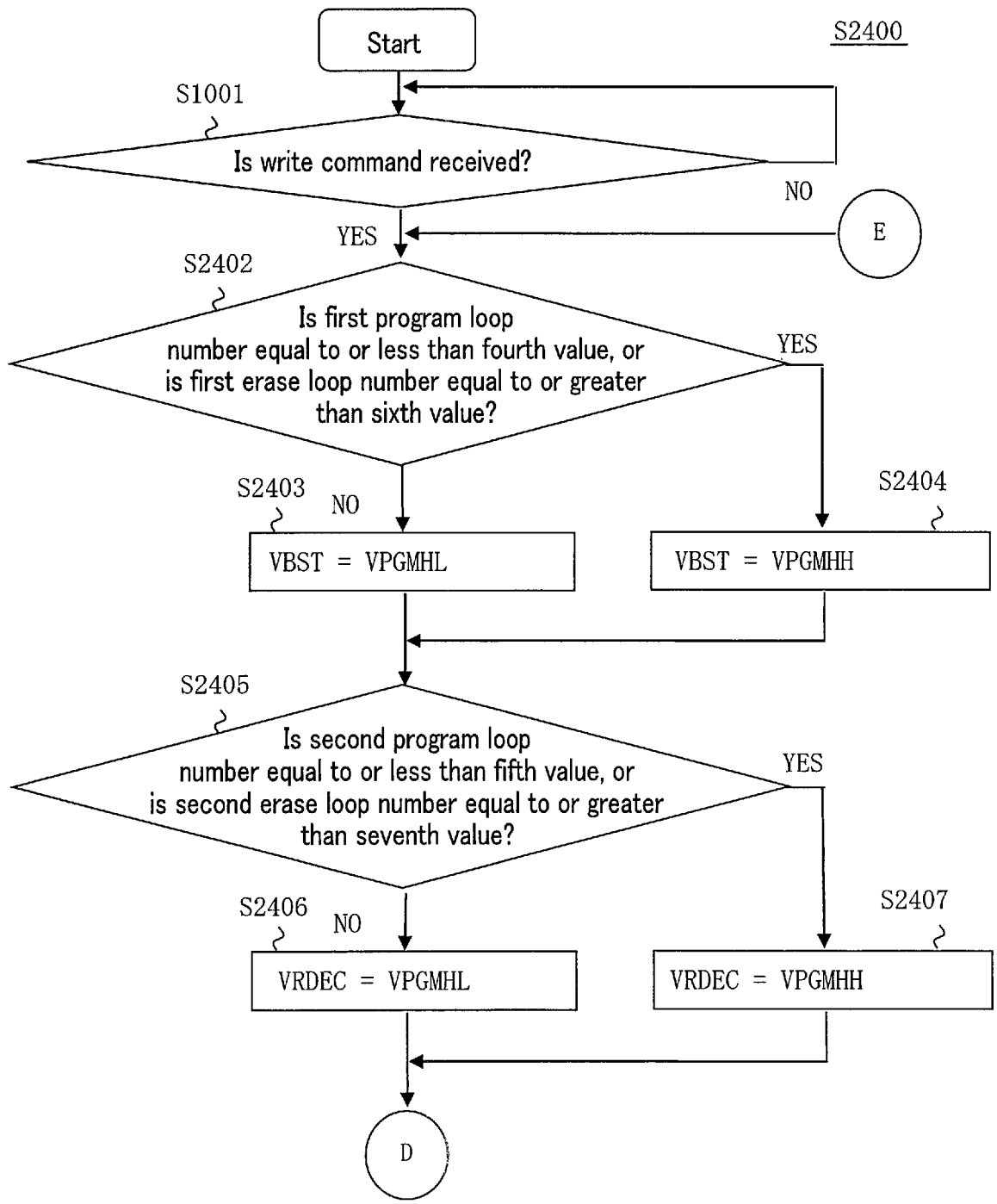
F I G. 29

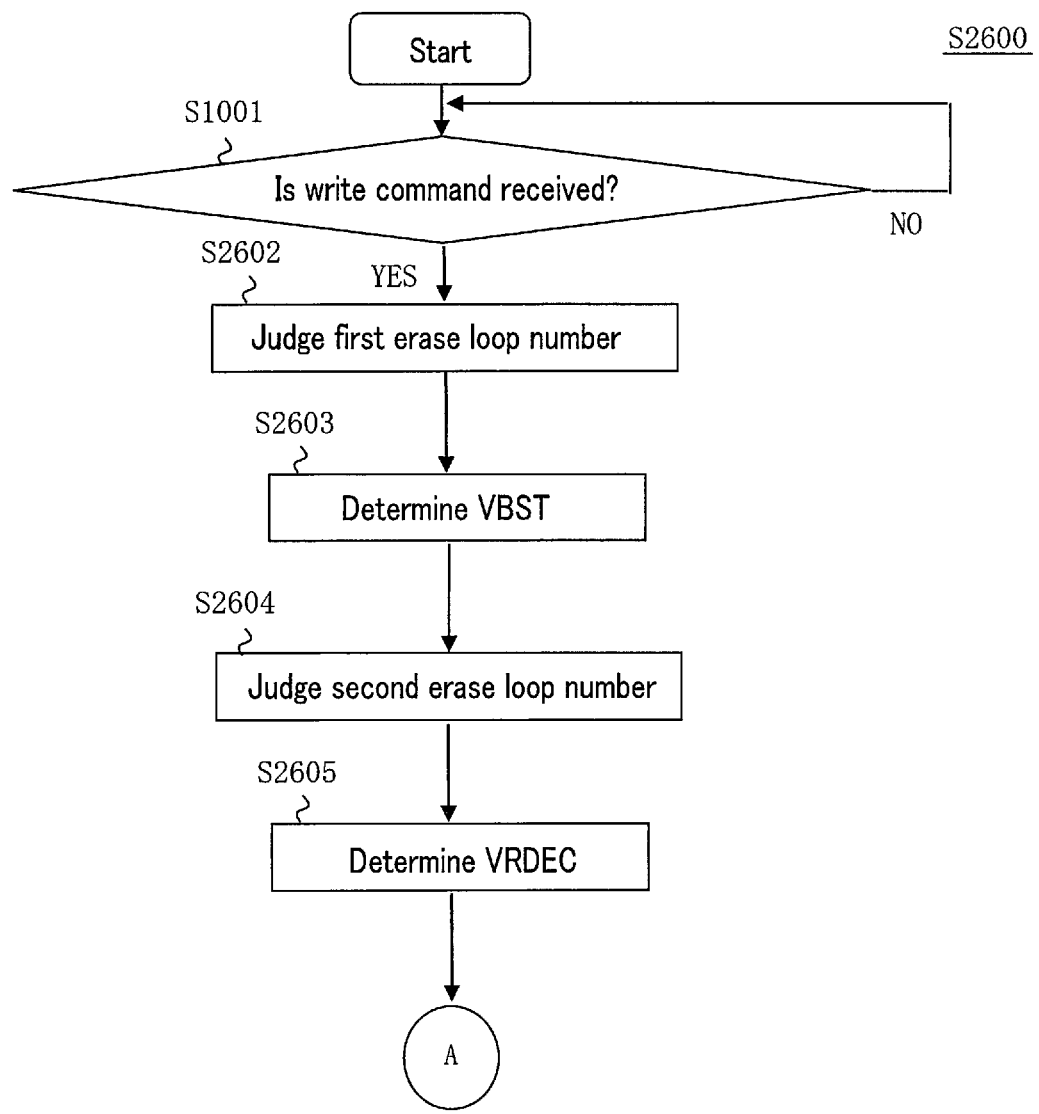
F I G. 32

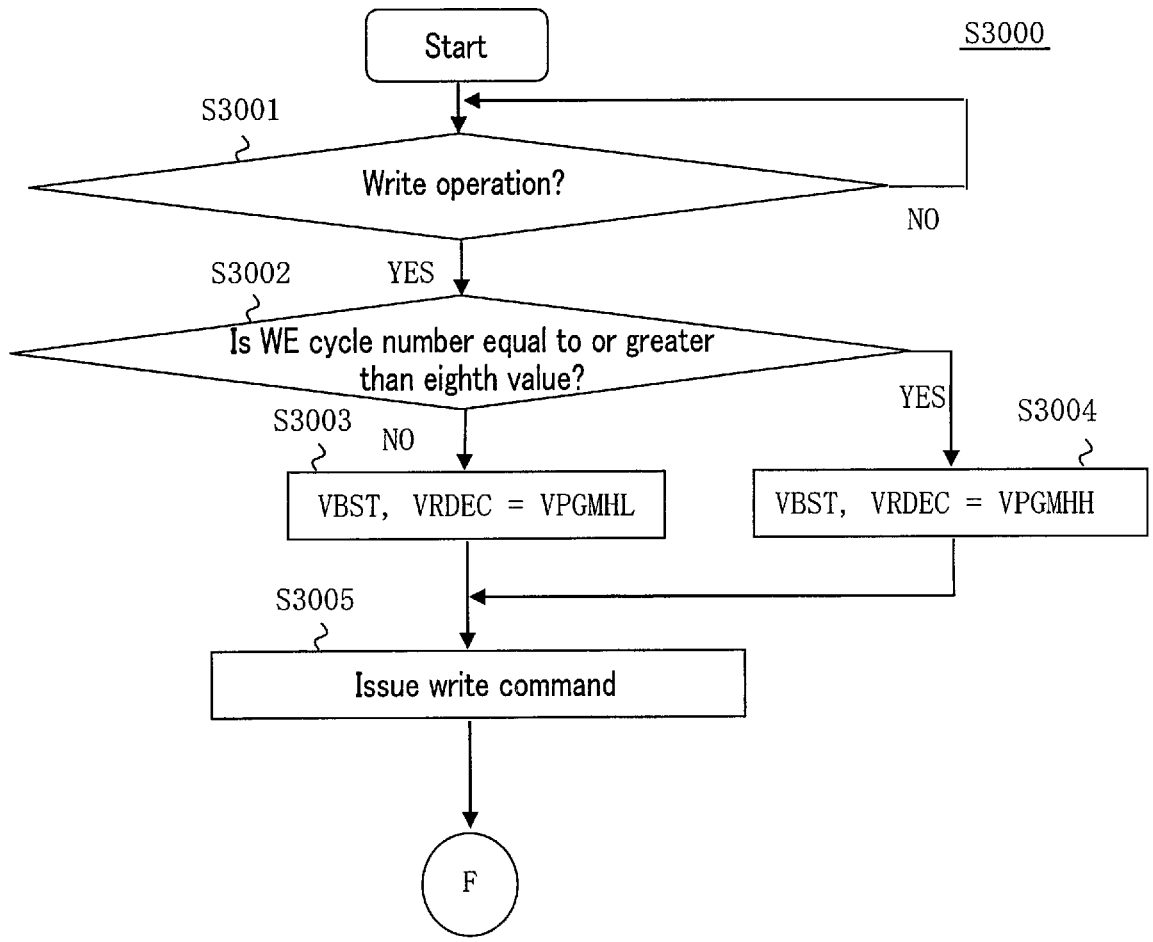
F I G. 33

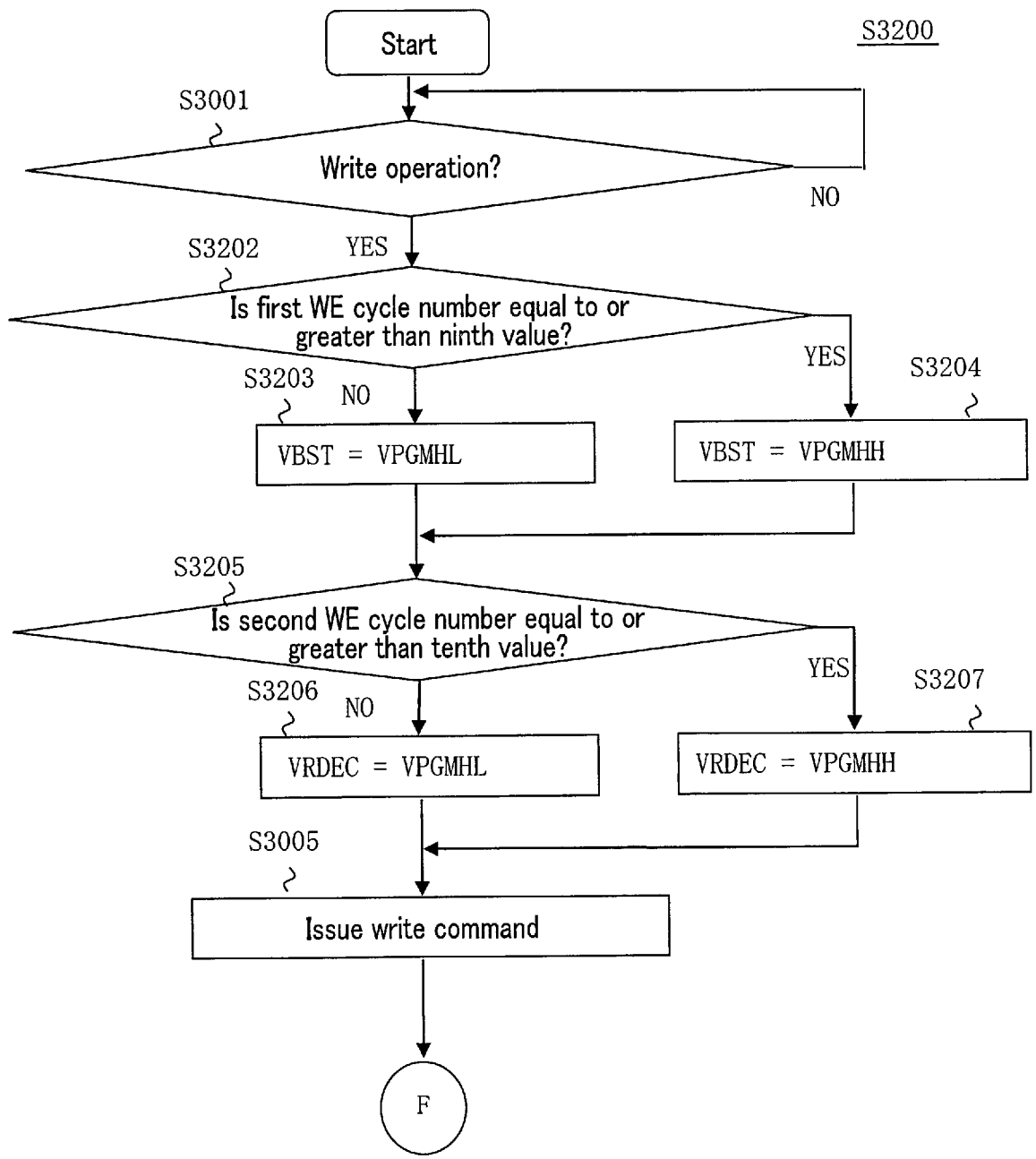
F I G. 36

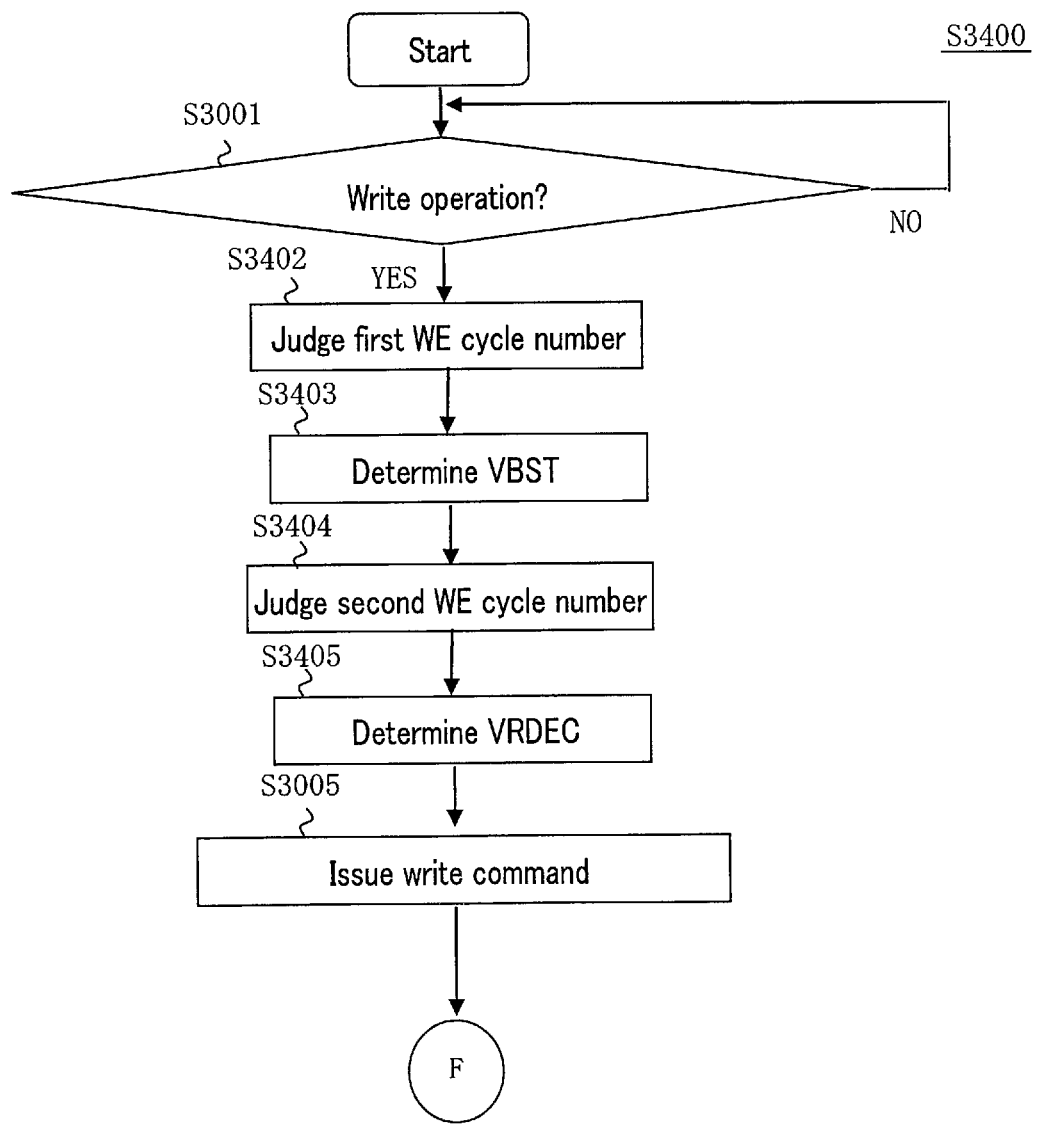
F I G. 38

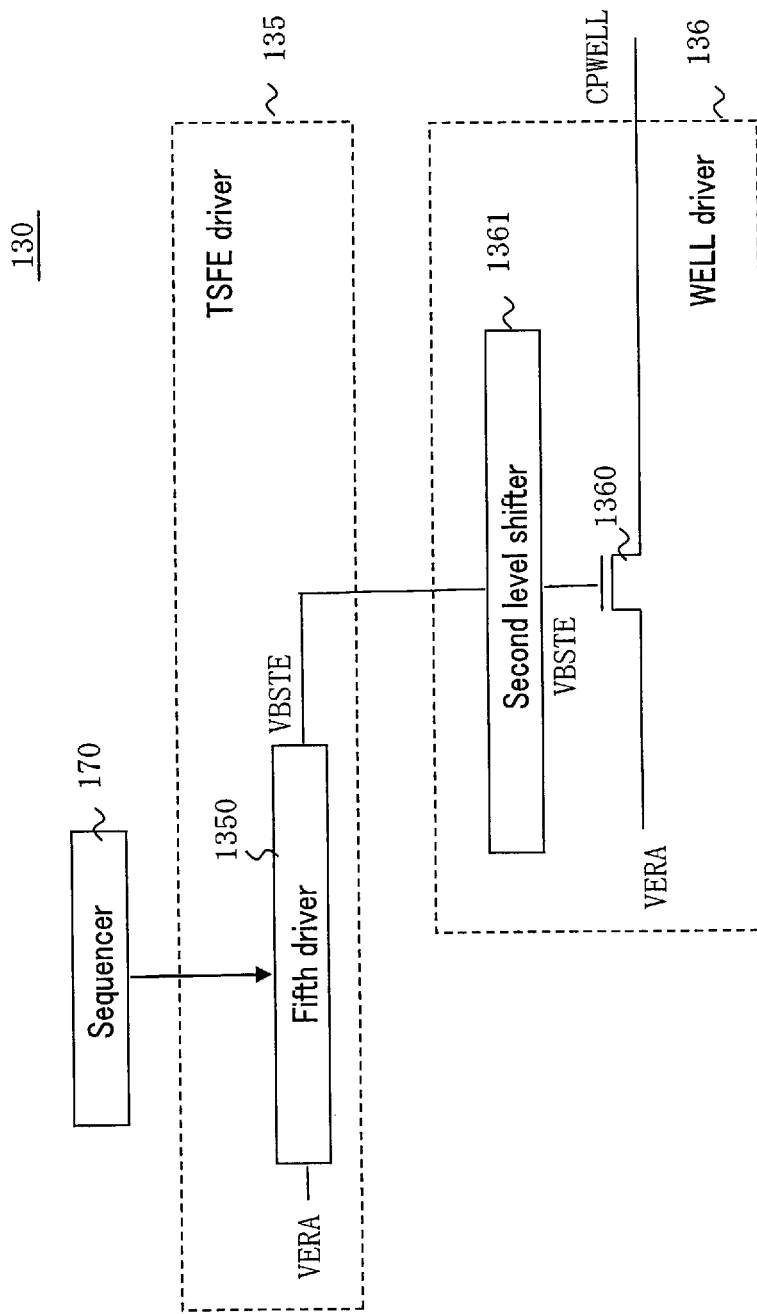
F I G. 39

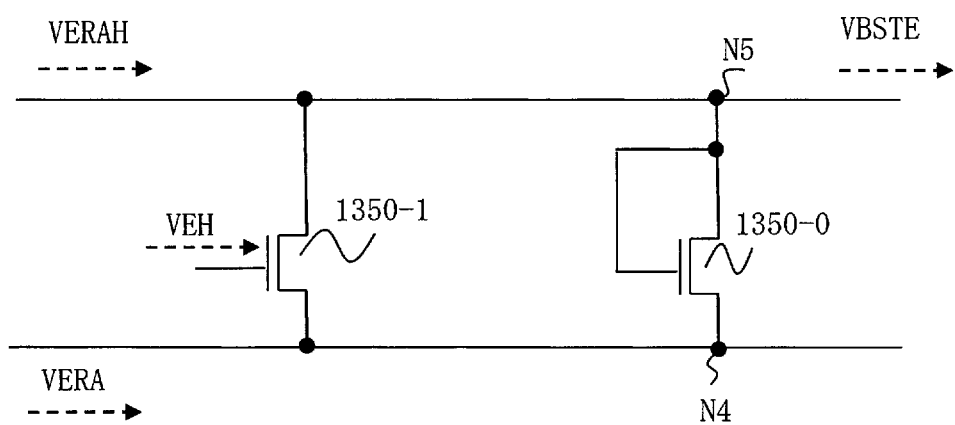
F I G. 40

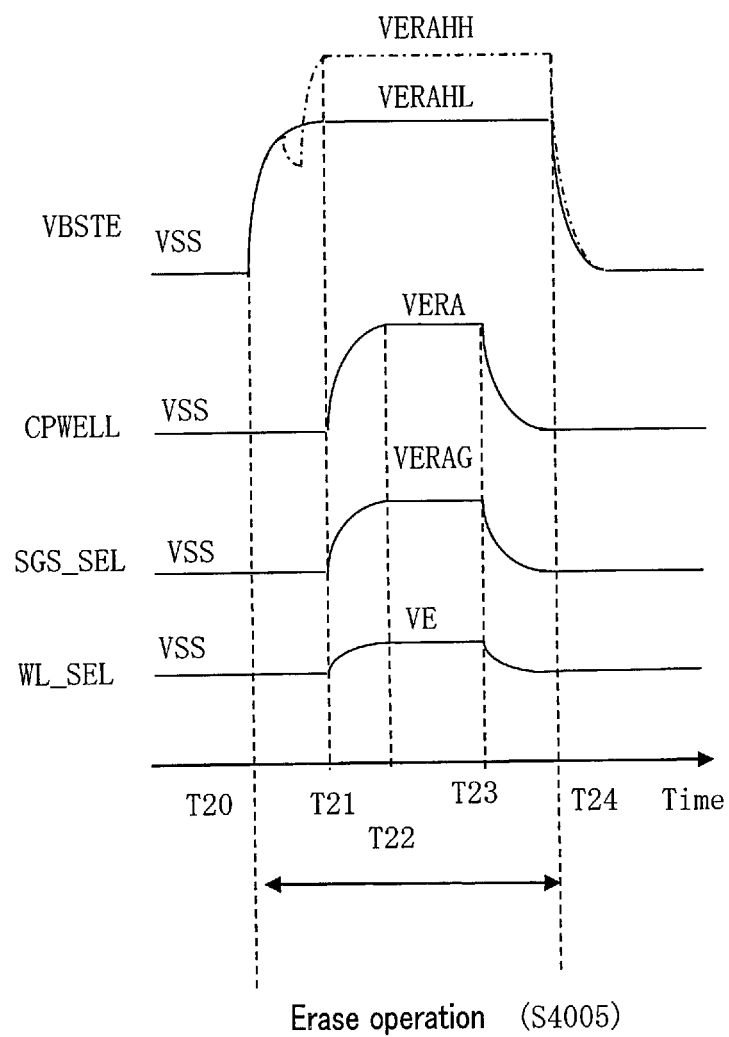
F I G. 42

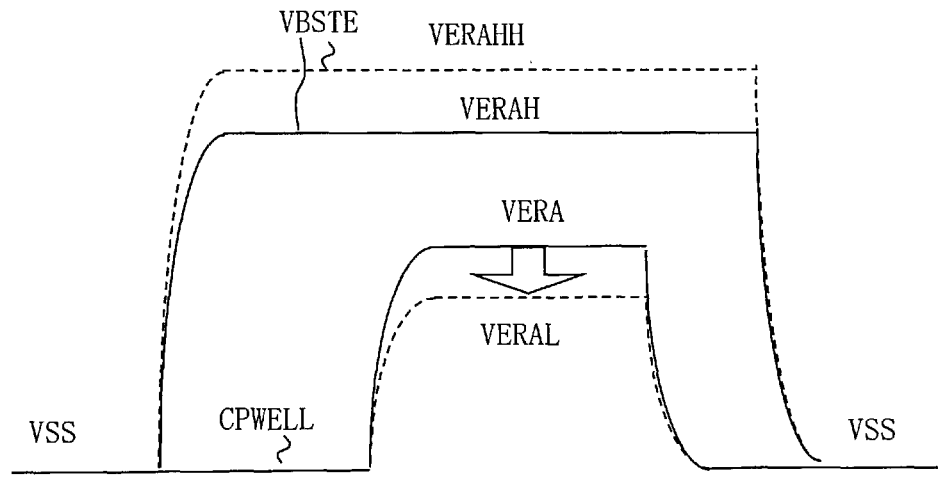
F I G. 44
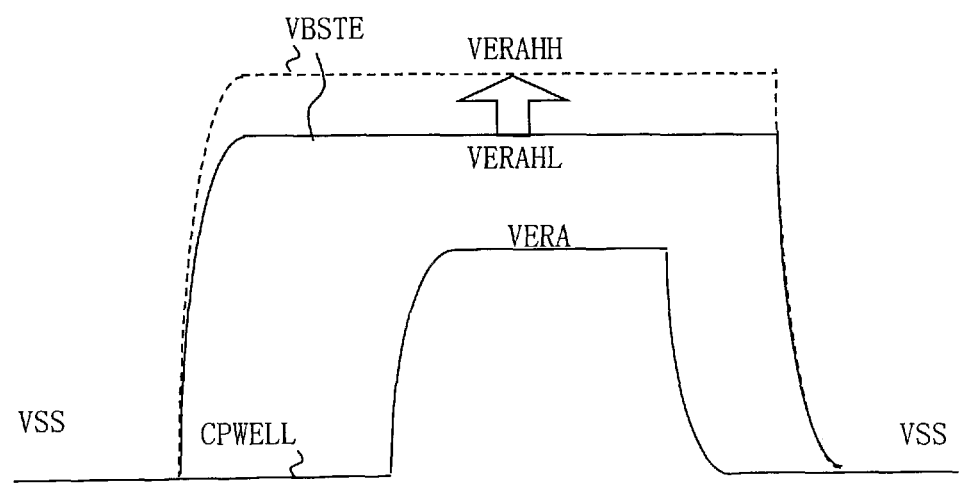
F I G. 45

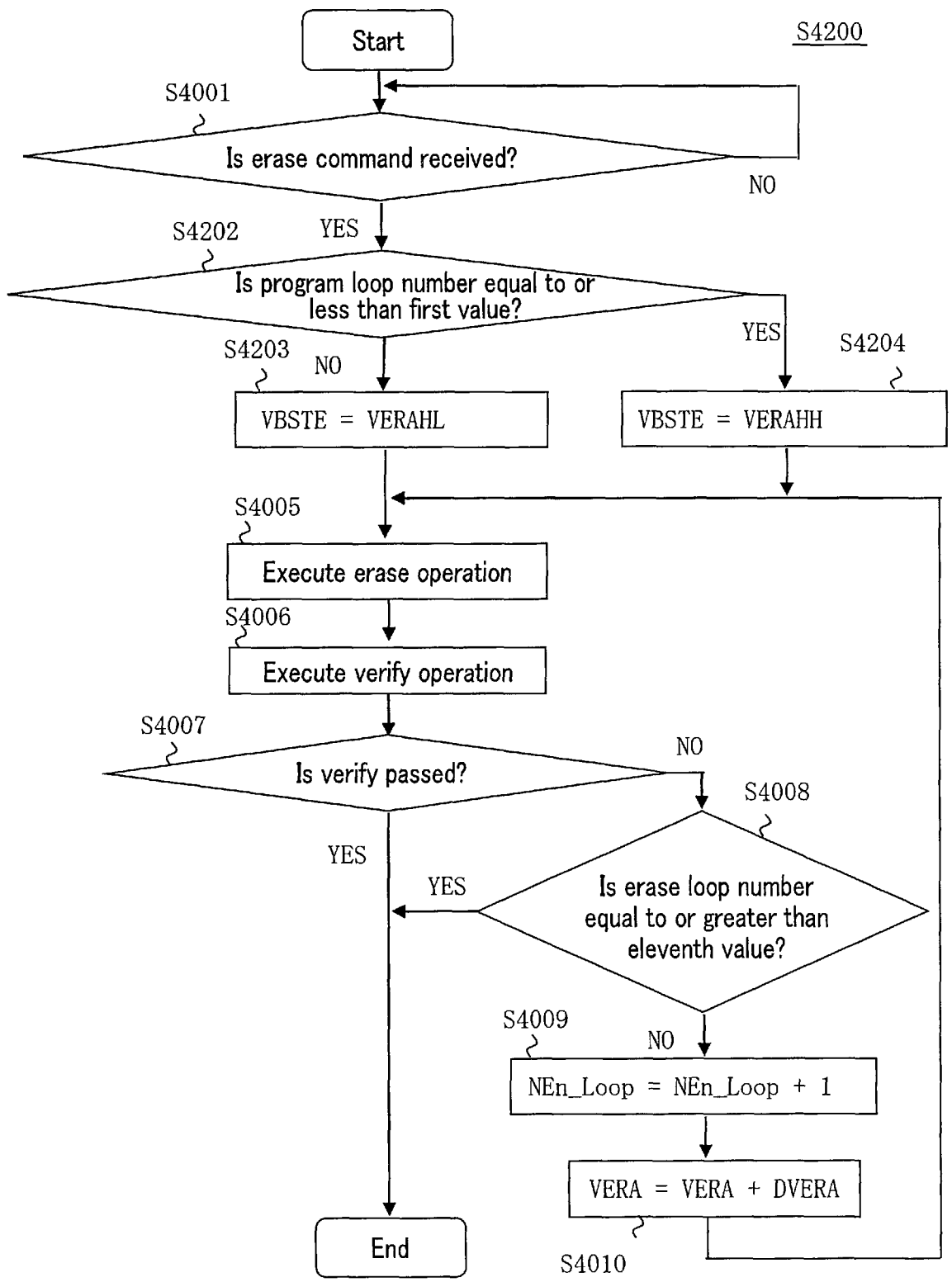
F I G. 47

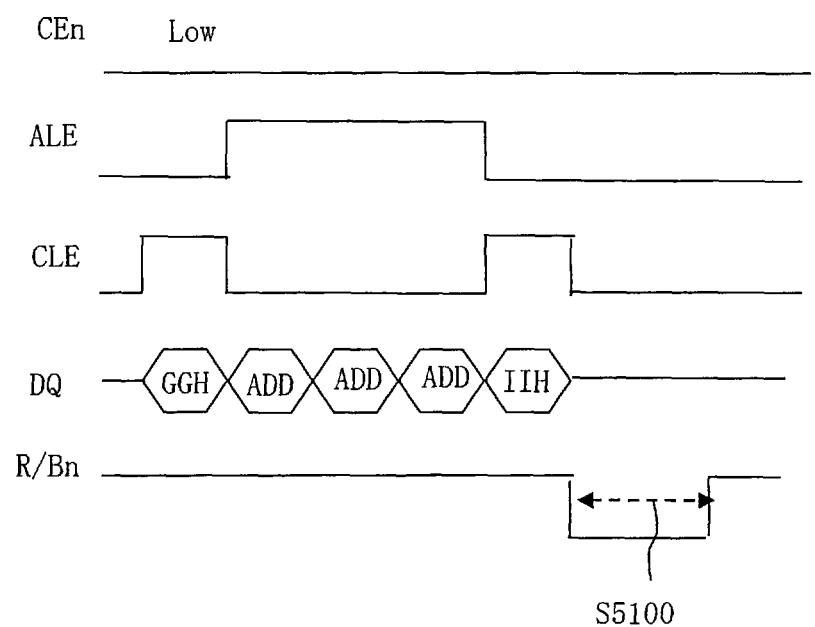
F I G. 54

MEMORY DEVICE AND MEMORY SYSTEM

CROSS-REFERENCE TO RELATED APPLICATIONS

This application is a Divisional application of U.S. application Ser. No. 15/917,281, filed Mar. 9, 2018, which claims the benefit of priority from prior Japanese Patent Application No. 2017-060387, filed Mar. 27, 2017, the entire contents of both of which are incorporated herein by reference.

FIELD

Embodiments described herein relate generally to a memory device and a memory system.

BACKGROUND

There is known a NAND flash memory in which memory cells are three-dimensionally arranged.

BRIEF DESCRIPTION OF THE DRAWINGS

FIG. 1 is a block diagram of a memory system according to a first embodiment.

FIG. 15 is a flowchart of a write operation (S1200) of a memory system according to Modification Example 2 of the first embodiment.

FIG. 20 is a circuit diagram illustrating a configuration for applying a voltage to signal lines CG of a memory system according to a second embodiment.

FIG. 23 illustrates typical operational waveforms of a program operation of the memory system according to the second embodiment.

FIG. 25 is a flowchart of a write operation (S2100) of a memory system according to Modification Example 1 of the second embodiment.

FIG. 29 is a flowchart of a write operation (S2400) of a memory system according to Modification Example 4 of the second embodiment.

FIG. 32 is a flowchart of a write operation (S2600) of a memory system according to Modification Example 6 of the second embodiment.

FIG. 33 is a flowchart of a write operation (S3000) of a memory system according to a third embodiment.

FIG. 36 is a flowchart of a write operation (S3200) of a memory system according to Modification Example 1 of the third embodiment.

FIG. 38 is a flowchart of a write operation (S3400) of a memory system according to Modification Example 3 of the third embodiment.

FIG. 39 is a circuit diagram illustrating a configuration for applying a voltage to a well interconnect CPWELL of a memory system according to a fourth embodiment.

FIG. 40 is a circuit diagram illustrating a fifth driver of the memory system according to the fourth embodiment.

FIG. 42 illustrates typical operational waveforms in an erase operation.

FIG. 44 illustrates operational waveforms of an erase operation of a memory system according to a comparative example.

FIG. 45 illustrates operational waveforms of an erase operation of the memory system according to the fourth embodiment.

FIG. 47 is a flowchart of a data erase operation (S4200) of a memory system according to Modification Example 2 of the fourth embodiment.

FIG. 54 illustrates a command sequence at time of a data erase operation in the memory system according to the fifth embodiment.

DETAILED DESCRIPTION

Figure 2:
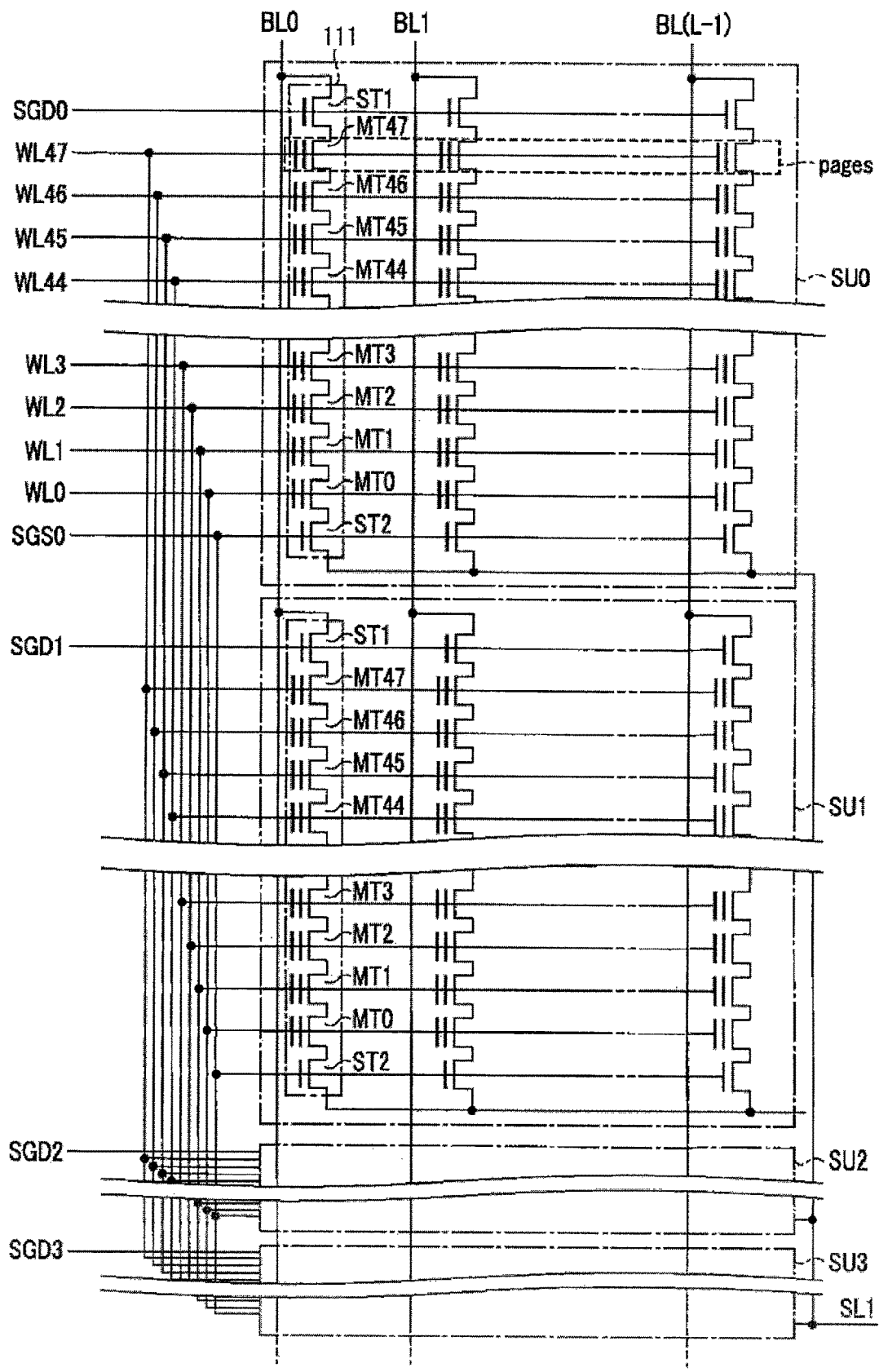
FIG. 2 is a circuit diagram of any one of blocks BLK of the memory system according to the first embodiment.

In general, according to one embodiment, a memory device comprises a first memory cell configured to store data, a first word line connected to the first memory cell, a first circuit configured to supply a voltage to the first word line, a second circuit configured to control the first circuit, and a sequencer configured to control the first circuit and the second circuit. The sequencer, when data is written to the first memory cell, determines whether a condition is satisfied or not. The sequencer causes the second circuit to generate a first voltage, when the sequencer determines that the condition is not satisfied, and causes the second circuit to generate a second voltage which is higher than the first voltage, when the sequencer determines that the condition is satisfied.

Embodiments will be described hereinafter with reference to the accompanying drawings. In the description, common parts are denoted by like reference numerals throughout the drawings. In the description below, as an example of a memory device, a three-dimensionally stacked NAND flash memory will be described, which is configured such that memory cell transistors are stacked upward on a semiconductor substrate.

<1> First Embodiment

A memory device according to a first embodiment will be described.

<1-1> Configuration

<1-1-1> Configuration of Memory System

To begin with, the schematic configuration of the entirety of a memory system including the memory device according to one embodiment will be described with reference to FIG. 1.

As illustrated in FIG. 1, a memory system 1 includes a NAND flash memory (memory device) 100 and a memory controller 200. The NAND flash memory 100 and memory controller 200 may constitute, for example, a single semiconductor device by the combination thereof. Examples of this single semiconductor device may include a memory card such as an SD™ card, and an SSD (solid state drive).

The NAND flash memory 100 includes a plurality of memory cells, and stores data nonvolatilely. The memory controller 200 is connected to the NAND flash memory 100 by a NAND bus, and is connected to a host device 300 by a host bus. In addition, the memory controller 200 controls the NAND flash memory 100, and accesses the NAND flash memory 100 in response to instructions received from the host device 300. The host device 300 maybe, for example, a digital camera or a personal computer, and the host bus may be, for example, a bus according to an SD™ interface.

The NAND bus is for sending or receiving signals according to the NAND interface specification. Examples of these signals may include a command latch enable signal CLE, an address latch enable signal ALE, a write enable signal WEn, a read enable signal REn, a ready/busy signal RBn, and an input/output signal DQ.

The signals CLE and ALE are signals which notify the NAND flash memory 100 that input signals DQ to the NAND flash memory 100 are a command and an address, respectively. The signal WEn is a signal which is asserted at "L (low)" level, and which causes the NAND flash memory 100 to acquire input signals DQ. In the description herein, the term "assert" is used to represent that a signal (or a logic) is set in an effective (active) state, and the term "negate", which is an antonym of "assert", is used to represent that a signal (or a logic) is set in an ineffective (inactive) state. The signal REn is a signal which is also asserted at "L" level, and which is used to read output signals DQ from the NAND flash memory 100. The ready/busy signal RBn is a signal which indicates whether the NAND flash memory 100 is in a ready state (a state in which the NAND flash memory 100 can receive an instruction from the memory controller 200) or in a busy state (a state in which the NAND flash memory 100 cannot receive an instruction from the memory controller 200), and the "L" level indicates the busy state. The input/output signals DQ are, for example, 8-bit signals. In addition, the input/output signals DQ are a substance of data which is sent/received between the NAND flash memory 100 and memory controller 200, and may be a command, an address, write data, read data, etc.

<1-1-2> Configuration of Memory Controller 200

Also referring to FIG. 1, the details of the configuration of the memory controller 200 will be described. As illustrated in FIG. 1, the memory controller 200 includes a host interface circuit (HOST I/F) 210, a built-in memory (RAM) 220, a processor (CPU) 230, a buffer memory 240, a NAND interface circuit (NAND I/F) 250, and an ECC circuit 260.

The host interface circuit 210 is connected to the host device 300 via the host bus, and transfers instructions and data, which are received from the host device 300, to the processor 230 and buffer memory 240, respectively. In addition, according to an instruction of the processor 230, the host interface circuit 210 transfers data in the buffer memory 240 to the host device 300.

The processor 230 controls operations for the entirety of the memory controller 200. For example, upon receiving a write instruction from the host device 300, the processor 230 responds to the write instruction and issues a write instruction to the NAND interface circuit 250. The same applies to the cases of read and erase. In addition, the processor 230 executes various processes, such as wear leveling, for managing the NAND flash memory 100.

The NAND interface circuit 250 is connected to the NAND flash memory 100 via the NAND bus, and manages communications with the NAND flash memory 100. In addition, according to instructions received from the processor 230, the NAND interface circuit 250 outputs the signals ALE, CLE, WEn and REn to the NAND flash memory 100. Besides, at the time of writing, the NAND interface circuit 250 transfers a write command which is issued by the processor 230, as well as a write data in the buffer memory 240, to the NAND flash memory 100 as input/output signals DQ. Furthermore, at the time of reading, the NAND interface circuit 250 transfers a read command, which is issued by the processor 230, to the NAND flash memory 100 as the input/output signals DQ, and also receives, as input/output signals DQ, a data which is read from the NAND flash memory 100, and transfers this data to the buffer memory 240.

The buffer memory 240 temporarily stores write data and read data.

The internal memory 220 is a semiconductor memory such as a DRAM, and is used for a working space of the processor 230. In addition, the internal memory 220 stores firmware for managing the NAND flash memory 100, various kinds of management tables, etc.

The ECC circuit 260 executes an Error Checking and Correcting (ECC) process for a data. Specifically, at the time of data writing, the ECC circuit 260 generates a parity based on the write data. At the time of data reading, the ECC circuit 260 detects an error and corrects this error by generating a syndrome from parity. The CPU 230 may include the functions of the ECC circuit 260.

<1-1-3> Configuration of NAND Flash Memory 100

<1-1-3-1> Entire Configuration of NAND Flash Memory 100

Next, the configuration of the NAND flash memory 100 will be described. As illustrated in FIG. 1, the NAND flash memory 100 includes a memory cell array 110, row decoders 120 (R/D 120-0 to 120-3), a driver circuit 130, a sense amplifier 140, an address register 150, a command register 160, a sequencer 170, and a status register 180.

The memory cell array 110 includes a plurality of blocks BLK (e.g. BLK0 to BLK3 in FIG. 1) each including a plurality of nonvolatile memory cells which are arranged in rows and columns. In addition, the memory cell array 110 stores data which are delivered from the memory controller 200.

The row decoders 120-0 to 120-3 are associated with the blocks BLK0 to BLK3, respectively, and select the corresponding blocks.

The driver circuit 130 outputs a voltage to a selected one of the blocks BLK0 to BLK3 via the row decoders 120-0 to 120-3.

At the time of data reading, the sense amplifier 140 senses a data which is read from the memory cell array 110, and outputs this data DAT to the memory controller 200. At the time of data writing, the sense amplifier 140 transfers a write data DAT, which is received from the memory controller 200, to the memory cell array 110.

The address register 150 stores an address ADD which is received from the memory controller 200. The command register 160 stores a command CMD which is received from the memory controller 200.

The sequencer 170 controls operations for the entirety of the NAND flash memory 100, according to a command CMD which is stored in the command register 160.

The status register 180 stores status information, etc. associated with the NAND flash memory 100. Specifically, the status register 180 may store a program loop number, an erase loop number, etc., which will be described later.

<1-1-3-2> Memory Cell Array 110

Next, the details of the configuration of the memory cell array 110 will be described. FIG. 2 is a circuit diagram of any one of the blocks BLK (e.g. 0-3). The other blocks BLK have the same configuration.

As illustrated in FIG. 2, the block BLK includes a plurality of string units SU (e.g. SU0 to SU3 in FIG. 2). In addition, each string unit SU includes a plurality of NAND strings 111.

Each of the NAND strings 111 includes a plurality of memory cell transistors MT (e.g. MT0 to MT47 in FIG. 2), and select transistors ST (ST1 and ST 2).

A memory cell transistor MT includes a stacked gate including a control gate and a charge storage layer, and stores a data nonvolatilely. The number of memory cell transistors MT is not limited to 48, and may be 16, 32, 64, 128, etc. The number of memory cell transistors MT may not be particularly limited. Memory cell transistors MT are disposed such that the memory cell transistors MT are connected in series between the select transistors ST1 and ST2. One end of the memory cell transistor MT47, which is located on one end side among the memory cell transistors MT connected in series, is connected to one end of the select transistor ST1. One end of the memory cell transistor MT0, which is located on the other end side among the memory cell transistors MT connected in series, is connected to one end of the select transistor ST2.

The gates of the select transistors ST1 in each of the string units SU0 to SU3 are commonly connected to each of select gate lines SGD0 to SGD3. On the other hand, the gates of the select transistors ST2 of the plural string units are commonly connected to the same select gate line SGS. In addition, the control gates of the respective memory cell transistors MT0 to MT47 in the same block are commonly connected to respective word lines WL0 to WL47.

Specifically, while the word lines WL0 to WL47 and the select gate line SGS respectively have common connections between the plural string units SU0 to SU3 in the same block BLK, the select gate lines SGD are independent for each of the string units SU0 to SU3, even in the same block.

In addition, the other ends of the select transistors ST1 of the NAND strings 111 positioned in the same row, among the NAND strings 111 disposed in a matrix in the memory cell array 110, are connected to each of bit lines BL (BL0 to BL(L-1); L is a natural number of two or more). Specifically, each of the bit lines BL commonly connects the NAND strings 111 between the plural string units SU, and also commonly connects the NAND strings 111 between the plural blocks BLK. Besides, the other ends of the select transistors ST2 are commonly connected to a source line SL. The source line SL commonly connects the NAND strings 111, for example, between the plural blocks.

Data read and data write are executed in batches for the plural memory cell transistors MT which are commonly connected to any one of the word lines WL, in any one of the string units SU in any one of the blocks.

Data erase can be executed in units of a block BLK, or by a unit smaller than the block BLK. The method of erase is disclosed, for example, in U.S. patent application Ser. No. 13/235,389 filed Sep. 18, 2011 and entitled "NONVOLATILE SEMICONDUCTOR MEMORY DEVICE". In addition, the method of erase is disclosed in U.S. patent application Ser. No. 12/694690 filed Jan. 27, 2010 and entitled "NON-VOLATILE SEMICONDUCTOR STORAGE DEVICE". Besides, the method of erase is disclosed in U.S. patent application Ser. No. 13/483,610 filed May 30, 2012 and entitled "NONVOLATILE SEMICONDUCTOR MEMORY DEVICE AND DATA ERASE METHOD THEREOF". The entirety of these patent applications is incorporated in the present specification by reference.

<1-1-3-3> Cross Section of Partial Region of Block BLK

Figure 3:
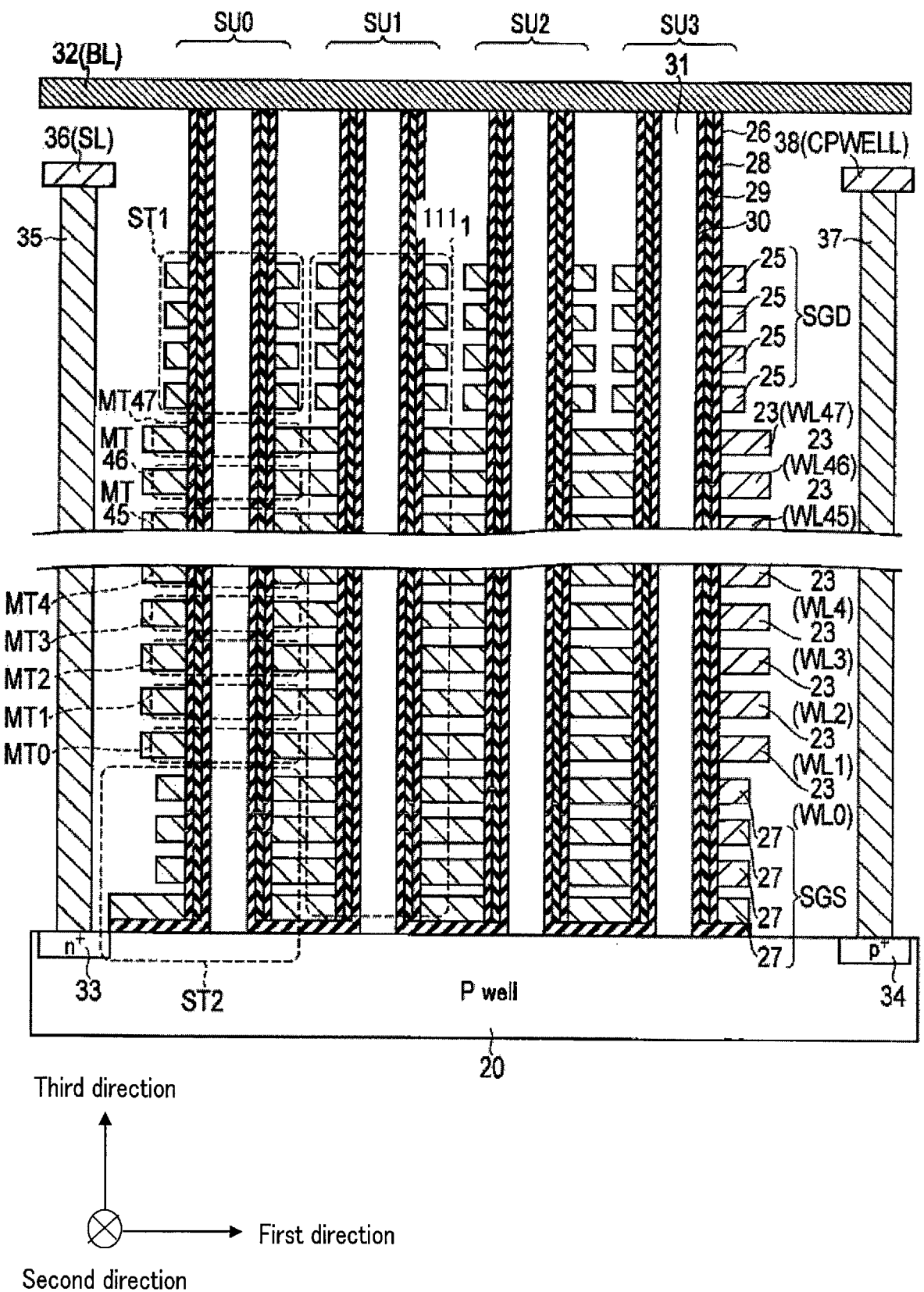
FIG. 3 is a cross-sectional view of part of the block BLK of the memory system according to the first embodiment.

Referring to FIG. 3, a cross section of a portion of the block BLK will be described. As illustrated in FIG. 3, a plurality of NAND strings 111 are formed on a p-well region 20. Specifically, for example, four interconnect layers 27 functioning as select gate lines SGS, 48 interconnect layers 23 functioning as word lines WL0 to WL47, and, for example, four interconnect layers 25 functioning as select gate lines SGD are stacked in a third direction in turn on the well region 20. Insulating films (not shown) are formed between the stacked interconnect layers.

Pillar-shaped semiconductor members 31, which extend in the third direction, are provided on the well region 20. Gate insulating films 30, charge storage layers (insulating films) 29 and block insulating films 28 are formed on side surfaces of the semiconductors 31 in pillar-shaped structures In addition, the interconnect layers 25, 23 and 27 are provided on the side surfaces of the pillar-shaped structures, and the memory cell transistors MT and select transistors ST1 and ST2 are formed by those elements. The semiconductor members 31 function as current paths for the NAND strings 111, and serve as regions where a channel of each transistor is formed. In addition, upper ends of the semiconductor members 31 are connected to a metal interconnect layer 32 functioning as a bit line BL.

An $n^+$-type impurity diffusion layer 33 is provided in a surface region of the well region 20. A contact plug 35 is formed on the diffusion layer 33, and the contact plug 35 is connected to a metal interconnect layer 36 functioning as a source line SL. Further, a $p^+$-type impurity diffusion layer 34 is formed in a surface region of the well region 20. A contact plug 37 is formed on the diffusion layer 34, and the contact plug 37 is connected to a metal interconnect layer 38 functioning as a well interconnect CPWELL. The well interconnect CPWELL is an interconnect for applying a potential to the semiconductor members 31 via the well region 20.

A plurality of the above-described structures are arranged in a second direction (perpendicular to the third direction), and the string units SU are formed by sets of NAND strings 111 which are arranged in the second direction.

Besides, the memory cell array 110 may have other configurations. Specifically, a configuration of the memory cell array 110 is disclosed, for example, in U.S. patent application Ser. No. 12/407,403 filed Mar. 19, 2009 and entitled "THREE DIMENSIONAL STACKED NON-VOLATILE SEMICONDUCTOR MEMORY". In addition, configurations of the memory cell array 110 is disclosed in U.S. patent application Ser. No. 12/406,524 filed Mar. 18, 2009 and entitled "THREE DIMENSIONAL STACKED NONVOLATILE SEMICONDUCTOR MEMORY", U.S. patent application Ser. No. 12/679,991 filed Mar. 25, 2010 and entitled "NONVOLATILE SEMICONDUCTOR STORAGE DEVICE AND MANUFACTURING METHOD THEREOF", and U.S. patent application Ser. No. 12/532,030 filed Mar. 23, 2009 and entitled "SEMICONDUCTOR MEMORY AND METHOD FOR MANUFACTURING SAME". The entirety of these patent applications is incorporated in the present specification by reference.

<1-1-3-4> Row Decoder

Next, the configuration of the row decoder 120 will be described with reference to FIG. 4.

Figure 4:
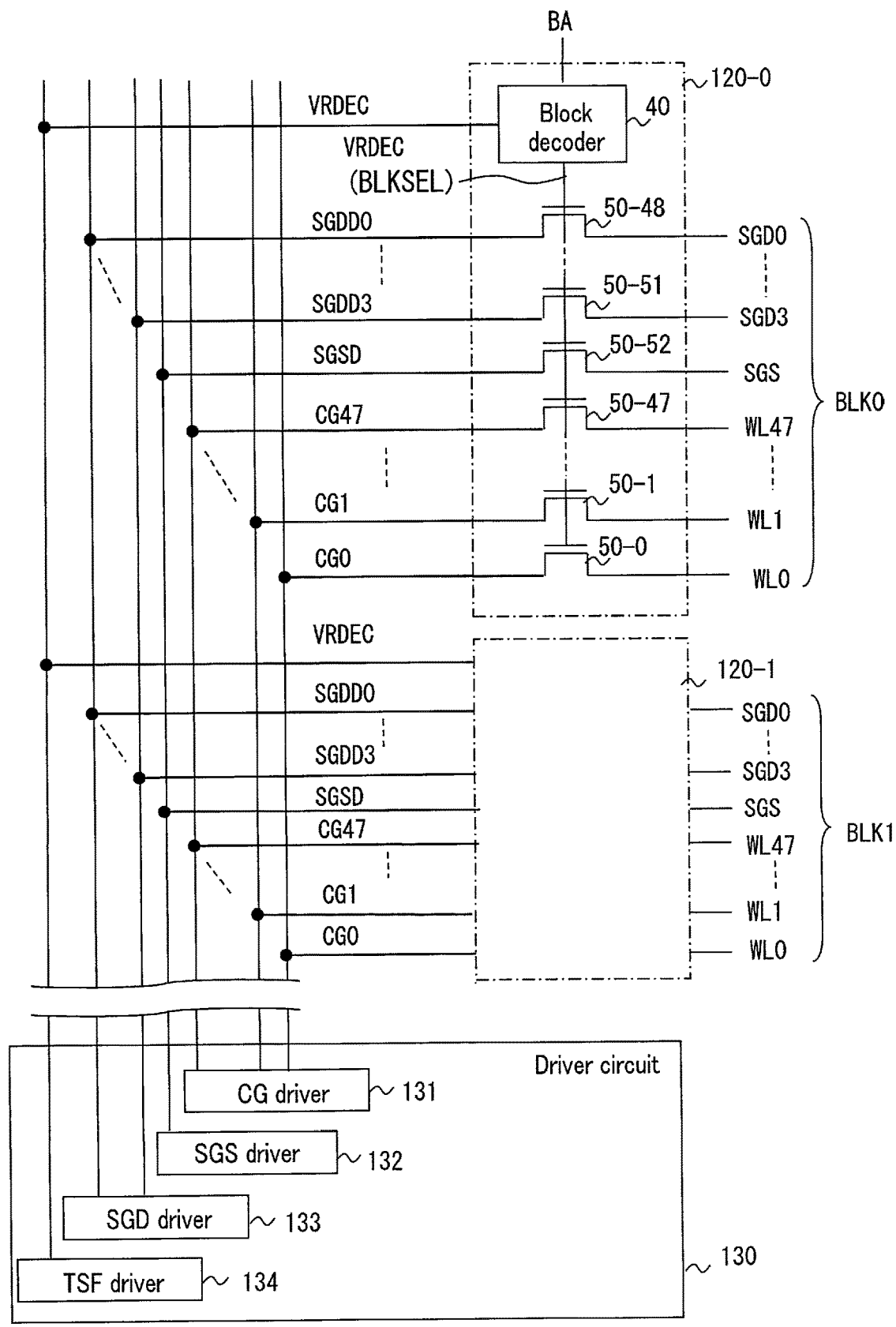
FIG. 4 is a block diagram of a row decoder of the memory system according to the first embodiment.

As illustrated in FIG. 4, the row decoder 120 includes sets of a block decoder 40 and high breakdown voltage n-channel MOS transistors 50 (50-0 to 50-52). The high breakdown voltage n-channel MOS transistors 50 are also referred to as "transfer transistors".

To begin with, the block decoder 40 is described. At the times of data writing, reading and erasing, the block decoder 40 decodes a block address BA which is received from the address register 150. Then, when the block address BA identifies corresponding one of the blocks BLK, a signal VRDEC is asserted. The potential of the asserted signal VRDEC (which may also be denoted by BLKSEL) is such an amount of voltage as to set the transistor 50 in the ON state. On the other hand, when the block address BA does not identify this corresponding block BLK, the signal VRDEC is negated. The potential of the negated signal VRDEC is such an amount of voltage as to set the transistor 50 in the OFF state (e.g. 0 V).

Next, the transistors 50 are described. The transistors 50-0 to 50-47 conduct voltages to the word lines WL0 to WL47 of the selected block BLK, respectively. Each of the transistors 50-0 to 50-47 is connected at one end to each of the word lines WL0 to WL47 of the corresponding block BLK, and is connected at the other end to each of signal lines CG0 to CG47. The signal VRDEC is supplied to the gates of the transistors 50-0 to 50-47.

The transistors 50-48 to 50-51 conduct voltages to the select gate lines SGD0 to SGD3 of the selected block BLK. Each of the transistors 50-48 to 50-51 are connected at one end to each of the select gate lines SGD0 to SGD3 of the selected block BLK, and are connected at the other end to each of signal lines SGDD0 to SGDD3. The signal VRDEC is supplied to the gates of the transistors 50-48 to 50-51.

The transistor 50-52 conduct a voltage to the select gate line SGS of the selected block BLK. One end of the transistor 50-52 is connected to the select gate line SGS of the corresponding block BLK, and the other end of the transistor 50-52 is connected to a signal line SGSD. The signal VRDEC is supplied to the gate of the transistor 50-52.

Accordingly, for example, in the row decoder 120 corresponding to the selected block BLK, the transistors 50-0 to 50-52 are set in the ON state. Thereby, the word lines WL0 to WL47 are connected to the signal lines CG0 to CG47, the select gate lines SGD0 to SGD3 are connected to the signal lines SGDD0 to SGDD3, and the select gate line SGS is connected to the signal line SGSD.

On the other hand, in the row decoders 120 corresponding to unselected blocks BLK, the transistors 50-0 to 50-52 are set in the OFF state. Thereby, the word lines WL, select gate lines SGD and select gate line SGS are electrically disconnected from the signal lines CG, SGDD and SGSD.

The signal lines CG, SGDD and SGSD are commonly used by the row decoders 120-0 to 120-3. In addition, the driver circuit 130 applies voltages to the signal lines CG, SGDD and SGSD, in accordance with a page address PA received from the address register 150. Specifically, the voltages, which are output from the driver circuit 130, are conducted to the lines WL, SGD and SGS in the selected block via the transistors 50 in any one of the row decoders 120, which corresponds to the selected block.

The driver circuit 130 includes at least a CG driver 131, an SGS driver 132, an SGD driver 133, and a TSF driver 134. The CG driver 131 supplies signals to the signal lines CG. The SGS driver 132 supplies a signal to the signal line SGSD. The SGD driver 133 supplies signals to the signal lines SGDD. The TSF driver 134 supplies the signal VRDEC.

In this example, for the purpose of simplicity, one set of transistors 50 (transistors 50-0 to 50-52) is provided in one row decoder 120. However, a plurality of transistors 50 may be provided in series.

<1-1-3-5> CG Driver and TSF Driver

Figure 5:
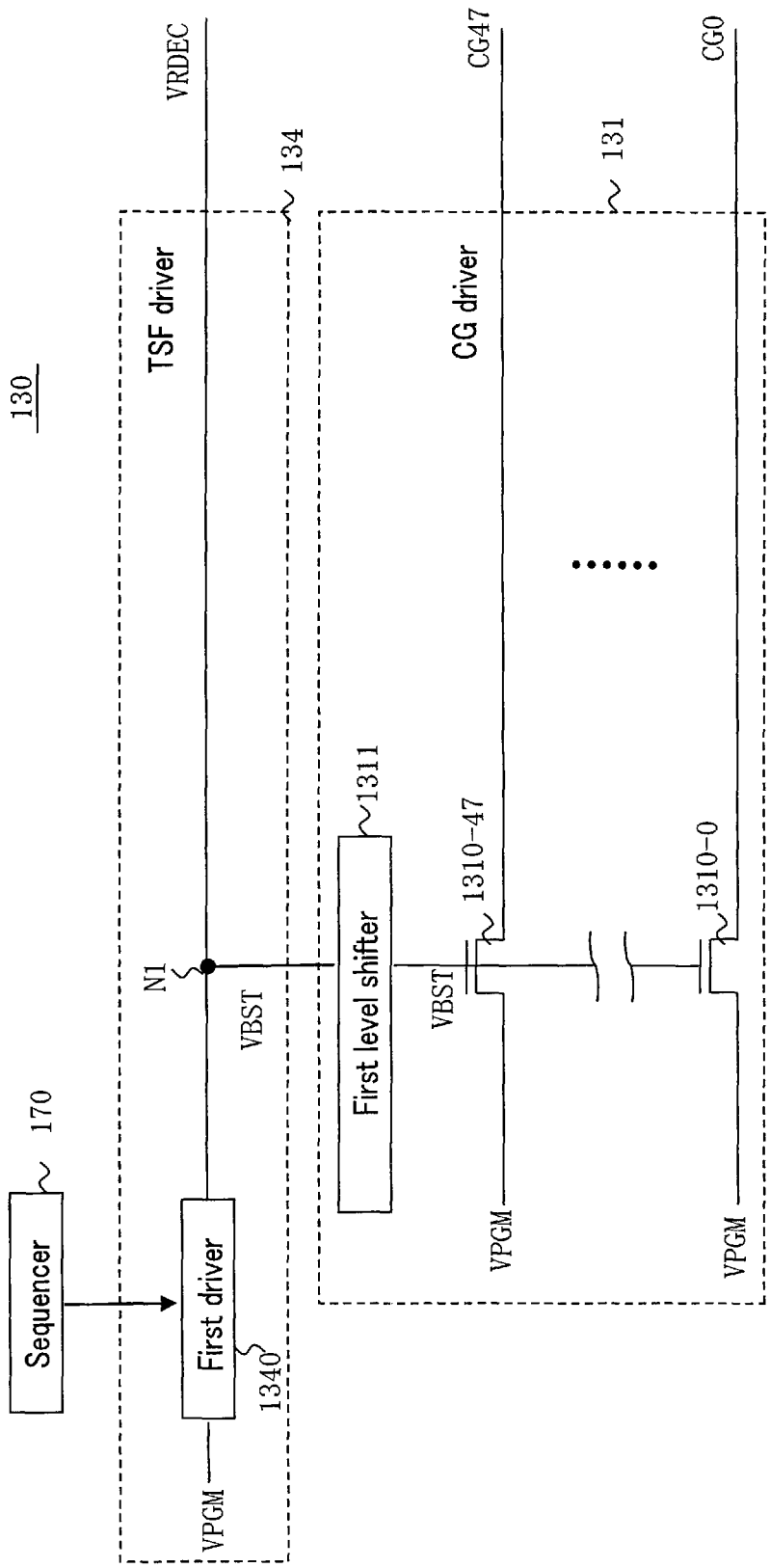
FIG. 5 is a circuit diagram illustrating a configuration for applying a voltage to signal lines CG of the memory system according to the first embodiment.

Next, referring to FIG. 5, the CG driver 131 and TSF driver 134 will be described.

The TSF driver 134 includes a first driver 1340. Based on a control signal from the sequencer 170, the first driver 1340 supplies a voltage VPGMHL or VPGMHH (VPGMHL<VPGMHH) as a signal VBST (or VRDEC) to the CG driver 131 and row decoder 120 via a node N1.

The CG driver 131 includes a plurality of high breakdown voltage n-channel MOS transistors 1310 (e.g. 1310-0 to 1310-47 in FIG. 5) which correspond to the signal lines CG, and a first level shifter 1311. The first level shifter 1311 supplies the voltage VPGMHL or VPGMHH, which is supplied via the node N1, to the transistors 1310 as the signal VBST.

The transistors 1310 conduct voltages to the signal lines CG. One end of each of the transistors 1310 is connected to each of the signal lines CG. A voltage is applied to the other end of each of the transistor 1310, and the signal VBST is supplied to the gate of the transistor 1310. In FIG. 5, for the purpose of simplicity, only the transistors 1310 for conducting or transferring the voltage VPGM are illustrated. However, the aspect is not limited to this, and high breakdown voltage n-channel MOS transistors for applying various kinds of voltages to the signal lines CG may be provided. The high breakdown voltage n-channel MOS transistors 1310 are also referred to as "transfer transistors."

In this example, for the purpose of simplicity, one of the transistors 1310 is connected to one signal line CG. However, a plurality of transistors 1310 may be connected in series to one signal line CG.

<1-1-3-6> First Driver

Figure 6:
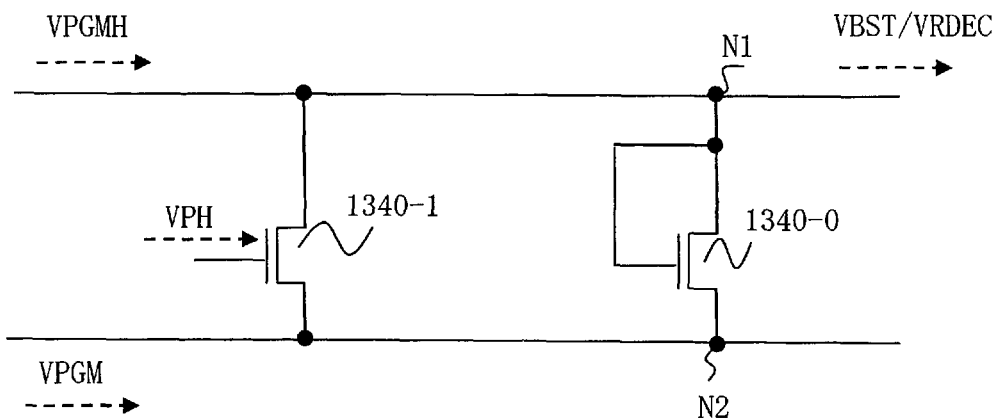
FIG. 6 is a circuit diagram illustrating a first driver of the memory system according to the first embodiment.

Next, referring to FIG. 6, the first driver 1340 will be described.

The first driver 1340 includes high breakdown voltage n-channel MOS transistors 1340-0, and 1340-1. The voltage VPGM is supplied to one end of the transistor 1340-0 via a node N2. The other end and gate of the transistor 1340-0 are connected to a node N1. The voltage VPGMH is supplied to the other end and gate of the transistor 1340-0 via a node N1. The transistor 1340-0 operates as a diode transistor. One end of the transistor 1340-1 is connected to the node N2, and the other end of the transistor 1340-1 is connected to the node N1. A signal VPH is supplied to a gate of the transistor 1340-1.

The signal VPH is supplied by the sequencer 170.

In the case of generation of the voltage VPGMHL, the sequencer 170 sets the signal VPH at "H (H>L)" level. More specifically, the sequencer 170 sets the voltage of the signal VPH and the voltage of the Node N1 the same. Thus, the transistor 1340-1 operates as a diode transistor. Thereby, the first driver 1340 supplies the voltage VPGMHL to the node N1.

In the case of generation of the voltage VPGMHH, the sequencer 170 sets the signal VPH at "H" level. For example, the sequencer 170 sets the voltage of the signal VPH at 0V. Thus the transistor 1340-1 is turned off. In the case of generation of the voltage VPGMHH, the number of the transistors which are turned on is smaller than that in the case of generation of the voltage VPGMHL. Thereby, in the case of generation of the voltage VPGMHH, the potential difference of the node N1 and the node N2 of the first driver 1340 is larger than that in the case of generation of the voltage VPGMHL. Thereby, the first driver 1340 supplies the voltage VPGMHH to the node N1.

In the meantime, although the embodiment in which the first driver 1340 includes the two transistors 1340-0, and 1340-1 is described here for the purpose of simplicity, the embodiment is not limited to this. If the first driver 1340 is configured to selectively generate the voltage VPGMHL and voltage VPGMHH, the first driver 1340 may have any circuit configuration.

How the sequencer 170 selects the voltage VPGMHL or the voltage VPGMHH will be described later.

<1-2> Operation

<1-2-1> Flowchart

Figure 7:
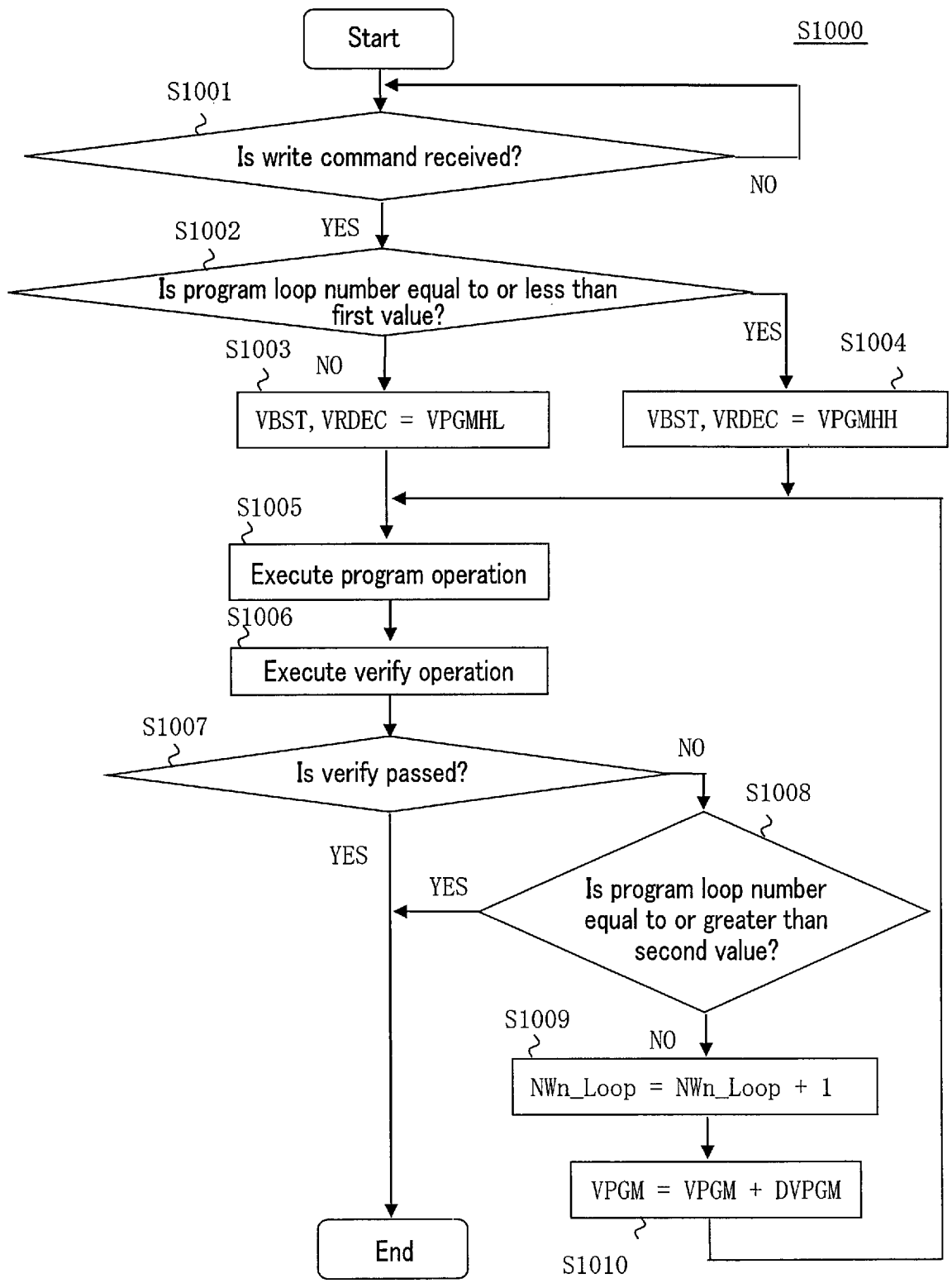
FIG. 7 is a flowchart of a write operation (S1000) of the memory system according to the first embodiment.

Referring to FIG. 7, a description is given of a flowchart of a write operation (S1000).

In the meantime, the write operation includes program and program verify. The program is an operation of injecting electrons into the charge storage layer of a selected memory cell transistor. The program verify is an operation of confirming whether the program has been completed or not.

[S1001]

The sequencer 170 determines whether a write command is received from the memory controller 200.

[S1002]

If the sequencer 170 determines that the write command is received from the memory controller 200 (i.e. step S1001, Yes), the sequencer 170 determines whether a program loop number, which is stored in the status register 180, is equal to or less than a first value. The first value may be preset, or may be arbitrarily set by a user. The program loop number is a program loop number associated with the latest write operation (an immediately preceding write operation) among the write operations having executed before the reception of the write command in step S1001.

[S1003]

If the sequencer 170 determines that the program loop number is not equal to or less than the first value (i.e. step S1002, No), the sequencer 170 sets the signals VBST and VRDEC in the program to the voltage VPGMHL. Specifically, in the program, the sequencer 170 sets the signal VPH at "H" level, sets the signal VPHL at "H" level, and sets the signal VPHH at "L" level.

[S1004]

If the sequencer 170 determines that the program loop number is equal to or less than the first value (i.e. step S1002, Yes), the sequencer 170 sets the signals VBST and VRDEC in the program to the voltage VPGMHH. Specifically, in the program, the sequencer 170 sets the signal VPH at "H" level, sets the signal VPHL at "L" level, and sets the signal VPHH at "H" level.

[S1005]

The sequencer 170 executes the program.

Figure 8:
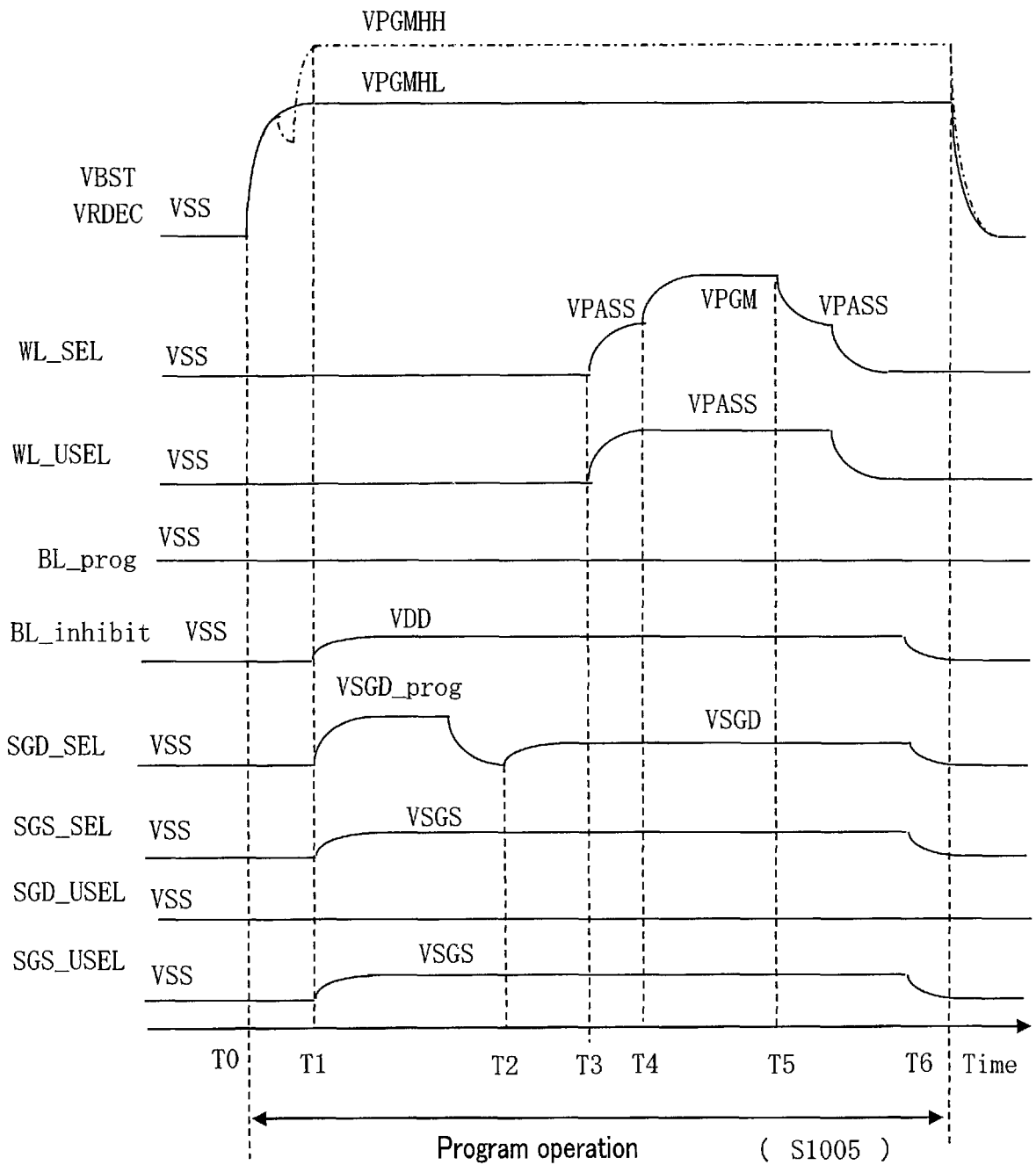
FIG. 8 illustrates typical operational waveforms in a program operation.

Referring to FIG. 8, typical operational waveforms of the program will be described.

[Time T0]~[Time T1]

Based on the signal from the sequencer 170, the TSF driver 134 raises the signals VBST and VRDEC to the voltage VPGMHL (VSS<VPGMHL) or the voltage VPGMHH (VPGMHL<VPGMHH). The voltage VPGMHL or the voltage VPGMHH is a voltage which sets the transistors 50 and 1310 in the ON state.

[Time T1]~[Time T2]

At time T1, the row decoder 120 selects a block BLK in accordance with a block address BA which is delivered from the address register 150. In addition, the row decoder 120 applies a voltage VSGD_PROG (e.g. VSS<VSGD_PROG<VPGMHL) to a selected select gate line SGD_SEL, applies a voltage VSGS to a selected select gate line SGS_SEL and unselected select gate lines SGS_USEL, and applies a voltage VSS to unselected select gate lines SGD_USEL. The voltage VSGD_PROG is a voltage which sets the select transistor ST1 in the ON state.

At time T1, the sense amplifier 140 applies, for example, a voltage VSS to a write bit line BL_prog which injects electrons in the charge storage layer 29 of the memory cell transistor MT, and applies a voltage VDD (VSS<VDD<VSGD_PROG) to non-write bit lines BL_inhibit which suppress injection of electrons into the charge storage layers 29 of memory cell transistors MT.

[Time T2]~[Time T3]

Subsequently, at time T2, the row decoder 120 applies a voltage VSGD (VSS<VSGD<VSGD_PROG) to the selected select gate line SGD_SEL. The voltage VSGD is a voltage which enables the select transistor ST1 to conduct the voltage VSS, but disables the select transistor ST1 to conduct the voltage VDD. Accordingly, the select transistors ST1, which correspond to the non-write bit lines BL_inhibit, enter the cut-off state.

[Time T3]~[Time T4]

Next, at time T3, the row decoder 120 applies a voltage VPASS (VSGD<VPASS<VPGMHL) to the word lines WL (WL_SEL and WL_USEL).

[Time T4]~[Time T5]

Subsequently, the row decoder 120 raises the voltage, which is applied to the plural selected word lines WL_SEL, from the voltage VPASS to the voltage VPGM (VPASS<VPGM<VPGMHL). Thereby, electrons are injected in the selected memory cell transistors which are connected to the selected word lines WL_SEL. The voltage VPGM is appropriately varied in accordance with data to be written or the number of times of program.

[Time T5]~[Time T6]

After the selected memory cell transistors are programmed in the period of time T4 to time T5, the row decoder 120 lowers, in the period from time T5 to time T6, the voltages of the word lines WL and the selected select gate line SGD_SEL to a several voltage, and the sense amplifier 140 lowers the voltage of the non-write bit lines BL_inhibit to the voltage VSS. Based on the signal from the sequencer 170, the TSF driver 134 lowers the signals VBST and VRDEC to the voltage VSS. Thereby, the program is finished.

[S1006]

As illustrated in FIG. 7, the sequencer 170 executes the program verify, after the program is finished.

Figure 9:
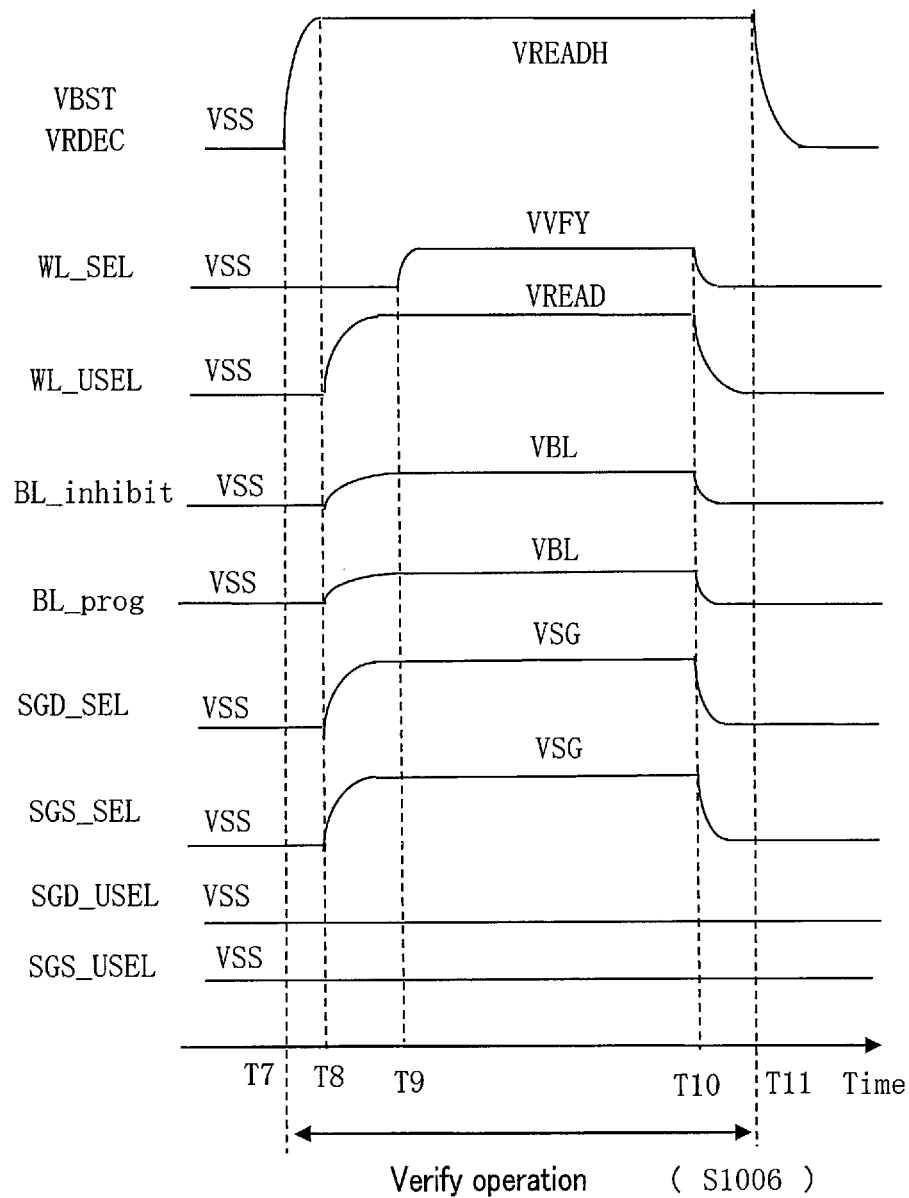
FIG. 9 illustrates typical operational waveforms in a verify operation.

Referring to FIG. 9, a description is given of typical operational waveforms of the program verify. The waveforms illustrated in FIG. 9 may also be applicable to an erase verify operation which will be described later.

[Time T7]~[Time T8]

Based on the signal from the sequencer 170, the TSF driver 134 raises the signals VBST and VRDEC to a voltage VREADH (VSS<VREADH). The voltage VREADH is a voltage which sets the transistors 50 and 1310 in the ON state.

[Time T8]~[Time T9]

At time T8, the row decoder 120 applies a voltage VSG (e.g. VSS<VSG<VREADH) to the selected select gate lines SGD_SEL and SGS_SEL, applies a voltage VSS to the unselected select gate lines SGD_USEL and SGS_USEL, and applies a voltage VREAD (VSS<VREAD<VREADH) to the unselected word lines WL_USEL. The voltage VSG is a voltage which sets the select transistor ST1 in the ON state.

At time T8, the sense amplifier 140 applies, for example, a voltage VBL (VSS<VBL<VREAD) to the bit lines BL (BL_prog and BL_inhibit).

[Time T9]~[Time T10]

At time T9, the row decoder 120 applies a voltage VPVFY (VSS<VPVFY<VREAD) to the selected word line WL_SEL. In addition, the sense amplifier 140 reads data of the selected memory cell transistors. Thereby, it is determined whether the selected memory cell transistors pass the program verify or fail the program verify.

[Time T10]~[Time T11]

The row decoder 120 lowers the potentials of the selected select gate lines SGD_SEL and SGS_SEL to the voltage VSS, and the sense amplifier 140 lowers the potentials of the bit lines BL to the voltage VSS. Based on the signal from the sequencer 170, the TSF driver 134 lowers the signals VBST and VRDEC to the voltage VSS.

Thereby, the program verify is finished.

[S1007]

As illustrated in FIG. 7, the sequencer 170 determines whether the result of the program verify is "pass" or not. To be more specific, the sequencer 170 determines whether the number of fail bits which are determined to be "fail" by the program verify is equal to or more than a preset value. If the number of fail bits is less than the preset value, the sequencer 170 determines that the result of the program verify is "pass". This preset value corresponds to, for example, the number of bits which cannot be recovered by the ECC circuit 260. This preset value is stored, for example, in the status register 180. Specifically, such a configuration may be adopted that this preset value is stored, for example, in the memory cell array 110, and this preset value is read out into the status register 180 when the NAND flash memory 100 is activated. That is, the sequencer 170 compares the preset value stored in the status register 180 with the number of fail bits. If the sequencer 170 determines that the result of the program verify is "pass" (i.e. step S1007, Yes), the sequencer 170 terminates the write operation.

[S1008]

If the sequencer 170 determines that the result of the program verify is not "pass" (i.e. step S1007, No), the sequencer 170 determines whether a repetition number (a program loop number) of the program is equal to or more than a second value. This second value is stored, for example, in the status register 180. Specifically, such a configuration may be adopted that this second value is stored, for example, in the memory cell array 110, and the second value is read out into the status register 180 when the NAND flash memory 100 is activated. That is, the sequencer 170 compares the second value stored in the status register

180 with the program loop number of the program. If the sequencer 170 determines that the program loop number is equal to or more than the second value (i.e. step S1008, Yes), the sequencer 170 terminates the write operation.

For example, in some cases, there may exist a memory cell transistor in which data cannot correctly be written even if the program is executed many times. It is not preferable that the program is repeated until such a memory cell transistor passes the verify. Thus, by setting the loop number of the program in this step, an unnecessary loop of the program can be avoided.

[S1009]

If the sequencer 170 determines that the program loop number is not equal to or more than the second value (i.e. step S1008, No), the sequencer 170 counts up the program loop number (NWn_Loop). For example, the program loop number is stored in the status register 180 or the like. Besides, the count of the program loop number may be executed by the sequencer 170, or may be executed by other configuration.

[S1010]

In addition, after counting up the loop number, the sequencer 170 increments the voltage VPGM, which is used in the program, by a voltage DVPGM. Then, the sequencer 170 repeats step S1005.

In the meantime, the order of execution of step S1008 and step S1009 may be reversed. In this case, the second value in step S1008 increases by "1". In the description below, in other operations including step S1008 and step S1009, the order of execution of step S1008 and step S1009 may similarly be reversed.

<1-2-2> Command Sequence

Figure 10:
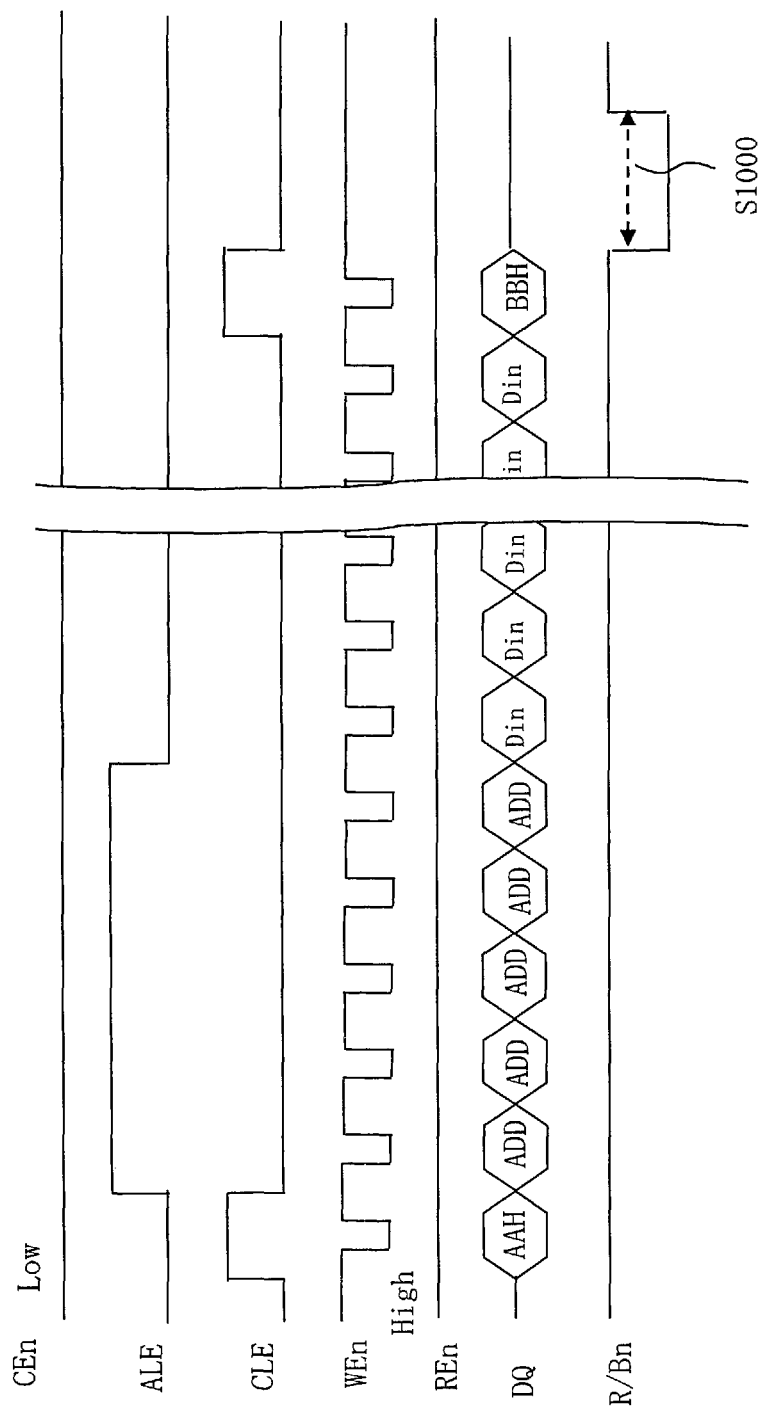
FIG. 10 illustrates a command sequence at time of a write operation in the memory system according to the first embodiment.

Referring to FIG. 10, a command sequence in the write operation will be described. As illustrated in FIG. 10, the memory controller 200 first issues a write command AAH, and asserts the signal CLE ("H" level). Subsequently, the memory controller 200 issues addresses (ADD: column address, row address) over, for example, five cycles, and asserts the signal ALE ("H" level). The above-described command and addresses are stored, for example, in the command register 160 and the address register 150, respectively.

Next, the memory controller 200 outputs write data Din over plural cycles. During this period, the signals ALE and CLE are negated ("L" level). The write data Din, which are received by the NAND flash memory 100, are stored in a page buffer (not shown) in the sense amplifier 140.

Next, the memory controller 200 issues a write command "BBH" and asserts the signal CLE. Responding to storing of the command "BBH" in the command register 160, the sequencer 170 starts the write operation (S1000), and the NAND flash memory 100 enters the busy state (RBn="L"). Each time the memory controller 200 issues a signal such as a command, address and data, the memory controller 200 asserts the signal WEn ("L" level). In addition, each time the signal WEn is toggled, the signal is taken in the NAND flash memory 100.

<1-3> Advantageous Effects

According to the above-described embodiment, the sequencer 170 changes the control voltage to the transfer transistor which conducts the voltage to the word line WL, in accordance with the program loop number. Thereby, it can cause the transfer transistor to appropriately conduct the voltage.

The advantageous effects of the above-described embodiment will be described. In the NAND flash memory 100 according to this embodiment, desired voltages are applied to the word lines WL via the plural transfer transistors.

Figure 11:
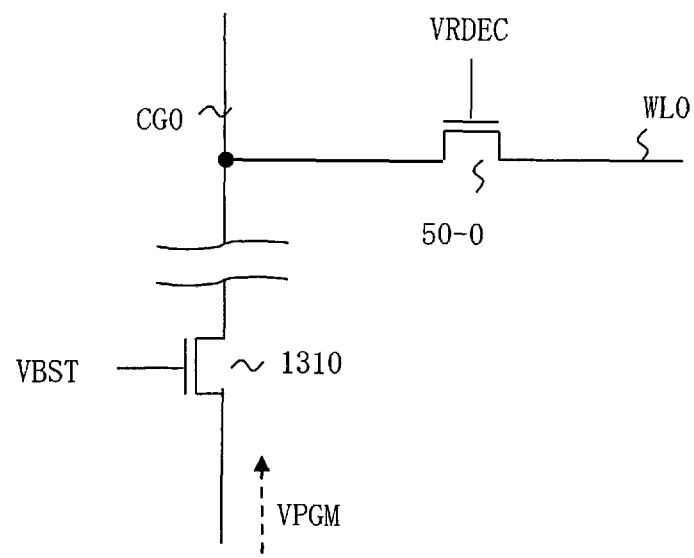
FIG. 11 is a circuit diagram illustrating a transfer path of a voltage VPGM of the memory system according to the first embodiment.

Specifically, as illustrated in FIG. 11, the voltage VPGM is applied to the word line WL via the transistor 1310 provided in the driver circuit 130 and the transistor 50-0 provided in the row decoder 120.

Figure 12:
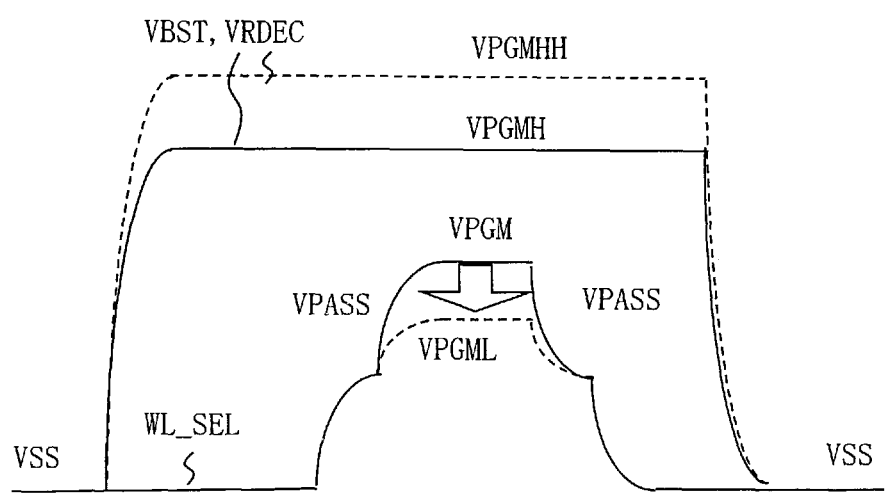
FIG. 12 illustrates operational waveforms in a program operation of a memory system according to a comparative example.

As illustrated in FIG. 12, in order to conduct or transfer the voltage VPGM, a voltage VPGMH, which is higher than the voltage VPGM, needs to be applied to the gate of the transfer transistor. However, due to various factors (e.g. degradation of the transfer transistor), it is possible that the threshold of the transfer transistor rises, and the voltage VPGM may not properly be conducted. Thus, it is considered that the voltage VPGMH may be preset to a higher voltage VPGMHH. In this case, however, the load on the gate of the transfer transistor increases and degradation of the transfer transistor may be advanced. As a result, the threshold of the transfer transistor rises, and the voltage VPGM may not properly be conducted or transferred. The threshold means a voltage which is necessary for setting a transistor in the ON state.

Thus, in the method as illustrated in FIG. 12, if the write operations are repeated, such an issue may likely arise that the proper voltage cannot be conducted to the word line WL.

Figure 13:
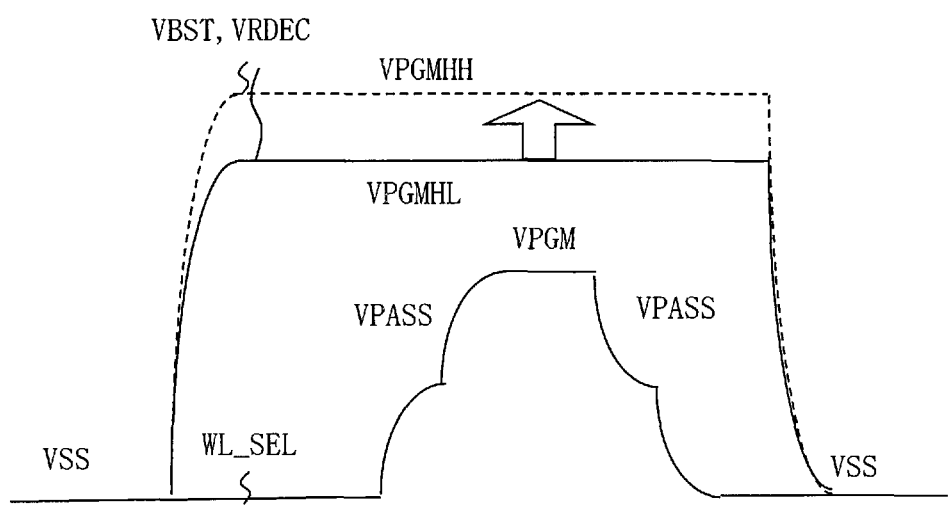
FIG. 13 illustrates operational waveforms in a program operation of the memory system according to the first embodiment.

Taking the issue into account, in the present embodiment, as illustrated in FIG. 13, before the transfer transistor is degraded (i.e. in the state in which the threshold is low), the sequencer 170 applies the voltage VPGMHL, which is lower than the voltage VPGMHH, to the gate of the transfer transistor. After the transfer transistor is degraded (i.e. in the state in which the threshold is high), the sequencer 170 applies the voltage VPGMHH to the gate of the transfer transistor.

In the memory cell transistor, there is a tendency that the program loop number becomes smaller as the number of times of write (or the number of times of erase) becomes larger. Thus, in the present embodiment, by determining whether the program loop number is a certain value or less, the sequencer 170 determines the frequency of use of the transfer transistor, that is, the degree of degradation of the transfer transistor.

Thereby, since an unnecessarily large voltage is not applied to the gate of the transfer transistor, the degradation of the transfer transistor can be suppressed or delayed. As a result, even if the write operation is repeated, the sequencer 170 can transfer an appropriate voltage to the word line WL.

<1-4> Modification Example 1 of the First Embodiment

Figure 14:
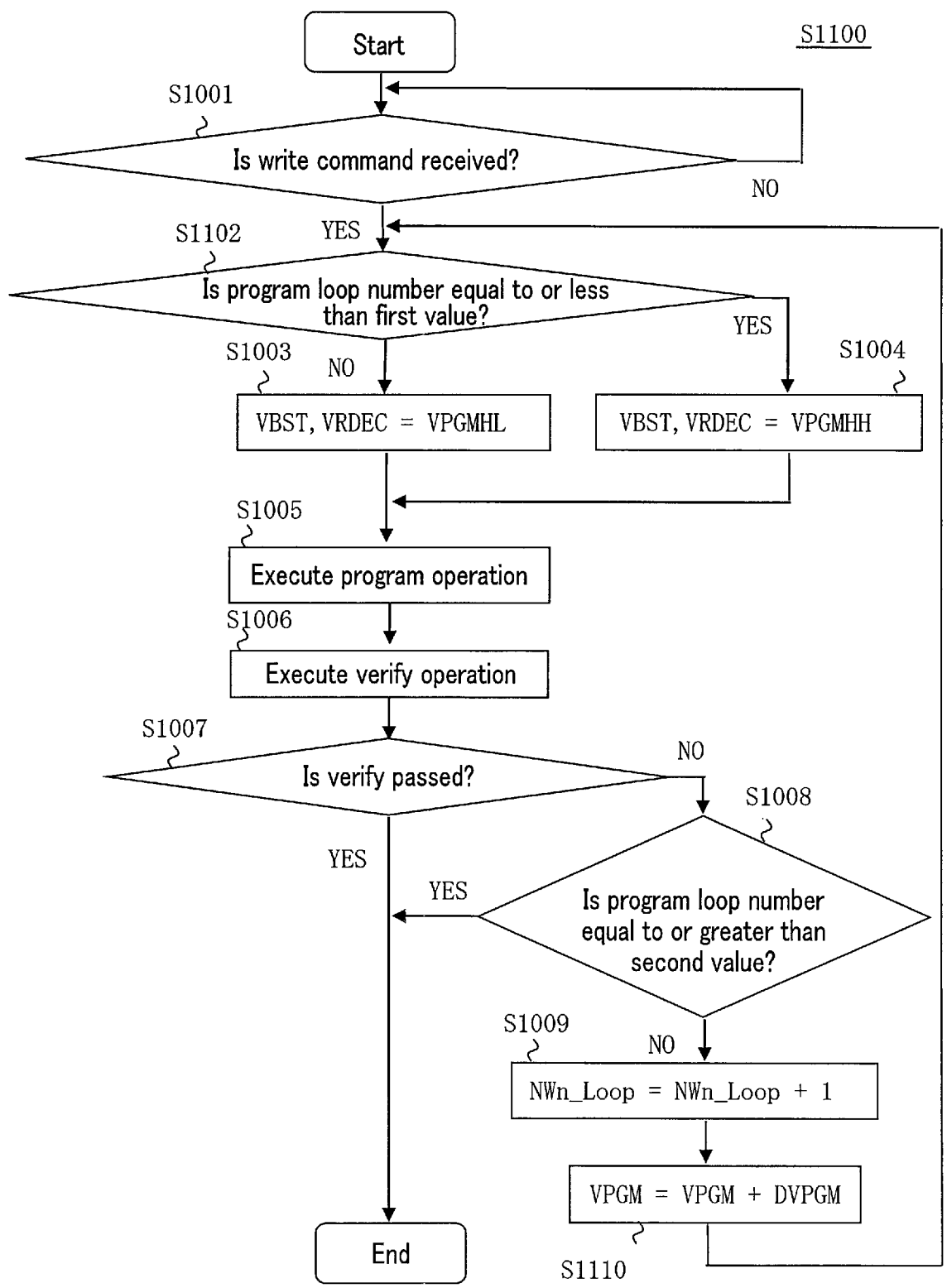
FIG. 14 is a flowchart of a write operation (S1100) of a memory system according to Modification Example 1 of the first embodiment.

Referring to FIG. 14, operations S1100 of Modification Example 1 of the first embodiment will be described.

The operations S1100 differs from the operation of FIG. 7 with respect to the operation after step S1010 in FIG. 7.

Specifically, after step S1010 in FIG. 7 (i.e. step S1110 in FIG. 14), the sequencer 170 executes not the step S1005 in FIG. 7, but the step S1002 in FIG. 7 (i.e. step S1102 in FIG. 14).

The step S1102 in FIG. 14 is similar to step S1002 in FIG. 7, and the step S1110 in FIG. 14 is similar to step S1010 in FIG. 7.

<1-5> Modification Example 2 of the First Embodiment

Referring to FIG. 15, operations S1200 of Modification Example 2 of the first embodiment will be described.

The operations S1200 differ from the operations of FIG. 7 with respect to the operations of steps S1002 to S1004 in FIG. 7.

Specifically, in the operation corresponding to step S1002 in FIG. 7 (i.e. step S1202 in FIG. 15), the sequencer 170 determines whether an erase loop number (the number of times of erase, which will be described later) stored in the status register 180 is equal to or more than a third value. The third value may be preset, or may be arbitrarily set by a user.

If the sequencer 170 determines that the erase loop number is not equal to or more than the third value (i.e. step S1202, No), the sequencer 170 sets the signals VBST and VRDEC at the time of the program to the voltage VPGMHL in the operation corresponding to step S1003 in FIG. 7 (i.e. step S1203 in FIG. 15).

If the sequencer 170 determines that the erase loop number is equal to or more than the third value (i.e. step S1202, Yes), the sequencer 170 sets the signals VBST and VRDEC at the time of the program to the voltage VPGMHH in the operation corresponding to step S1004 in FIG. 7 (i.e. step S1204 in FIG. 15).

As described above, in Modification Example 2 of the first embodiment, the sequencer 170 determines the degree of degradation of the transfer transistor, not based on the program loop number, but based on the erase loop number.

In the memory cell transistor, there is a tendency that the erase loop number becomes larger as the number of times of write (or the number of times of erase) becomes larger. Thus, in the present embodiment, by determining whether the erase loop number is equal to or more than a certain value, the sequencer 170 determines the frequency of use of the transfer transistor, that is, the degree of degradation of the transfer transistor. As a result, advantageous effects similar to those of the first embodiment may be obtained.

<1-6> Modification Example 3 of the First Embodiment

Figure 16:
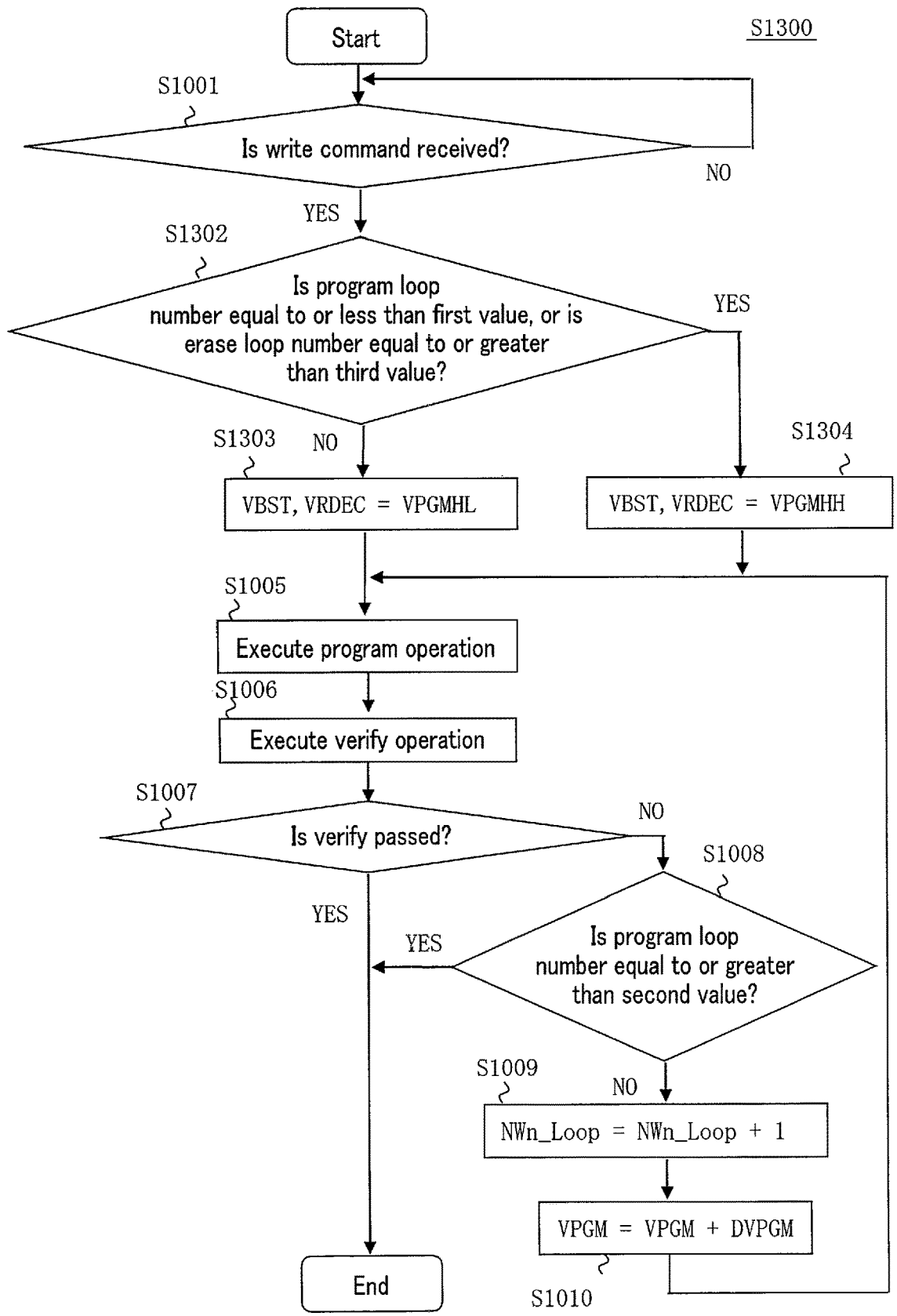
FIG. 16 is a flowchart of a write operation (S1300) of a memory system according to Modification Example 3 of the first embodiment.

Referring to FIG. 16, operations S1300 of Modification Example 3 of the first embodiment will be described.

The operations S1300 differ from the operations of FIG. 7 with respect to the operations of steps S1002 to S1004 in FIG. 7.

Specifically, in the operation corresponding to step S1002 in FIG. 7 (i.e. step S1302 in FIG. 16), the sequencer 170 determines whether the program loop number, which is stored in the status register 180, is equal to or less than the first value, or the erase loop number stored in the status register 180 is equal to or more than than the third value.

If the sequencer 170 determines that the program loop number is not equal to or less than the first value, and that the erase loop number is not equal to or greater than the third value (i.e. step S1302, No), the sequencer 170 sets the signals VBST and VRDEC at the time of the program to the voltage VPGMHL in the operation corresponding to step S1003 in FIG. 7 (i.e. step S1303 in FIG. 16).

If the sequencer 170 determines that the program loop number is equal to or less than the first value, or that the erase loop number is equal to or more than the third value (i.e. step S1302, Yes), the sequencer 170 sets the signals VBST and VRDEC at the time of the program to the voltage VPGMHH in the operation corresponding to step S1004 in FIG. 7 (i.e. step S1304 in FIG. 16).

In step S1302, the sequencer 170 may determine whether the program loop number is equal to or less than the first value and the erase loop number is equal to or more than the third value.

In this case, if the sequencer 170 determines that the program loop number is not equal to or less than the first value, or that the erase loop number is not equal to or more than the third value (i.e. step S1302, No), the sequencer 170 sets, in step S1303, the signals VBST and VRDEC at the time of the program to the voltage VPGMHL. Further, if the sequencer 170 determines that the program loop number is equal to or less than the first value, and that the erase loop number is equal to or more than the third value (i.e. step S1302, Yes), the sequencer 170 sets, in step S1304, the signals VBST and VRDEC at the time of the program to the voltage VPGMHH.

<1-7> Modification Example 4 of the First Embodiment

Figure 17:
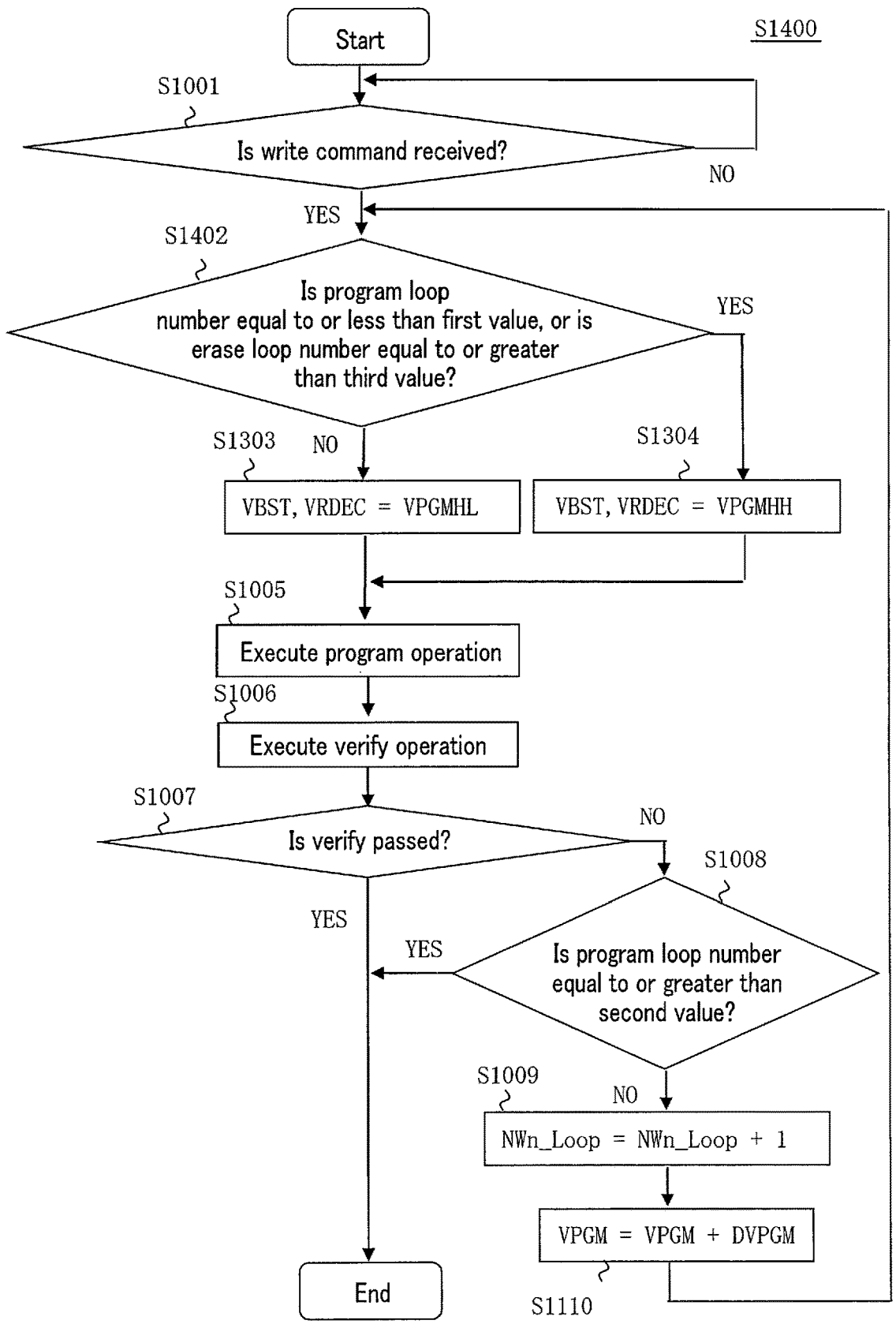
FIG. 17 is a flowchart of a write operation (S1400) of a memory system according to Modification Example 4 of the first embodiment.

Referring to FIG. 17, operations S1400 of Modification Example 4 of the first embodiment will be described.

The operations S1400 differ from the operations of FIG. 16 with respect to the operation after step S1010 in FIG. 16.

Specifically, after step S1010 in FIG. 16 (i.e. step S1110 in FIG. 17), the sequencer 170 executes not the step S1005 in FIG. 16, but the step S1302 in FIG. 16 (i.e. step S1402 in FIG. 17).

The step S1402 in FIG. 17 is similar to step S1302 in FIG. 16, and the step S1110 in FIG. 17 is similar to step S1010 in FIG. 16.

In addition, in step S1402, the sequencer 170 may determine whether the program loop number is equal to or less than the first value and the erase loop number is equal to or more than the third value.

<1-8> Modification Example 5 of the First Embodiment

Figure 18:
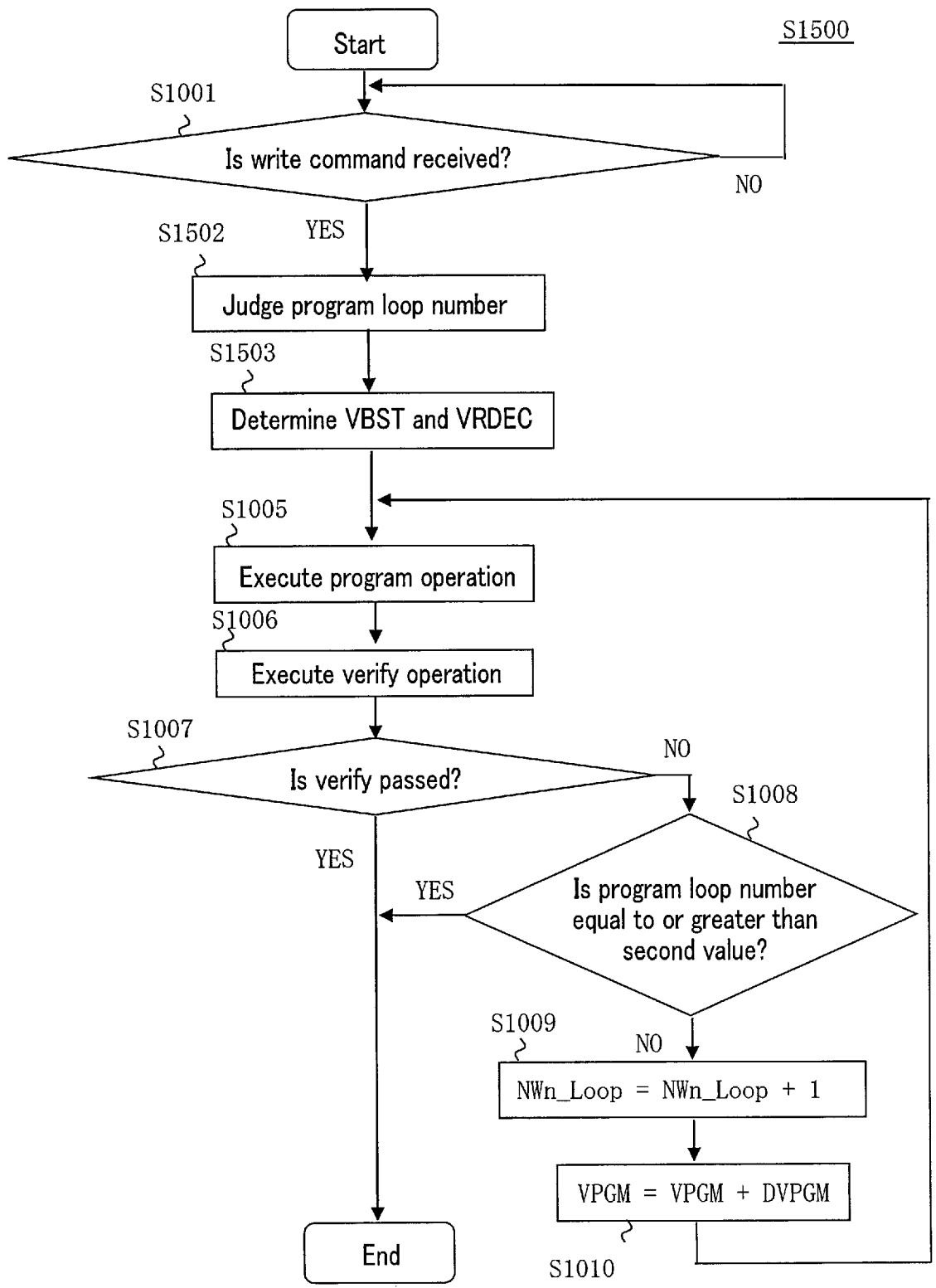
FIG. 18 is a flowchart of a write operation (S1500) of a memory system according to Modification Example 5 of the first embodiment.

The TSF driver 134 according to the first embodiment is configured to generate two kinds of voltages, i.e. VPGMHL and VPGMHH, as voltages for conducting or transferring the voltage VPGM. However, the TSF driver 134 may be configured to generate three or more kinds of voltages as voltages for conducting or transferring the voltage VPGM. Hereinafter, referring to FIG. 18, a description will be given of operations in a case where three or more kinds of voltages are generated.

[S1502]

If the sequencer 170 determines that the write command is received from the memory controller 200 (i.e. step S1001, Yes), the sequencer 170 determines which of a plurality of ranges (e.g. three ranges in this example) the program loop number stored in the status register 180 belongs to.

For example, three ranges, namely a first range, a second range and a third range, are provided. In addition, when the program loop number is equal to or more than a value A, the sequencer 170 determines that the program loop number is in the first range. When the program loop number is more than value A and is equal to or less than a value B, the sequencer 170 determines that the program loop number is in the second range. When the program loop number is more than the value B, the sequencer 170 determines that the program loop number is in the third range. The value A and the value B may be preset, or may be arbitrarily set by a user.

[S1503]

Upon determination of which of the ranges the program loop number belongs to, the sequencer 170 determines the voltages of the signals VBST and VRDEC at the time of the program.

Specifically, if the sequencer 170 determines that the program loop number belongs to the third range, the sequencer 170 sets the signals VBST and VRDEC to a voltage VPGMH3 (VPGM<VPGMH3). If the sequencer 170 determines that the program loop number belongs to the second range, the sequencer 170 sets the signals VBST and VRDEC to a voltage VPGMH2 (VPGMH3<VPGMH2). If the sequencer 170 determines that the program loop number belongs to the first range, the sequencer 170 sets the signals VBST and VRDEC to a voltage VPGMH1 (VPGMH2<VPGMH1).

In this manner, the configuration may generate the three kinds of voltages as the voltages for conducting or transferring the voltage VPGM.

Although the method of generating the three kinds of voltages as the voltages for conducting or transferring the voltage VPGM is described herein for simplicity, four or more kinds of voltages may be generated similarly.

The above-described step S1502 may be replaced with step S1102 in FIG. 14, and the step S1503 may be replaced with step S1003 and step S1004 in FIG. 14.

<1-9> Modification Example 6 of the First Embodiment

Figure 19:
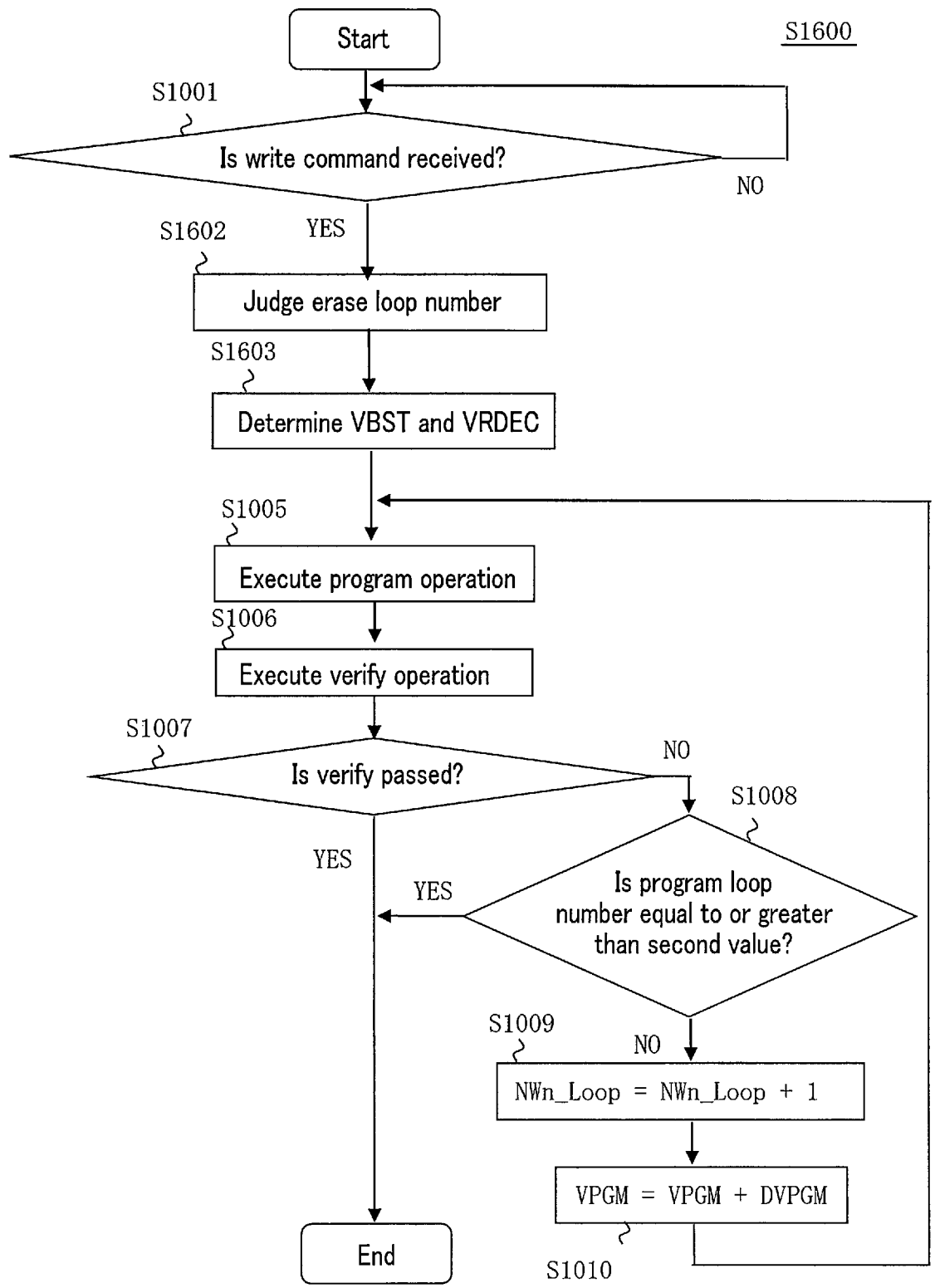
FIG. 19 is a flowchart of a write operation (S1600) of a memory system according to Modification Example 6 of the first embodiment.

Referring to FIG. 19, a description will be given of a case of generating three kinds of voltages as voltages for the voltage conducted VPGM, based on the erase loop number.

[S1602]

If the sequencer 170 determines that the write command was received from the memory controller 200 (i.e. step S1001, Yes), the sequencer 170 determines which of a plurality of ranges (e.g. three ranges in this example) the erase loop number stored in the status register 180 belongs to.

For example, three ranges, namely a fourth range, a fifth range and a sixth range, are provided. In addition, when the erase loop number is equal to or less than a value C, the sequencer 170 determines that the erase loop number is in the fourth range. When the erase loop number is more than the value C and is equal to or less than a value D, the sequencer 170 determines that the erase loop number is in the fifth range. When the erase loop number is more than the value D, the sequencer 170 determines that the erase loop number is in the sixth range. The value C and value D may be preset, or may be arbitrarily set by a user.

[S1603]

Upon determination of which of the ranges the erase loop number belongs to, the sequencer 170 determines the voltages of the signals VBST and VRDEC at the time of the program.

Specifically, if the sequencer 170 determines that the erase loop number belongs to the fourth range, the sequencer 170 sets the signals VBST and VRDEC to a voltage VPGMH4 (VPGM<VPGMH4). If the sequencer 170 determines that the erase loop number belongs to the fifth range, the sequencer 170 sets the signals VBST and VRDEC to a voltage VPGMH5 (VPGMH4<VPGMH5). If the sequencer 170 determines that the erase loop number belongs to the sixth range, the sequencer 170 sets the signals VBST and VRDEC to a voltage VPGMH6 (VPGMH5<VPGMH6).

In this manner, the configuration may generate the three kinds of voltages as the voltages for conducting or transferring the voltage VPGM.

Although the method of generating the three kinds of voltages as the voltages for conducting or transferring the voltage VPGM is described herein for simplicity, four or more kinds of voltages may be generated similarly.

<2> Second Embodiment

A second embodiment will be described. In the second embodiment, a description is given of a case in which the signal VBST and signal VRDEC are independently controlled. The typical configuration and typical operation of the memory device according to the second embodiment are similar to those of the memory device according to the above-described first embodiment. Accordingly, descriptions are omitted of the matters described in the first embodiment, and matters which are easily guessed from the first embodiment.

<2-1> TSF Driver

Referring to FIG. 20, the TSF driver 134 of the NAND flash memory 100 according to the second embodiment will be described.

The TSF driver 134 of the NAND flash memory 100 according to the second embodiment includes a third driver 1342 and a fourth driver 1343. The configurations of the third driver 1342 and fourth driver 1343 are similar to the configuration of the first driver 1340. The sequencer 170 may independently control the third driver 1342 and fourth driver 1343. Based on a control signal from the sequencer 170, the third driver 1342 supplies the voltage VPGMHL or VPGMHH as the signal VRDEC to the row decoder 120. Based on a control signal from the sequencer 170, the fourth driver 1343 supplies the voltage VPGMHL or VPGMHH as the signal VBST to the first level shifter 1311.

<2-2> Operations

Figure 21:
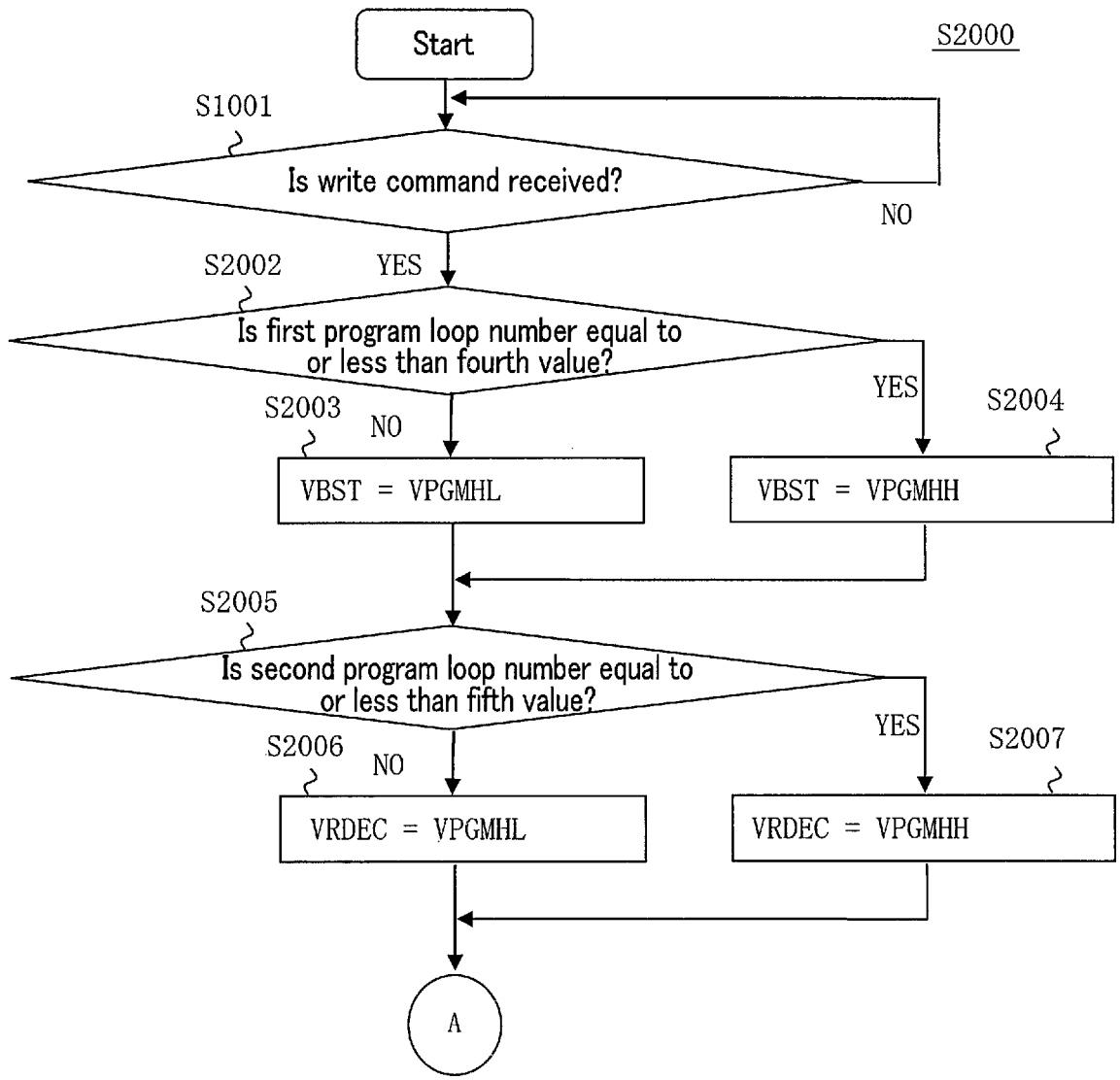
FIG. 21 is a flowchart of a write operation (S2000) of the memory system according to the second embodiment.
Figure 22:
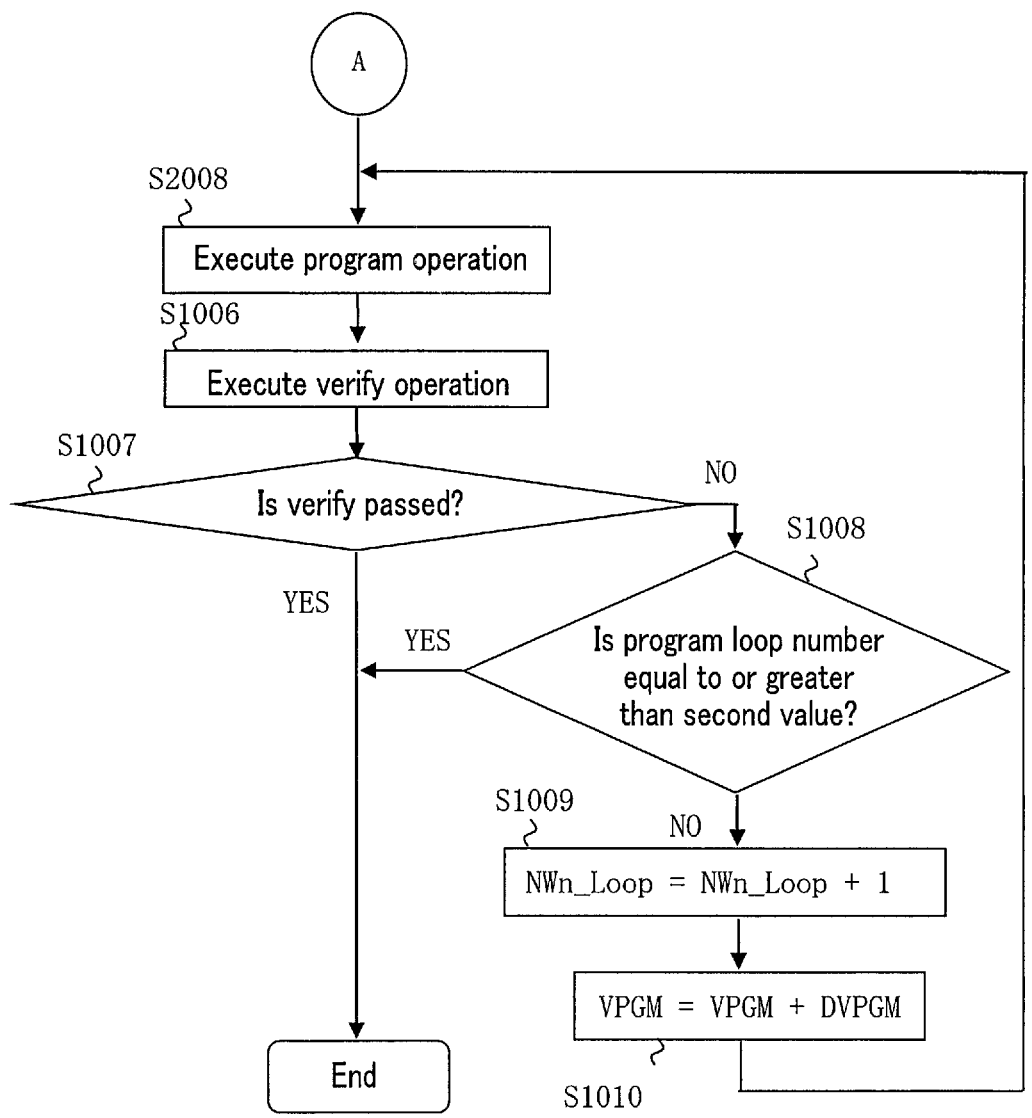
FIG. 22 is a flowchart of the write operation (S2000) of the memory system according to the second embodiment.

Referring to FIG. 21 and FIG. 22, a description is given for flowcharts of write operations (S2000) according to the second embodiment.

[S1001]

The sequencer 170 executes similar operations as in the above-described step S1001.

[S2002]

If the sequencer 170 determines that the write command is received from the memory controller 200 (i.e. step S1001, Yes), the sequencer 170 determines whether a first program loop number, stored in the status register 180 is equal to or less than a fourth value. For example, in the second embodiment, a latest program loop number for each of the blocks BLK is stored in the status register 180. For example, each program loop number may be associated with the block address and stored in the status register 180. For example, the first program loop number is a least program loop number among a plurality of program loop numbers stored in the status register 180. The fourth value may be preset, or may be arbitrarily set by a user.

[S2003]

If the sequencer 170 determines that the first program loop number is not equal to or less than the fourth value (i.e. step S2002, No), the sequencer 170 sets the signal VBST at the time of the program to the voltage VPGMHL. Specifically, at the time of the program, the sequencer 170 sets the signal VPH, which is delivered to the fourth driver 1343, at "H" level, sets the signal VPHL at "H" level, and sets the signal VPHH at "L" level.

[S2004]

If the sequencer 170 determines that the first program loop number is equal to or less than the fourth value (i.e. step S2002, Yes), the sequencer 170 sets the signal VBST at the time of the program to the voltage VPGMHH. Specifically, at the time of the program, the sequencer 170 sets the signal VPH, which is delivered to the fourth driver 1343, at "H" level, sets the signal VPHL at "L" level, and sets the signal VPHH at "H" level.

[S2005]

The sequencer 170 determines whether a second program loop number stored in the status register 180 is equal to or less than a fifth value. The second program loop number is a program loop number associated with the same block address as the block address corresponding to the write command received in step S1001. The fifth value may be preset, or may be arbitrarily set by a user.

[S2006]

If the sequencer 170 determines that the second program loop number is not equal to or less than the fifth value (i.e. step S2005, No), the sequencer 170 sets the signal VRDEC at the time of the program to the voltage VPGMHL. Specifically, at the time of the program, the sequencer 170 sets the signal VPH, which is delivered to the third driver 1342, at "H" level, sets the signal VPHL at "H" level, and sets the signal VPHH at "L" level.

[S2007]

If the sequencer 170 determines that the second program loop number is equal to or less than the fifth value (i.e. step S2005, Yes), the sequencer 170 sets the signal VRDEC at the time of the program to the voltage VPGMHH. Specifically, at the time of the program, the sequencer 170 sets the signal VPH, which is delivered to the third driver 1342, at "H" level, sets the signal VPHL at "L" level, and sets the signal VPHH at "H" level.

[S2008]

The sequencer 170 executes the program based on the settings determined by steps S2002 to S2007. FIG. 23 illustrates typical operational waveforms in the program. The typical operations are similar to the operations illustrated in FIG. 8. As illustrated in FIG. 23, the signal VBST and the signal VRDEC may independently be controlled.

Specifically, from time T0 to time T6, the sequencer 170 may set the voltage of the signal VBST to the voltage VPGMHH, and further set the voltage of the signal VRDEC to the voltage VPGMHL.

[S1006]~[S1010]

The sequencer 170 executes the similar operations to the above-described steps S1006 to S1010.

The order of the execution of steps S2002 to S2004 and the execution of steps S2005 to S2007 may be changed. In the description below, in other operations including the steps S2002 to S2004 (the corresponding steps to steps S2002 to S2004) and the steps S2005 to S2007 (the corresponding steps to steps S2005 to S2007), the order of the execution of steps S2002 to S2004 and the execution of steps S2005 to S2007 may similarly be changed.

<2-3> Advantageous Effects

According to the above-described embodiment, the sequencer 170 changes the voltages of the signals VBST and VRDEC, respectively, in accordance with the program loop numbers. Thereby, the voltages may cause the transfer transistors to properly conduct or transfer voltages.

The advantageous effects of the above-described embodiment will be described.

Figure 24:
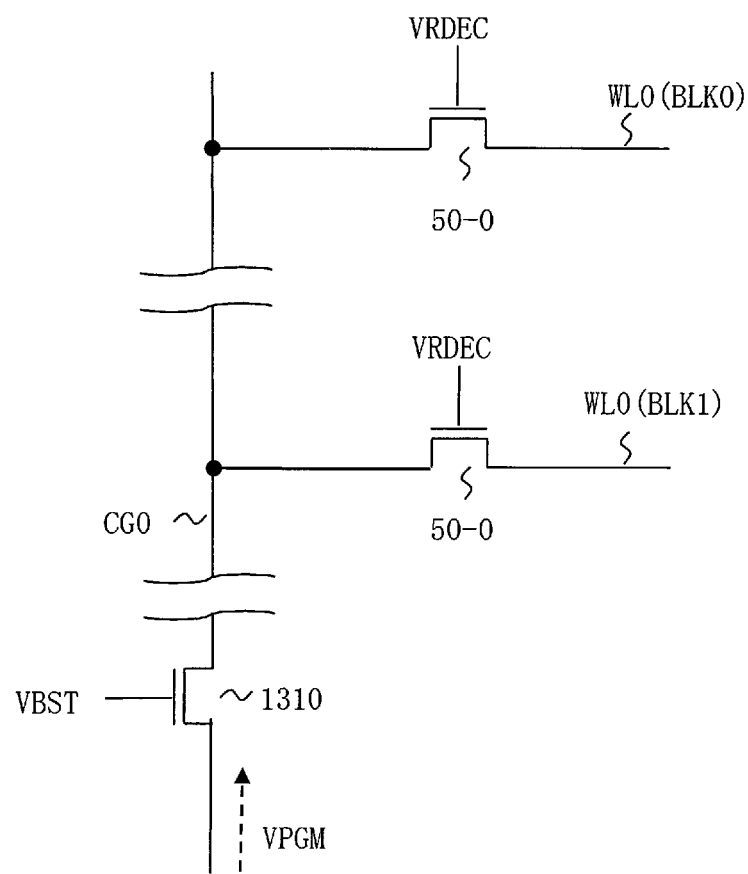
FIG. 24 is a circuit diagram illustrating a transfer path of a voltage VPGM in the memory system according to the second embodiment.

As illustrated in FIG. 24, the voltage VPGM is applied to a word lines WL via a transistor 1310 provided in the driver circuit 130 and transistors 50 provided in a row decoder 120.

However, the number of times of conducting or transfer of the voltage VPGM by the transistor 1310 is more than the number of times of conducting or transfer of the voltage VPGM by the transistor 50. As described also in the first embodiment, for example, the transistors 50-0 (BLK0 to BLK3), which correspond to the four blocks BLK0 to BLK3, are connected to the signal line CG0. However, substantially one transistor 1310 is connected to the signal line CG0 (although a plurality of transistors 130 may be provided in series, these transistors 130 operate substantially as if they were one transistor). For example, there may be a case in which the voltage VPGM is once supplied to each of the word line WL0 of the block BLK0 and the word line WL0 of the block BLK1. In this case, each of the transistor 50-0 (BLK0) and transistor 50-0 (BLK1) conducts or transfers the voltage VPGM once. However, the transistor 1310, which is connected to the signal line CG0, conducts or transfers the voltage VPGM twice. Thus, the number of times of conducting or transfer of the voltage VPGM by the transistor 1310 is more than the number of times of conducting or transfer of the voltage VPGM by the transistor 50.

The degree of degradation may be different between the transistor 1310 and the transistors 50 due to the difference in frequency of use.

Taking this into account, the sequencer 170 of the present embodiment refers to the least program loop number (first program loop number) among the program loop numbers in the four blocks BLK0 to BLK3, thereby determining the degree of degradation of the transistor 1310. In addition, the sequencer 170 of the present embodiment refers to the program loop number (second program loop number) of each block BLK, thereby determining the degree of degradation of the transistor 50 of that block BLK that is the target of the write operation.

Thereby, since an unnecessarily large voltage is not applied to the gate of each transfer transistor, the degradation of each transfer transistor is mitigated. As a result, even if the write operations are repeated, the sequencer 170 transfers a proper voltage to the word line WL.

<2-4> Modification Example 1 of the Second Embodiment

Figure 26:
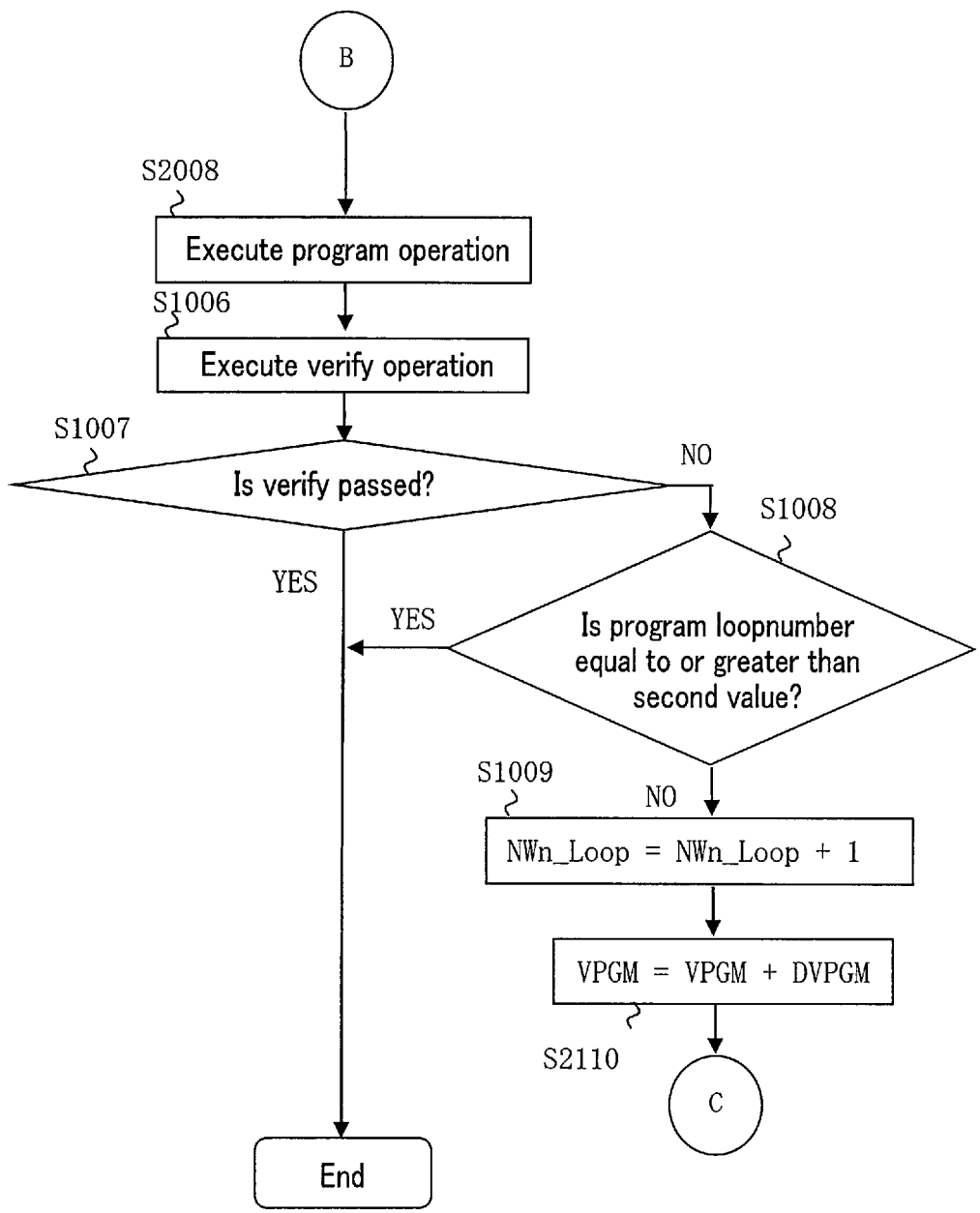
FIG. 26 is a flowchart of the write operation (S2100) of the memory system according to Modification Example 1 of the second embodiment.

Referring to FIG. 25 and FIG. 26, operations S2100 of Modification Example 1 of the second embodiment will be described.

The operations S2100 differ from the operations of FIG. 22 with respect to the operations after step S1010 in FIG. 22.

Specifically, after step S1010 in FIG. 22 (i.e. step S2110 in FIG. 26), the sequencer 170 executes not the step S2008 in FIG. 22, but the step S2002 in FIG. 21 (i.e. step S2102 in FIG. 25).

The step S2102 in FIG. 25 is similar to step S2002 in FIG. 21, and the step S2110 in FIG. 26 is similar to step S1010 in FIG. 22.

<2-5> Modification Example 2 of the Second Embodiment

Figure 27:
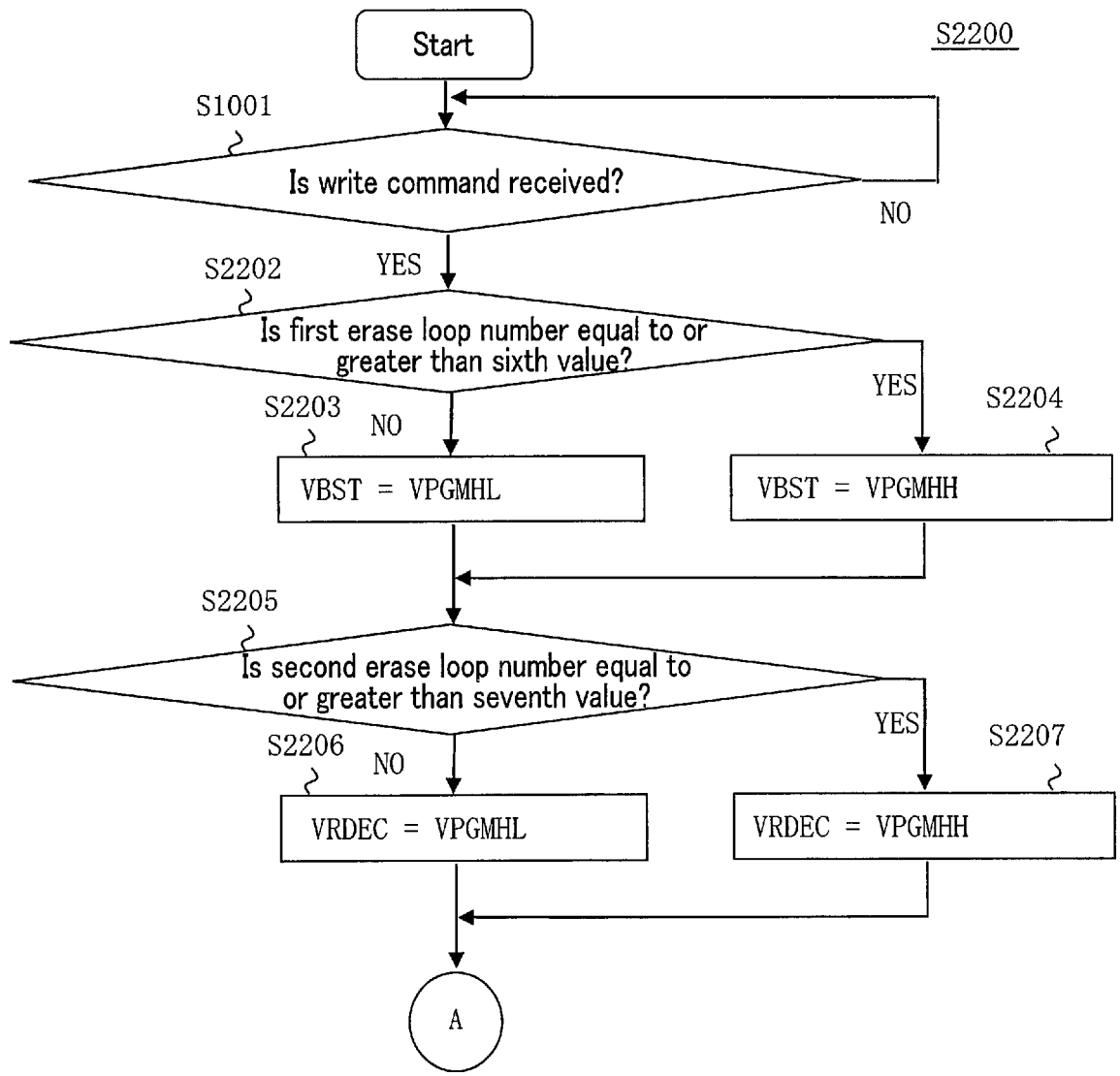
FIG. 27 is a flowchart of a write operation (S2200) of a memory system according to Modification Example 2 of the second embodiment.

Referring to FIG. 27, an operation S2200 of Modification Example 2 of the second embodiment will be described.

The operations S2200 differ from the operations of FIG. 21 with respect to the operations of steps S2002 to S2007 in FIG. 21.

Specifically, in the operation corresponding to step S2002 in FIG. 21 (i.e. step S2202 in FIG. 27), the sequencer 170 determines whether a first erase loop number stored in the status register 180 is equal to or more than a sixth value. For example, in Modification Example 2 of the second embodiment, a latest erase loop number of each of the blocks BLK is stored in the status register 180. For example, each erase loop number may be associated with the block address and stored in the status register 180. The first erase loop number is a least erase loop number among a plurality of erase loop numbers stored in the status register 180. The sixth value may be preset, or may be arbitrarily set by a user.

If the sequencer 170 determines that the first erase loop number is not equal to or more than the sixth value (i.e. step S2202, No), in the operation corresponding to step S2003 in FIG. 21 (i.e. step S2203 in FIG. 27), the sequencer 170 sets the signal VBST at the time of the program to the voltage VPGMHL.

If the sequencer 170 determines that the first erase loop number is equal to or more than the sixth value (i.e. step S2202, Yes), in the operation corresponding to step S2004 in FIG. 21 (i.e. step S2204 in FIG. 27), the sequencer 170 sets the signal VBST at the time of the program to the voltage VPGMHH.

In the operation corresponding to step S2005 in FIG. 21 (i.e. step S2205 in FIG. 27), the sequencer 170 determines whether a second erase loop number stored in the status register 180 is equal to or more than a seventh value. For example, the second erase loop number is an erase loop number associated with the same block address as the block address corresponding to the write command received in step S1001. The seventh value may be preset, or may be arbitrarily set by a user.

If the sequencer 170 determines that the second erase loop number is not equal to or more than the seventh value (i.e. step S2205, No), in the operation corresponding to step S2006 in FIG. 21 (i.e. step S2206 in FIG. 27), the sequencer 170 sets the signal VRDEC at the time of the program to the voltage VPGMHL.

If the sequencer 170 determines that the second erase loop number is equal to or greater than the seventh value (i.e. step S2205, Yes), in the operation corresponding to step S2007 in FIG. 21 (i.e. step S2207 in FIG. 27), the sequencer 170 sets the signal VRDEC at the time of the program to the voltage VPGMHH.

The order of the execution of steps S2202 to S2204 and the execution of steps S2205 to S2207 may be changed.

As described above, in Modification Example 2 of the second embodiment, the sequencer 170 determines the degree of degradation of the transfer transistor, not based on the program loop number, but based on the erase loop number.

<2-6> Modification Example 3 of the Second Embodiment

Figure 28:
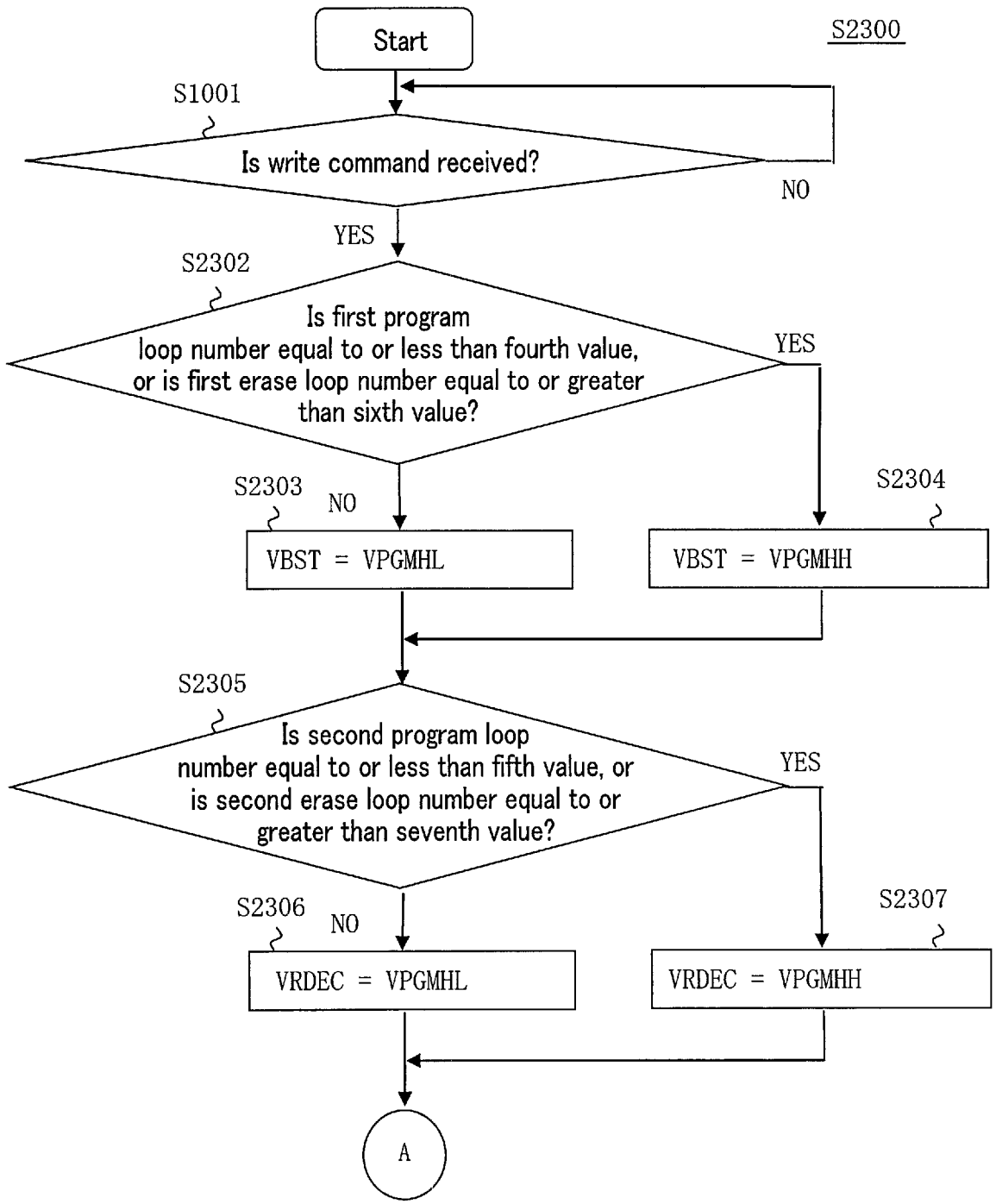
FIG. 28 is a flowchart of a write operation (S2300) of a memory system according to Modification Example 3 of the second embodiment.

Referring to FIG. 28, operations S2300 of Modification Example 3 of the second embodiment will be described.

The operations S2300 differ from the operations of FIG. 21 with respect to the operations of steps S2002 to S2007 in FIG. 21.

Specifically, in the operation corresponding to step S2002 in FIG. 21 (i.e. step S2302 in FIG. 28), the sequencer 170 determines whether the first program loop number stored in the status register 180 is equal to or less than the fourth value, or the first erase loop number stored in the status register 180 is equal to or more than the sixth value.

If the sequencer 170 determines that the first program loop number is not equal to or less than the fourth value, and further that the first erase loop number is not equal to or greater than the sixth value (i.e. step S2302, No), the sequencer 170 sets the signal VBST at the time of the program to the voltage VPGMHL in the operation corresponding to step S2003 in FIG. 21 (i.e. step S2303 in FIG. 28).

If the sequencer 170 determines that the first program loop number is equal to or less than the fourth value, or that the first erase loop number is equal to or more than the sixth value (i.e. step S2302, Yes), the sequencer 170 sets the signal VBST at the time of the program to the voltage VPGMHH in the operation corresponding to step S2004 in FIG. 21 (i.e. step S2304 in FIG. 28).

In the operation corresponding to step S2005 in FIG. 21 (i.e. step S2305 in FIG. 28), the sequencer 170 determines whether the second program loop number stored in the status register 180 is equal to or less than the fifth value, or the second erase loop number stored in the status register 180 is equal to or more than the seventh value.

If the sequencer 170 determines that the second program loop number is not equal to or less than the fifth value, and that the second erase loop number is not equal to or more than the seventh value (i.e. step S2305, No), the sequencer 170 sets the signal VRDEC at the time of the program to the voltage VPGMHL in the operation corresponding to step S2006 in FIG. 21 (i.e. step S2306 in FIG. 28).

If the sequencer 170 determines that the second program loop number is equal to or less than the fifth value, or that the second erase loop number is equal to or more than the seventh value (i.e. step S2305, Yes), the sequencer 170 sets the signal VRDEC at the time of the program to the voltage VPGMHH in the operation corresponding to step S2007 in FIG. 21 (i.e. step S2307 in FIG. 28).

The order of the execution of steps S2302 to S2304 and the execution of steps S2305 to S2307 may be changed. In the description below, in other operations including the steps S2202 to S2204 and the steps S2205 to S2207, the order of the execution of steps S2202 to S2204 and the execution of steps S2205 to S2207 may similarly be changed.

In step S2302, the sequencer 170 may determine whether the first program loop number is equal to or less than the fourth value, and further, the first erase loop number is equal to or more than the sixth value.

In this case, if the sequencer 170 determines that the first program loop number is not equal to or less than the fourth value, or that the first erase loop number is not equal to or more than the sixth value (i.e. step S2302, No), the sequencer 170 sets, in step S2303, the signals VBST at the time of the program to the voltage VPGMHL. Further, if the sequencer 170 determines that the first program loop number is equal to or less than the fourth value, and further that the first erase loop number is equal to or more than the sixth value (i.e. step S2302, Yes), the sequencer 170 sets, in step S2304, the signals VBST at the time of the program operation to the voltage VPGMHH.

In step S2305, the sequencer 170 may determine whether the second program loop number is equal to or less than the fifth value, and further, the second erase loop number is equal to or more than the seventh value.

In this case, if the sequencer 170 determines that the second program loop number is not equal to or less than the fifth value, or that the second erase loop number is not equal to or more than the seventh value (i.e. step S2305, No), the sequencer 170 sets, in step S2306, the signal VRDEC at the time of the program to the voltage VPGMHL. Further, if the sequencer 170 determines that the second program loop number is equal to or less than the fifth value, and also that the second erase loop number is equal to or more than the seventh value (i.e. step S2305, Yes), the sequencer 170 sets, in step S2307, the signal VRDEC at the time of the program to the voltage VPGMHH.

<2-7> Modification Example 4 of the Second Embodiment

Figure 30:
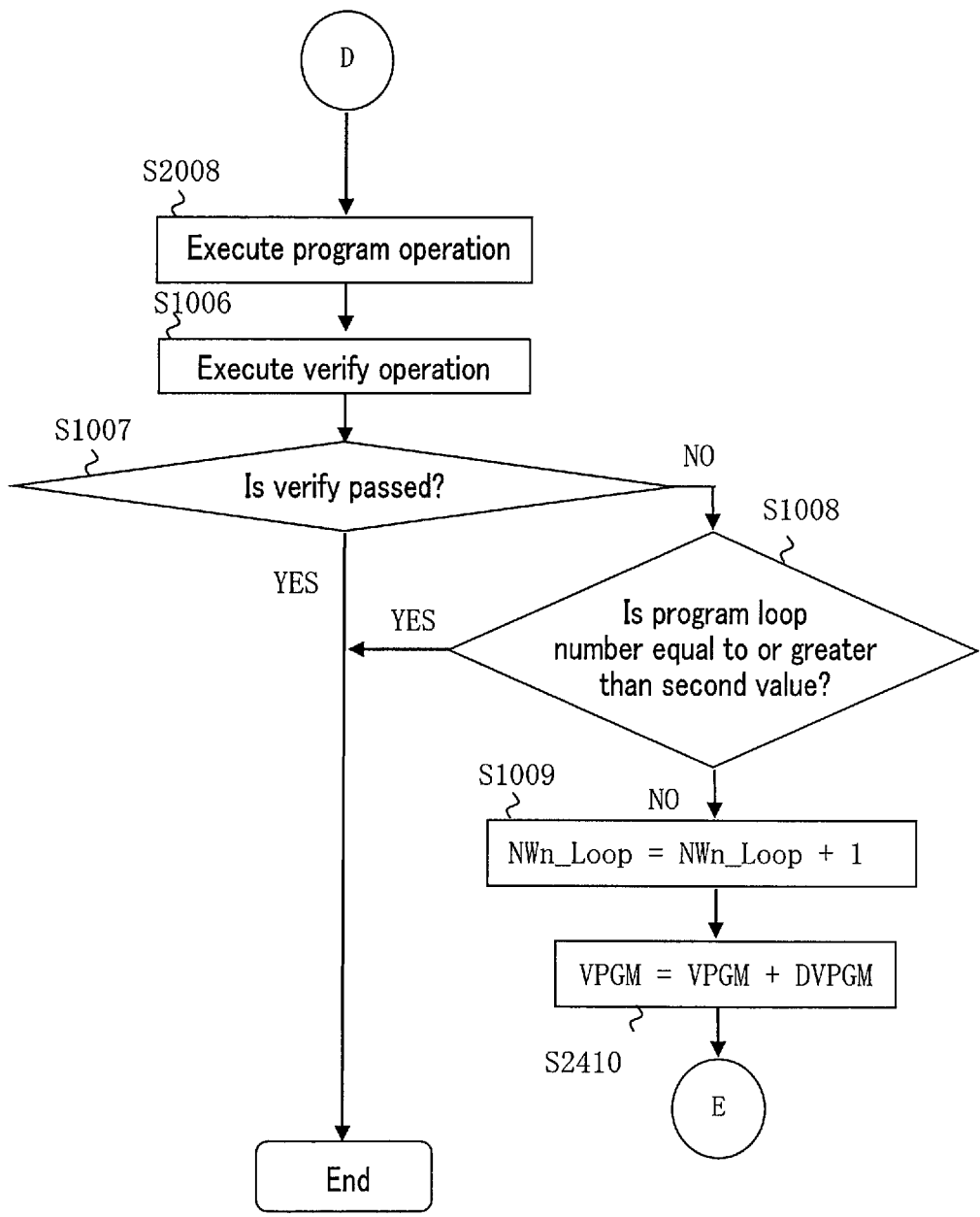
FIG. 30 is a flowchart of the write operation (S2400) of the memory system according to Modification Example 4 of the second embodiment.

Referring to FIG. 29 and FIG. 30, an operation S2400 of Modification Example 4 of the second embodiment will be described.

The operations S2400 differ from the operations of FIG. 28 with respect to the operations after step S1010 in FIG. 28.

Specifically, after step S1010 in FIG. 28 (i.e. step S2410 in FIG. 30), the sequencer 170 executes not the step S2008 in FIG. 28, but the step S2302 in FIG. 28 (i.e. step S2402 in FIG. 29).

The step S2402 in FIG. 29 is similar to step S2302 in FIG. 28, and the step S2410 in FIG. 30 is similar to step S1010 in FIG. 28.

In step S2402, like step S2302, the sequencer 170 may determine whether the first program loop number is equal to or less than the fourth value, and further, the first erase loop number is equal to or more than the sixth value.

<2-8> Modification Example 5 of the Second Embodiment

Figure 31:
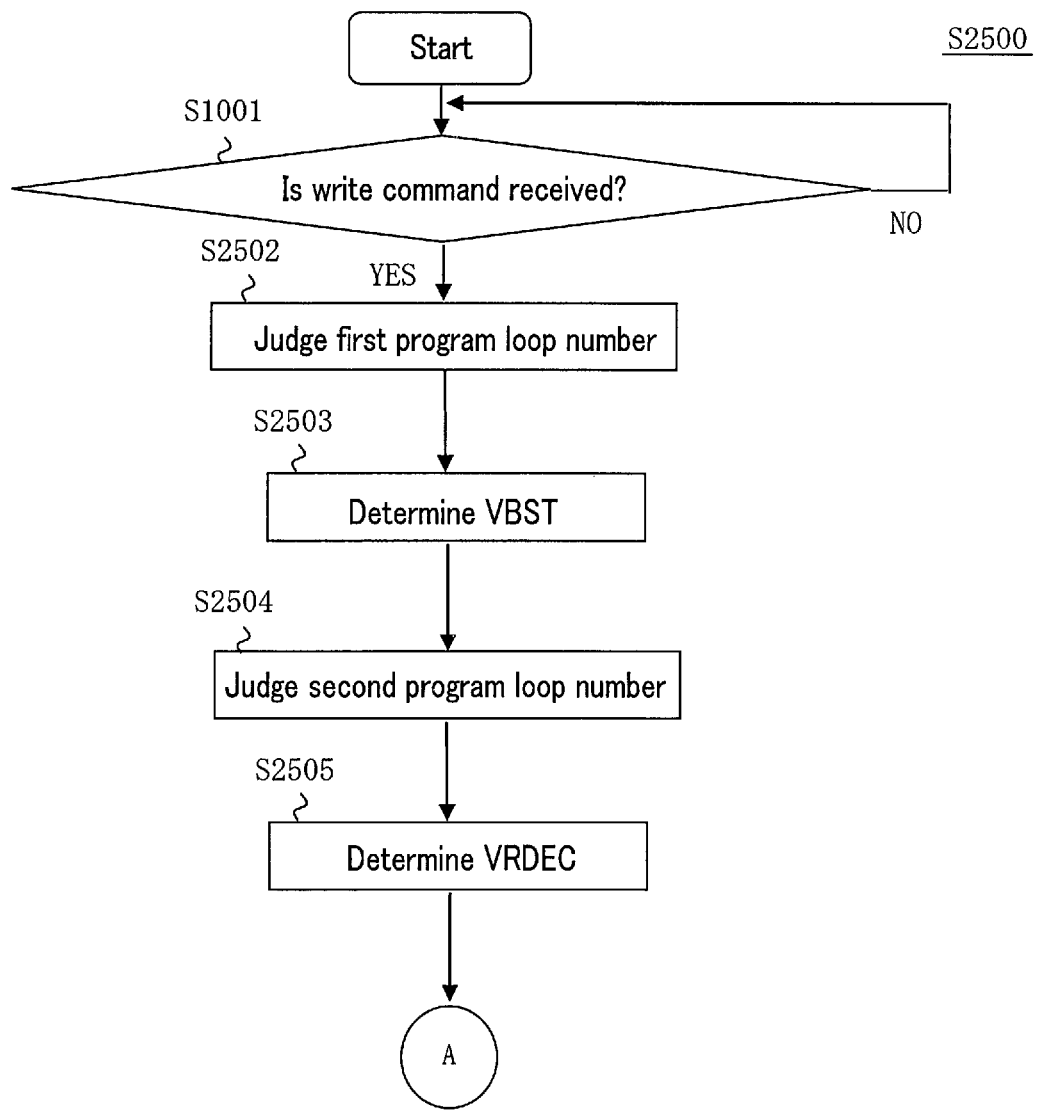
FIG. 31 is a flowchart of a write operation (S2500) of a memory system according to Modification Example 5 of the second embodiment.

Referring to FIG. 31, a description will be given of operations in a case of generating three kinds of voltages as voltages for conducting or transferring the voltage VPGM.

[S2502]

If the sequencer 170 determines that the write command is received from the memory controller 200 (i.e. step S1001, Yes), the sequencer 170 determines which of a plurality of ranges (e.g. three ranges in this example) the first program loop number stored in the status register 180 belongs to.

For an example, three ranges, namely a seventh range, an eighth range and a ninth range, are provided. In addition, when the first program loop number is equal to or less than a value E, the sequencer 170 determines that the first program loop number is in the seventh range. When the first program loop number is greater than value E and is equal to or less than a value F, the sequencer 170 determines that the first program loop number is in the eighth range. When the first program loop number is greater than the value F, the sequencer 170 determines that the first program loop number is in the ninth range. The value E and value F may be preset, or may be arbitrarily set by a user.

[S2503]

Upon determination of which of the ranges the first program loop number belongs to, the sequencer 170 determines the voltages of the signal VBST at the time of the program.

Specifically, if the sequencer 170 determines that the first program loop number belongs to the ninth range, the sequencer 170 sets the signal VBST to a voltage VPGMH9 (VPGM<VPGMH9). If the sequencer 170 determines that the first program loop number belongs to the eighth range, the sequencer 170 sets the signal VBST to a voltage VPGMH8 (VPGMH9<VPGMH8). If the sequencer 170 determines that the first program loop number belongs to the seventh range, the sequencer 170 sets the signal VBST to a voltage VPGMH7 (VPGMH8<VPGMH7).

Although the method of generating the three kinds of voltages as the voltages of the signal VBST for conducting or transferring the voltage VPGM is described herein for simplicity, four or more kinds of voltages may be generated similarly.

[S2504]

The sequencer 170 determines which of a plurality of ranges (e.g. three ranges in this example) the second program loop number stored in the status register 180 belongs to.

For an example, three ranges, namely a tenth range, an eleventh range and a twelfth range, are provided. When the second program loop number is equal to or less than a value G, the sequencer 170 determines that the second program loop number is in the tenth range. When the second program loop number is greater than value G and is equal to or less than a value H, the sequencer 170 determines that the second program loop number is in the eleventh range. When the second program loop number is greater than the value H, the sequencer 170 determines that the second program loop number is in the twelfth range. The value G and value H may be preset, or may be arbitrarily set by a user.

[S2505]

Upon determination of which of the ranges the second program loop number belongs to, the sequencer 170 determines the voltages of the signal VRDEC at the time of the program.

Specifically, if the sequencer 170 determines that the second program loop number belongs to the twelfth range, the sequencer 170 sets the signal VRDEC to a voltage VPGMH12 (VPGM<VPGMH12). If the sequencer 170 determines that the second program loop number belongs to the eleventh range, the sequencer 170 sets the signal VRDEC to a voltage VPGMH11 (VPGMH12<VPGMH11).

If the sequencer 170 determines that the second program loop number belongs to the tenth range, the sequencer 170 sets the signal VRDEC to a voltage VPGMH10 (VPGMH11<VPGMH10).

Although the method of generating the three kinds of voltages as the voltages of the signal VRDEC for conducting or transferring the voltage VPGM is described herein for simplicity, four or more kinds of voltages may be generated similarly.

The above-described step S2502 may be replaced with step S2102 in FIG. 25. In addition, the step S2503 may be replaced with step S2003 and step S2004 in FIG. 25. The above-described step S2504 may be replaced with step S2005 in FIG. 25. In addition, the step S2505 may be replaced with step S2006 and step S2007 in FIG. 25.

<2-9> Modification Example 6 of the Second Embodiment

Referring to FIG. 32, a description will be given of operations in a case of generating three kinds of voltages as voltages for conducting or transferring the voltage VPGM, based on the erase loop number.

[S2602]

If the sequencer 170 determines that the write command is received from the memory controller 200 (i.e. step S1001, Yes), the sequencer 170 determines which of a plurality of ranges (e.g. three ranges in this example) the first erase loop number stored in the status register 180 belongs to.

For an example, three ranges, namely a 13th range, a 14th range and a 15th range, are provided. When the first erase loop number is equal to or less than a value I, the sequencer 170 determines that the first erase loop number is in the 13th range. When the first erase loop number is more than value I and is equal to or less than a value J, the sequencer 170 determines that the first erase loop number is in the 14th range. When the first erase loop number is more than the value J, the sequencer 170 determines that the first erase loop number is in the 15th range. The value I and value J may be preset, or may be arbitrarily set by a user.

[S2603]

Upon determination of which of the ranges the first erase loop number belongs to, the sequencer 170 determines the voltages of the signal VBST at the time of the program.

Specifically, if the sequencer 170 determines that the first erase loop number belongs to the 13th range, the sequencer 170 sets the signal VBST to a voltage VPGMH13 (VPGM<VPGMH13). If the sequencer 170 determines that the first erase loop number belongs to the 14th range, the sequencer 170 sets the signal VBST to a voltage VPGMH14 (VPGMH13<VPGMH14). If the sequencer 170 determines that the first erase loop number belongs to the 15th range, the sequencer 170 sets the signal VBST to a voltage VPGMH15 (VPGMH14<VPGMH15).

Although the method of generating the three kinds of voltages as the voltages of the VBST at the time of conducting or transferring the voltage VPGM is described herein for simplicity, four or more kinds of voltages may be generated similarly.

[S2604]

The sequencer 170 determines which of a plurality of ranges (e.g. three ranges in this example) the second erase loop number stored in the status register 180 belongs to.

For an example, three ranges, namely a 16th range, a 17th range and an 18th range, are provided. When the second erase loop number is equal to or less than a value K, the sequencer 170 determines that the second erase loop number is in the 16th range. When the second erase loop number is more than value K and is equal to or less than a value L, the sequencer 170 determines that the second erase loop number is in the 17th range. When the second erase loop number is more than the value L, the sequencer 170 determines that the second erase loop number is in the 18th range. The value K and value L may be preset, or may be arbitrarily set by a user.

[S2605]

Upon determination of which of the ranges the second erase loop number belongs to, the sequencer 170 determines the voltages of the signal VRDEC at the time of the program.

Specifically, if the sequencer 170 determines that the second erase loop number belongs to the 16th range, the sequencer 170 sets the signal VRDEC to a voltage VPGMH16 (VPGM<VPGMH16). If the sequencer 170 determines that the second erase loop number belongs to the 17th range, the sequencer 170 sets the signal VRDEC to a voltage VPGMH17 (VPGMH16<VPGMH17). If the sequencer 170 determines that the second erase loop number belongs to the 18th range, the sequencer 170 sets the signal VRDEC to a voltage VPGMH18 (VPGMH17<VPGMH18).

Although the method of generating the three kinds of voltages as the voltages of the VRDEC at the time of conducting or transferring the voltage VPGM is described herein for simplicity, four or more kinds of voltages may be generated similarly.

<3> Third Embodiment

A third embodiment will be described. In the third embodiment, a description is given of a case in which the memory controller controls the signal VBST and the signal VRDEC. The typical configuration and the typical operation of the memory device according to the third embodiment are similar to those of the memory devices according to the above-described first embodiment and second embodiment. Accordingly, descriptions are omitted of the matters described in the first embodiment and second embodiment, and matters which are easily guessed from the first embodiment and second embodiment.

<3-1> Operation

Flowcharts of a write operation (S3000, S3100) according to the third embodiment will be described. To begin with, referring to FIG. 33, the operations (S3000) of the memory controller 200 are described. Here, for simplicity, it is assumed that the main entity, which executes the operation, is a processor 230, but not limited to it.

[S3001]

The processor 230 determines whether to execute a write operation.

[S3002]

If the processor 230 determines that it executes the write operation (i.e. step S3001, Yes), the processor 230 determines whether a write/erase cycle number (WE cycle number) is equal to or more than an eighth value. The write/erase cycle number indicates the number of times of the write operations and erase operations executed. When a data write operation and a data erase operation are executed for the NAND flash memory 100, the write/erase cycle number is incremented. This write/erase cycle number is stored, for example, in the internal memory 220 or the like.

[S3003]

If the processor 230 determines that the write/erase cycle number is not equal to or more than the eighth value, the processor 230 sets the signals VBST and VRDEC to the voltage VPGMHL. Specifically, when the processor 230 issues a write command to the NAND flash memory 100, the processor 230 provides information "Set signals VBST and VRDEC to voltage VPGMHL" to the sequencer 170.

[S3004]

If the processor 230 determines that the write/erase cycle number is equal to or greater than the eighth value, the processor 230 sets the signals VBST and VRDEC to the voltage VPGMHH. Specifically, when the processor 230 issues a write command to the NAND flash memory 100, the processor 230 provides information "Set signals VBST and VRDEC to voltage VPGMHH" to the sequencer 170.

[S3005]

The processor 230 issues to the NAND flash memory 100 a write command sequence including the information obtained by the step S3003 or S3004.

Figure 34:
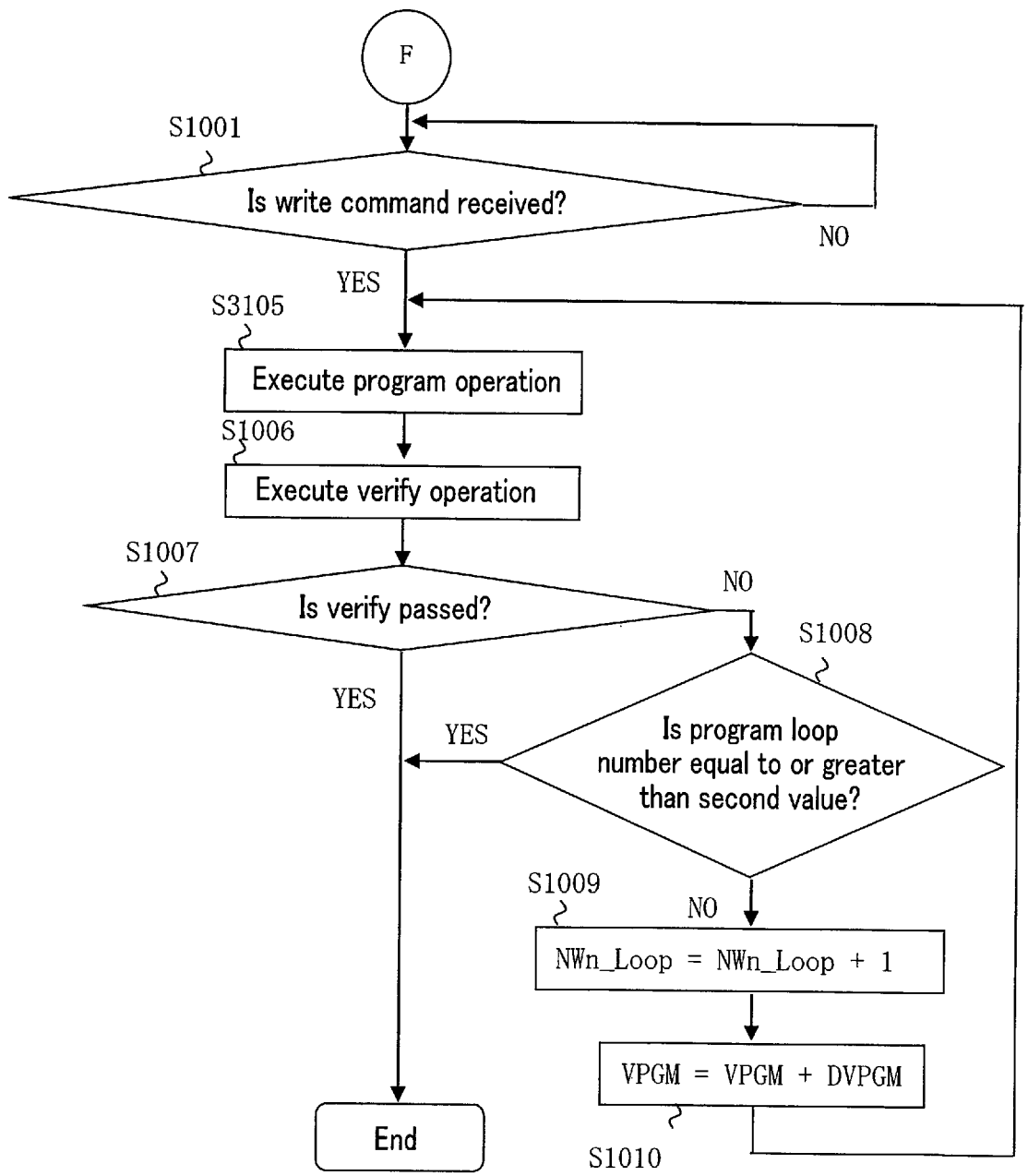
FIG. 34 is a flowchart of a write operation (S3100) of the memory system according to the third embodiment.

Next, referring to FIG. 34, the operations S3100 of the NAND flash memory 100 will be described.

[S1001]

The sequencer 170 executes an operation similar to the above-described step S1001.

[S3105]

The sequencer 170 executes the program based on the settings determined by the processor 230.

[S1006]~[S1010]

The sequencer 170 executes operations similar to the above-described steps S1006 to S1010.

<3-2> Command Sequence

Figure 35:
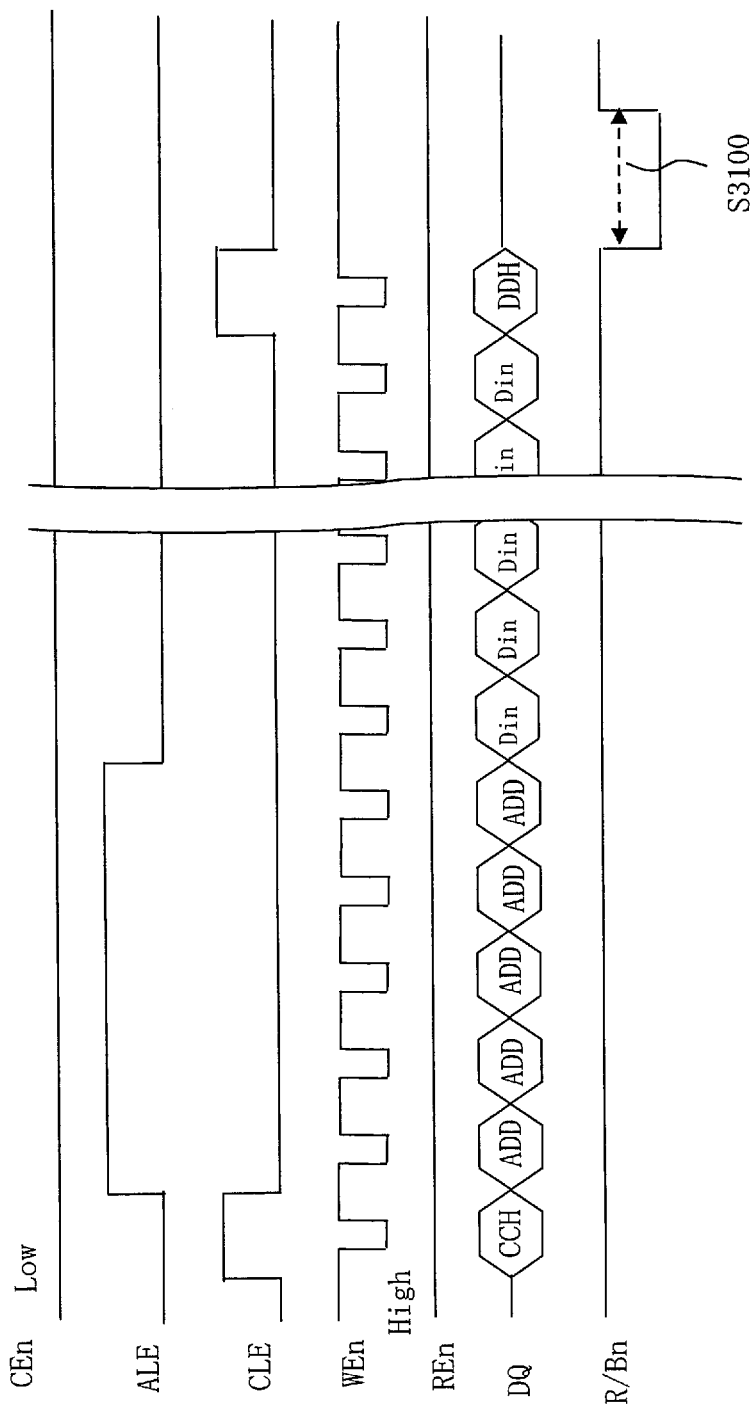
FIG. 35 illustrates a command sequence at time of a write operation in the memory system according to the third embodiment.

Referring to FIG. 35, the command sequence at the time of the write operation will be described. As illustrated in FIG. 35, the memory controller 200 issues a write command CCH, and asserts the signal CLE ("H" level). For example, the write command CCH includes the information relating to the signals VBST and VRDEC determined in steps S3002 to S3004. Needless to say, it should suffice if the NAND flash memory 100 is notified of the information relating to the signals VBST and VRDEC determined in steps S3002 to S3004, and this information may be issued at a different timing from the write command CCH.

The subsequent command sequence is similar to the sequence described with reference to FIG. 10. A command DDH in FIG. 35 corresponds to the command BBH in FIG. 10.

<3-3> Advantageous Effects

According to the above-described embodiment, the sequencer 170 varies the voltages of the signals VBST and VRDEC in accordance with the write/erase cycle number. Thereby, it may cause the transfer transistors to properly conduct or transfer voltages.

As described above, there is a tendency that the degradation of the transfer transistor progresses as the number of times of write (or the number of times of erase) in the memory cell transistor becomes larger. Thus, in the present embodiment, by determining whether the write/erase cycle number is a certain value or more, the sequencer 170 determines the frequency of use of the transfer transistor, that is, the degree of degradation of the transfer transistor.

<3-4> Modification Example 1 of the Third Embodiment

In Modification Example 1 of the third embodiment, a description will be given of a case in which the signal VBST and the signal VRDEC are independently controlled.

Referring to FIG. 36, an operation S3200 of the processor 230 of Modification Example 1 of the third embodiment is described.

[S3001]

The processor 230 determines whether it executes a write operation or not.

[S3202]

If the processor 230 determines to execute the write operation (i.e. step S3001, Yes), the processor 230 determines whether a first write/erase (WE) cycle number is equal to or more than a ninth value. In the third embodiment, the write/erase cycle number associated with each of the blocks BLK is stored in the internal memory 220. Each write/erase cycle number is associated with the block address and stored in the internal memory 220, for example. The first write/erase cycle number is a least write/erase cycle number among a plurality of write/erase cycle numbers stored in the internal memory 220. The ninth value may be preset, or may be arbitrarily set by a user.

[S3203]

If the processor 230 determines that the first write/erase cycle number is not equal to or more than the ninth value, the processor 230 sets the signal VBST to the voltage VPGMHL. Specifically, when the processor 230 issues the write command to the NAND flash memory 100, the processor 230 provides the information "Set signal VBST to voltage VPGMHL" to the sequencer 170.

[S3204]

If the processor 230 determines that the first write/erase cycle number is equal to or more than the ninth value, the processor 230 sets the signal VBST to the voltage VPGMHH. Specifically, when the processor 230 issues the write command to the NAND flash memory 100, the processor 230 provides the information "Set signal VBST to voltage VPGMHH" to the sequencer 170.

[S3205]

The processor 230 determines whether a second write/erase (WE) cycle number is equal to or more than a tenth value. For example, the second write/erase cycle number is a write/erase cycle number associated with the same block address as the block address corresponding to the write command which is sent to the NAND flash memory 100. The tenth value may be preset, or may be arbitrarily set by a user.

[S3206]

If the processor 230 determines that the second write/erase cycle number is not equal to or more than the tenth value, the processor 230 sets the signal VRDEC to the voltage VPGMHL. Specifically, when the processor 230 issues the write command to the NAND flash memory 100, the processor 230 provides the information "Set signal VRDEC to voltage VPGMHL" to the sequencer 170.

[S3207]

If the processor 230 determines that the second write/erase cycle number is equal to or more than the tenth value, the processor 230 sets the signal VRDEC to the voltage VPGMHH. Specifically, when the processor 230 issues the write command to the NAND flash memory 100, the processor 230 provides the information "Set signal VRDEC to voltage VPGMHH" to the sequencer 170.

Subsequently, the processor 230 executes step S3005.

Thereby, the advantageous effects similar to those of the second embodiment are obtained.

The order of the execution of steps S3202 to S3204 and the execution of steps S3205 to S3207 may be changed.

<3-5> Modification Example 2 of the Third Embodiment

Figure 37:
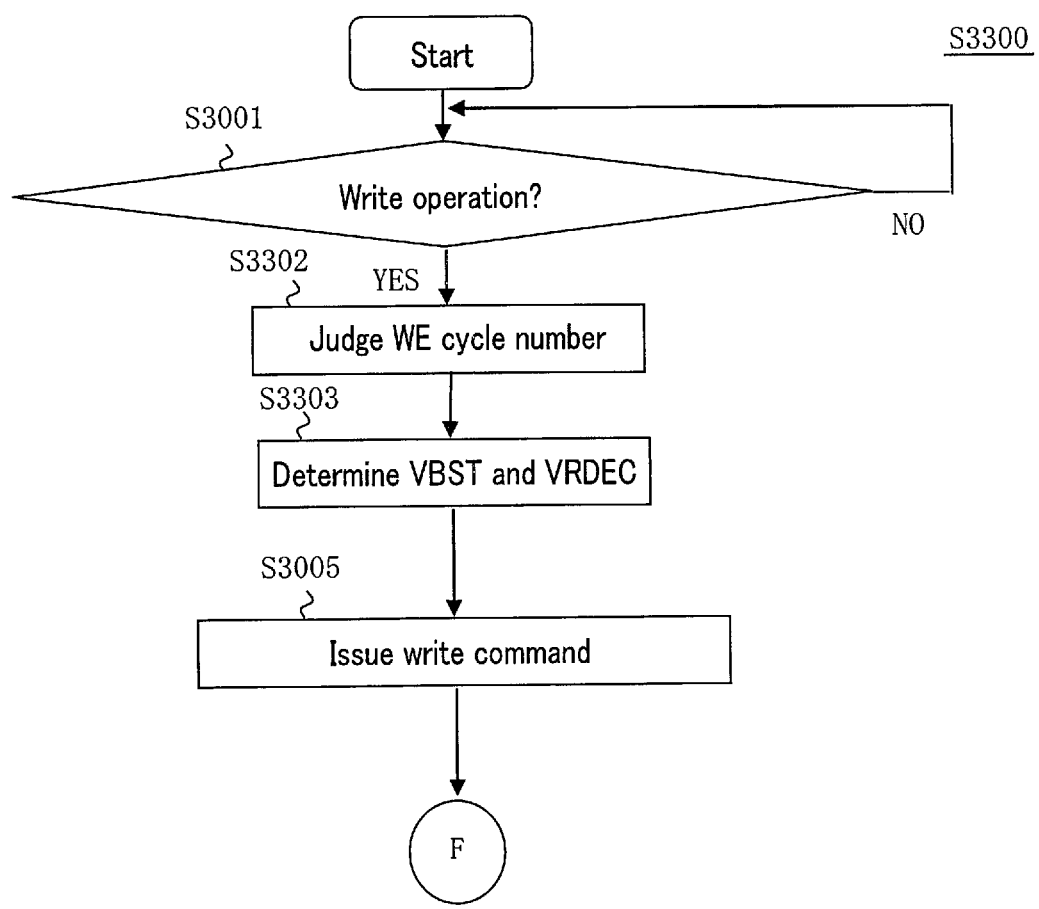
FIG. 37 is a flowchart of a write operation (S3300) of a memory system according to Modification Example 2 of the third embodiment.

Referring to FIG. 37, a description will be given of operations (S3300) in a case of generating three kinds of voltages as voltages for conducting or transferring the voltage VPGM.

[S3302]

If the processor 230 determines to execute the write operation (i.e. step S3001, Yes), the processor 230 determines which of a plurality of ranges (e.g. three ranges in this example) the write/erase (WE) cycle number stored in the internal memory 220 belongs to.

For an example, three ranges, namely a 19th range, a 20th range and a 21st range, are provided. In addition, when the write/erase cycle number is equal to or less than a value M, the sequencer 230 determines that the write/erase cycle number is in the 19th range. When the write/erase cycle number is more than the value M and is equal to or less than a value N, the processor 230 determines that the write/erase cycle number is in the 20th range. When the write/erase cycle number is more than the value N, the processor 230 determines that the write/erase cycle number is in the 21st range. The value M and value N may be preset, or may be arbitrarily set by a user.

[S3303]

Upon determination of which of the ranges the write/erase cycle number belongs to, the processor 230 determines the voltages of the signals VBST and VRDEC at the time of the program.

Specifically, if the processor 230 determines that the write/erase cycle number belongs to the 19th range, the processor 230 sets the signals VBST and VRDEC to a voltage VPGMH19 (VPGM<VPGMH19). If the processor 230 determines that the write/erase cycle number belongs to the 20th range, the processor 230 sets the signals VBST and VRDEC to a voltage VPGMH20 (VPGMH19<VPGMH20). If the processor 230 determines that the write/erase cycle number belongs to the 21st range, the processor 230 sets the signals VBST and VRDEC to a voltage VPGMH21 (VPGMH20<VPGMH21).

In this manner, the configuration may generate the three kinds of voltages as the voltages for conducting or transferring the voltage VPGM.

Although the method of generating the three kinds of voltages as the voltages for conducting or transferring the voltage VPGM is described herein for simplicity, four or more kinds of voltages may be generated similarly.

<3-6> Modification Example 3 of the Third Embodiment

Referring to FIG. 38, a description will be given of operations (S3400) in a case of generating three kinds of voltages as voltages for conducting or transferring the voltage VPGM.

[S3402]

If the processor 230 determines to execute the write operation (i.e. step S3001, Yes), the processor 230 determines which of a plurality of ranges (e.g. three ranges in this example) a first write/erase (WE) cycle number stored in the internal memory 220 belongs to.

For an example, three ranges, namely a 22nd range, a 23rd range and a 24th range, are provided. When the first write/erase cycle number is equal to or less than a value O, the sequencer 230 determines that the first write/erase cycle number is in the 22nd range. When the first write/erase cycle number is more than the value O and is equal to or less than a value P, the processor 230 determines that the first write/erase cycle number is in the 23rd range. When the first write/erase cycle number is more than the value P, the processor 230 determines that the first write/erase cycle number is in the 24th range. The value O and the value P may be preset, or may be arbitrarily set by a user.

[S3403]

Upon determination of which of the ranges the first write/erase cycle number belongs to, the processor 230 determines the voltages of the signal VBST at the time of the program.

Specifically, if the processor 230 determines that the first write/erase cycle number belongs to the 22nd range, the processor 230 sets the signal VBST to a voltage VPGMH22 (VPGM<VPGMH22). If the processor 230 determines that the first write/erase cycle number belongs to the 23rd range, the processor 230 sets the signal VBST to a voltage VPGMH23 (VPGMH22<VPGMH23). If the processor 230 determines that the first write/erase cycle number belongs to the 24th range, the processor 230 sets the signal VBST to a voltage VPGMH24 (VPGMH23<VPGMH24).

In this manner, the configuration may generate the three kinds of voltages as the voltages for conducting or transferring the voltage VPGM.

Although the method of generating the three kinds of voltages as the voltages for conducting or transferring the voltage VPGM is described herein for simplicity, four or more kinds of voltages may be generated similarly.

[S3404]

The processor 230 determines which of a plurality of ranges (e.g. three ranges in this example) a second write/erase (WE) cycle number stored in the internal memory 220 belongs to.

For an example, three ranges, namely a 25th range, a 26th range and a 27th range, are provided. When the second write/erase cycle number is equal to or less than a value Q, the sequencer 230 determines that the second write/erase cycle number is in the 25th range. When the second write/erase cycle number is more than the value Q and is equal to or less than a value R, the processor 230 determines that the second write/erase cycle number is in the 26th range. When the second write/erase cycle number is more than the value R, the processor 230 determines that the second write/erase cycle number is in the 27th range. The value Q and the value R may be preset, or may be arbitrarily set by a user.

[S3405]

Upon determination of which of the ranges the second write/erase cycle number belongs to, the processor 230 determines the voltages of the signal VRDEC at the time of the program.

Specifically, if the processor 230 determines that the second write/erase cycle number belongs to the 25th range, the processor 230 sets the signal VRDEC to a voltage VPGMH25 (VPGM<VPGMH25). If the processor 230 determines that the second write/erase cycle number belongs to the 26th range, the processor 230 sets the signal VRDEC to a voltage VPGMH26 (VPGMH25<VPGMH26). If the processor 230 determines that the second write/erase cycle number belongs to the 27th range, the processor 230 sets the signal VRDEC to a voltage VPGMH27 (VPGMH26<VPGMH27).

In this manner, the configuration generates the three kinds of voltages as the voltages for conducting or transferring the voltage VPGM.

Although the method of generating the three kinds of voltages as the voltages for conducting or transferring the voltage VPGM is described herein for simplicity, four or more kinds of voltages may be generated similarly.

<4> Fourth Embodiment

A fourth embodiment will be described. In the fourth embodiment, a case of an erase operation is described. The typical configuration and typical operation of the memory device according to the fourth embodiment are similar to those of the memory device according to the above-described first embodiment. Accordingly, descriptions are omitted of the matters described in the first embodiment, and matters which are easily guessed from the first embodiment.

<4-1> Configuration

<4-1-1> Driver Circuit

The driver circuit 130 according to the fourth embodiment includes the CG driver 131, the SGS driver 132, the SGD driver 133, the TSF driver 134, a TSFE driver 135, and a WELL driver 136. The TSFE driver 135 controls the WELL driver 136. The WELL driver 136 supplies a voltage to the well interconnect CPWELL.

Next, referring to FIG. 39, the TSFE driver 135 and WELL driver 136 will be described.

The TSFE driver 135 includes a fifth driver 1350. Based on a control signal from the sequencer 170, the fifth driver 1350 supplies a voltage VERAHL or VERAHH (VERAHL<VERAHH) as a signal VBSTE to the WELL driver 136.

The WELL driver 136 includes a high breakdown voltage n-channel MOS transistor 1360, and a second level shifter 1361. The second level shifter 1361 supplies the signal VBSTE, which is received from the TSFE driver 135, to the transistor 1360. The transistor 1360 conducts or transfers a voltage VERA to the well interconnect CPWELL. One end of the transistor 1360 is connected to the well interconnect CPWELL. The voltage VERA is applied to the other end of the transistor 1360, and the signal VBSTE is supplied to the gate of the transistor 1360. In FIG. 39, for simplicity, only the transistor 1360 for conducting or transferring the voltage VERA is illustrated. However, the configuration is not limited to it, and high breakdown voltage n-channel MOS transistors for applying various kinds of voltages to the well interconnect CPWELL may be provided. The high breakdown voltage n-channel MOS transistor 1360 is also referred to as "transfer transistor."

In this example, for simplicity, one transistor 1360 is connected to one well interconnect CPWELL. However, a plurality of transistors 1360 may be connected in series to the one well interconnect CPWELL.

<4-1-2> Fifth Driver

Next, referring to FIG. 40, the fifth driver 1350 will be described.

The fifth driver 1350 includes high breakdown voltage n-channel MOS transistors 1350-0, and 1350-1. The voltage VERA is supplied to one end of the transistor 1350-0 via a node N4. The other end and gate of the transistor 1350-0 are connected to a node N5. The voltage VERAH is supplied to the other end and gate of the transistor 1350-0 via a node N5. The transistor 1340-0 operates as a diode transistor. One end of the transistor 1350-1 is connected to the node N4, and the other end of the transistor 1350-1 is connected to the node N5. A signal VEH is supplied to a gate of the transistor 1350-1.

The signal VEH is supplied by the sequencer 170.

In a case of generating the voltage VERAHL, the sequencer 170 sets the signal VEH at "H" level. More specifically, the sequencer 170 sets the voltage of the signal VEH and the voltage of the Node N5 the same. Thus, the transistor 1350-1 operates as a diode transistor. Thereby, the driver 1350 supplies the voltage VERAHL to the node N5.

In a case of generating the voltage VERAHH, the sequencer 170 sets the signal VEH at "H" level. For example, the sequencer 170 sets the voltage of the signal VEH at 0V. Thus the transistor 1350-1 is turned off. In the case of generation of the voltage VERAHH, the number of the transistors which are turned on is smaller than that in the case of generation of the voltage VERAHL. Thereby, in the case of generation of the voltage VERAHH, the potential difference of the node N4 and the node N5 of the first driver 1350 is larger than that in the case of generation of the voltage VERAHL. Thereby, the driver 1350 supplies the voltage VERAHH to the node N5.

Although the case in which the fifth driver 1350 includes the two transistors 1350-0, and 1350-1 is described herein for simplicity, the configuration is not limited to it. So long as the fifth driver 1350 is capable of selectively generating the voltage VERAHL and the voltage VERAHH, the fifth driver 1350 may have any circuit configuration.

How the sequencer 170 selects the voltage VERAHL or the voltage VERAHH will be described later.

<4-2> Operation

<4-2-1> Flowchart

Figure 41:
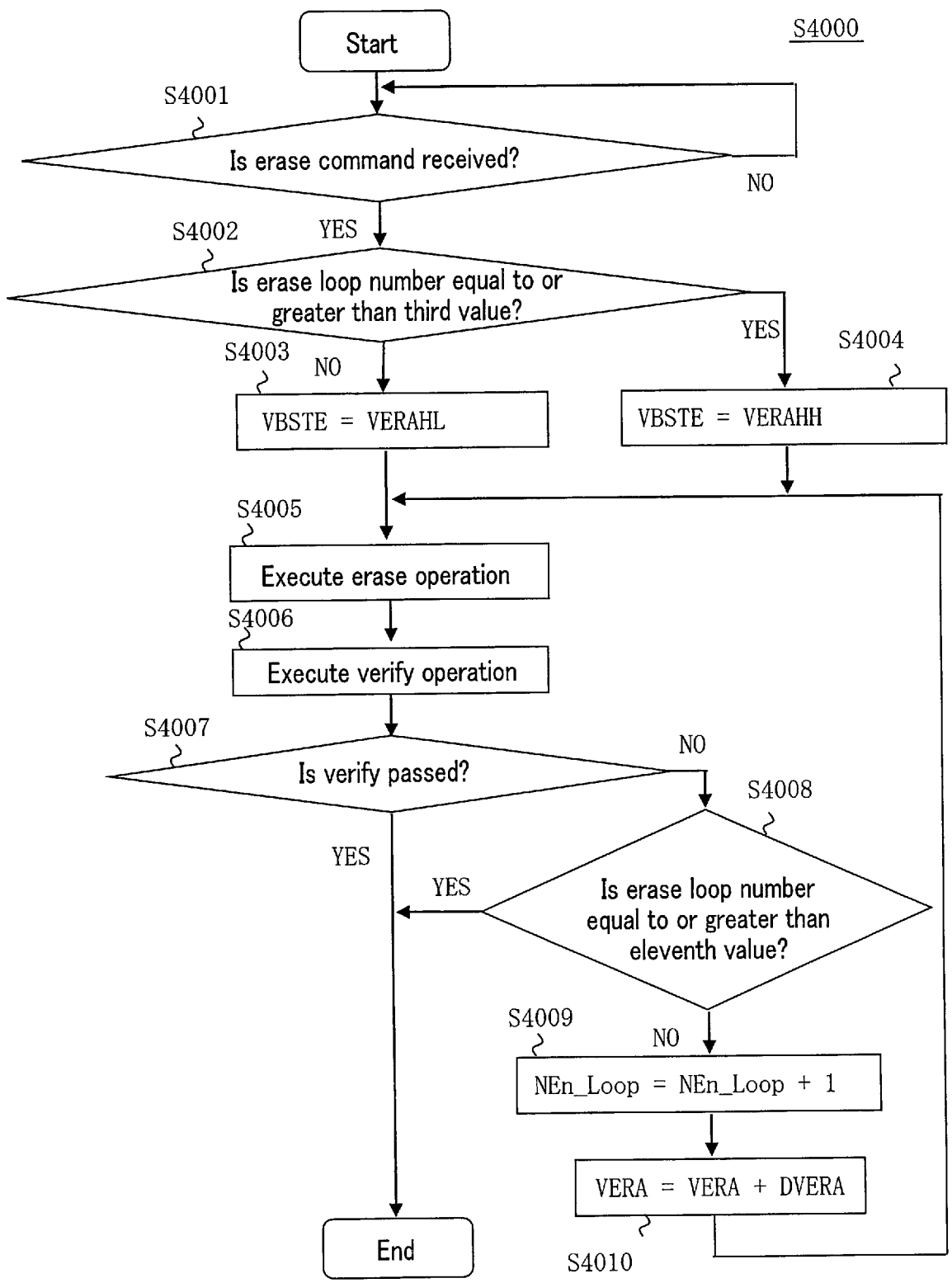
FIG. 41 is a flowchart of a data erase operation (S4000) of the memory system according to the fourth embodiment.

Referring to FIG. 41, a description is given of a flowchart of a data erase operation (S4000).

The data erase operation includes an erase and an erase verify.

[S4001]

The sequencer 170 determines whether an erase command is received from the memory controller 200.

[S4002]

If the sequencer 170 determines that the erase command is received from the memory controller 200 (i.e. step S4001, Yes), the sequencer 170 determines whether an erase loop number, which is stored in the status register 180, is equal to or more than a third value. The erase loop number will be described later.

[S4003]

If the sequencer 170 determines that the erase loop number is not equal to or more than the third value (i.e. step S4002, No), the sequencer 170 sets the signal VBSTE at the time of the erase to the voltage VERAHL. Specifically, at the time of the erase, the sequencer 170 sets the signal VEH at "H" level, sets the signal VEHL at "H" level, and sets the signal VEHH at "L" level.

[S4004]

If the sequencer 170 determines that the erase loop number is equal to or more than the third value (i.e. step S4002, Yes), the sequencer 170 sets the signal VBSTE at the time of the erase to the voltage VERAHH. Specifically, at the time of the erase, the sequencer 170 sets the signal VEH at "H" level, sets the signal VEHL at "L" level, and sets the signal VEHH at "H" level.

[S4005]

The sequencer 170 executes the erase.

Referring to FIG. 42, typical operational waveforms of the erase will be described.

[Time T20]~[Time T21]

Based on a signal from the sequencer 170, the driver 135 raises the signal VBSTE to the voltage VERAHL (VSS<VERAHL) or voltage VERAHH (VERAHL<VERAHH). The voltage VERAHL or the voltage VERAHH is a voltage which sets the transistor 1360 in the ON state.

[Time T21]~[Time T22]

At time T21, the driver 136 applies the voltage VERA (VSS<VERA<VERAHL) to the well interconnect CPWELL.

In addition, at time T21, the row decoder 120 selects a block BLK in accordance with a block address BA which is provided by the address register 150. Besides, the row decoder 120 applies a voltage VERAG (VSS<VERAG<VERA) to a selected select gate line SGS_SEL.

Furthermore, at time T21, the row decoder 120 applies a voltage VE (VSS<VE<VERAG) to a selected word line WL_SEL.

[Time T23]~[Time T24]

From time T23 to time T24 after data is erased in the period from time T22 to time T23, the row decoder 120 lowers the voltages of the selected word line WL_SEL and the selected select gate line SGS_SEL to the voltage VSS, and the driver 136 lowers the voltage of the well interconnect CPWELL to the voltage VSS. Thereby, the erase is finished.

[S4006]

As illustrated in FIG. 41, the sequencer 170 executes the erase verify, when the erase operation is finished. The description of the erase verify is omitted here, since the erase verify is similar to the above-described program verify.

[S4007]

As illustrated in FIG. 41, the sequencer 170 determines whether the result of the erase verify is "pass" or not. To be more specific, the sequencer 170 determines whether a fail bit number, which is determined by the erase verify, is equal to or more than a set value. If the fail bit number is less than the set value, the sequencer 170 determines that the result of the erase verify is "pass." This set value is, for example, the number of fail bits which cannot be recovered by the ECC circuit 260. This set value is stored, for example, in the status register 180. The sequencer 170 compares the set value stored in the status register 180 with the fail bit number. If the sequencer 170 determines that the result of the erase verify is "pass" (i.e. step S4007, Yes), the sequencer 170 terminates the data erase operation.

[S4008]

If the sequencer 170 determines that the result of the erase verify is not "pass" (i.e. step S4007, No), the sequencer 170 determines whether a repetition number (an erase loop number) of the erase is equal to or more than an eleventh value. This eleventh value is stored, for example, in the status register 180. Specifically, the sequencer 170 compares the eleventh value stored in the status register 180 with the erase loop number. If the sequencer 170 determines that the erase loop number is equal to or more than the eleventh value (i.e. step S4008, Yes), the sequencer 170 terminates the data erase operation.

[S4009]

If the sequencer 170 determines that the erase loop number is not equal to or more than the eleventh value (i.e. step S4008, No), the sequencer 170 counts up the erase loop number (NEn_Loop). For example, the erase loop number is stored in the status register 180 or the like. The count of the erase loop number may be executed by the sequencer 170, or may be executed by other configuration.

[S4010]

After counting up the erase loop number, the sequencer 170 increments the voltage VERA, which is used at the time of the erase, by a voltage DVERA. Then, the sequencer 170 repeats step S4005.

The order of the execution of step S4008 and the execution of step S4009 may be changed. In this case, the eleventh value in step S4008 increases by "1". In the description below, in other operations including step S4008 and step S4009, the order of the execution of step S4008 and the execution of step S4009 may similarly be changed.

<4-2-2> Command Sequence

Figure 43:
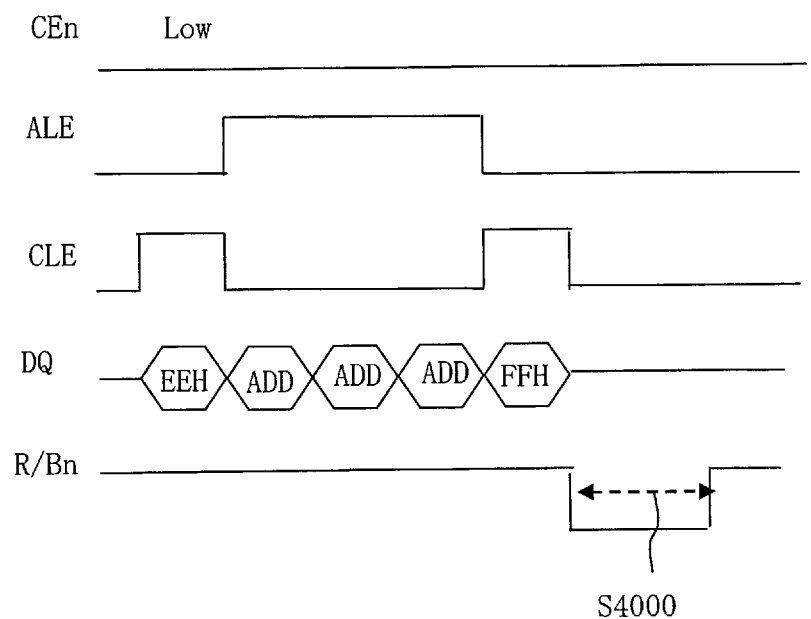
FIG. 43 illustrates a command sequence at time of a data erase operation in the memory system according to the fourth embodiment.

Referring to FIG. 43, a command sequence at the time of the data erase operation will be described. As illustrated in FIG. 43, the memory controller 200 first issues an erase command EEH, and asserts the signal CLE ("H" level). Subsequently, the memory controller 200 issues addresses (ADD: row address) over, for example, three cycles, and asserts the signal ALE ("H" level). The above-described command and addresses are stored, for example, in the command register 160 and the address register 150, respectively.

Next, the memory controller 200 issues a write command "FFH" and asserts the signal CLE. Responding to the storage of the command "FFH" in the command register 160, the sequencer 170 starts the data erase operation (S4000), and the NAND flash memory 100 enters the busy state (R/Bn="L").

<4-3> Advantageous Effects

According to the above-described embodiment, the sequencer 170 changes the control voltage to the transfer transistor which conducts or transfers a voltage to the well interconnect CPWELL in accordance with the erase loop number. Thereby, it causes the transfer transistor to properly conduct or transfer the voltage.

The advantageous effects of the above-described embodiment will be described. In the NAND flash memory 100 according to this embodiment, a desired voltage is applied to the well interconnect CPWELL via the transfer transistor.

As illustrated in FIG. 44, in order to conduct or transfer the voltage VERA, a voltage VERAH which is higher than the voltage VERA needs to be applied to the gate of the transfer transistor. However, since the threshold of the transfer transistor may rise due to various factors (e.g. degradation of the transfer transistor), the voltage VERA may not properly be transferred. Thus, it should be considered that the voltage VERAH is raised to a higher voltage VERAHH in advance. In this case, however, the load on the gate of the transfer transistor increases, and the degradation of the transfer transistor may be accelerated. As a result, since the threshold of the transfer transistor rises, the voltage VERA may not properly be conducted or transferred.

Thus, in the method as illustrated in FIG. 44, if the data erase operation is repeated, the proper voltage may not be conducted or transferred to the well interconnect CPWELL.

In the present embodiment, as illustrated in FIG. 45, before the transfer transistor gets degraded (i.e. in the state in which the threshold is low), the sequencer 170 applies the voltage VERAHL, which is lower than the voltage VERAHH, to the gate of the transfer transistor. After the transfer transistor gets degraded (i.e. in the state in which the threshold is high), the sequencer 170 applies the voltage VERAHH to the gate of the transfer transistor.

In the memory cell transistor, there is a tendency that the erase loop number becomes larger as the number of times of write (or the number of times of erase) becomes larger. Thus, in the present embodiment, by determining whether the erase loop number is equal to or more than a certain value, the sequencer 170 determines the frequency of use of the transfer transistor, that is, the degree of degradation of the transfer transistor.

Thereby, since an unnecessarily large voltage is not applied to the gate of the transfer transistor, the degradation of the transfer transistor is mitigated. As a result, even if the data erase operation is repeated, the sequencer 170 conducts or transfers a proper voltage to the well interconnect CPWELL.

<4-4> Modification Example 1 of the Fourth Embodiment

Figure 46:
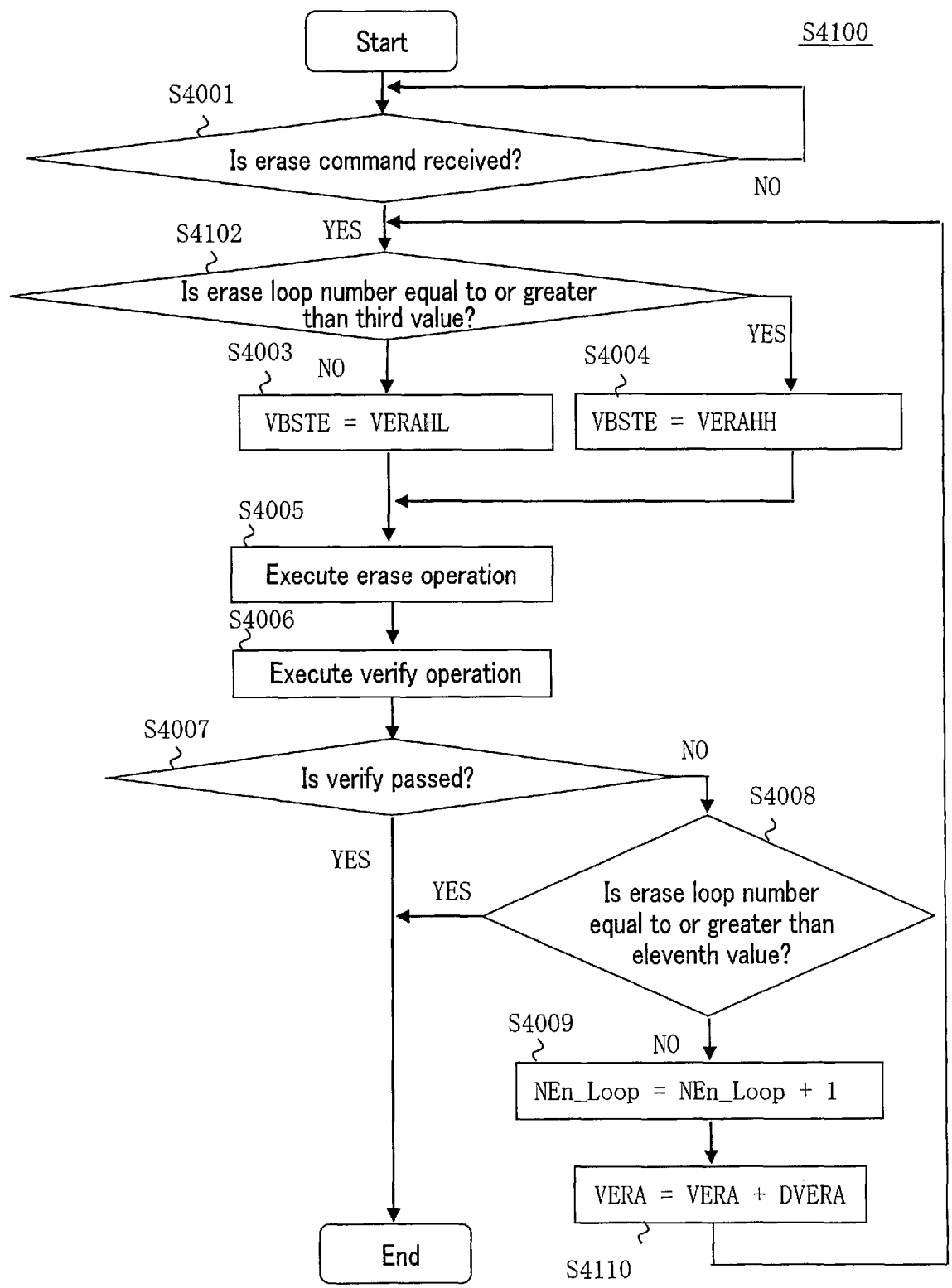
FIG. 46 is a flowchart of a data erase operation (S4100) of a memory system according to Modification Example 1 of the fourth embodiment.

Referring to FIG. 46, operations S4100 of Modification Example 1 of the fourth embodiment will be described.

The operations S4100 differ from the operations of FIG. 41 with respect to the operations after step S4010 in FIG. 41.

Specifically, after step S4010 in FIG. 41 (i.e. step S4110 in FIG. 46), the sequencer 170 executes not the step S4005 in FIG. 41, but the step S4002 in FIG. 41 (i.e. step S4102 in FIG. 46).

The step S4102 in FIG. 46 is similar to step S4002 in FIG. 41, and the step S4110 in FIG. 46 is similar to step S4010 in FIG. 41.

<4-5> Modification Example 2 of the Fourth Embodiment

Referring to FIG. 47, operations S4200 of Modification Example 2 of the fourth embodiment will be described.

The operations S4200 differ from the operations of FIG. 41 with respect to the operations of steps S4002 to S4004 in FIG. 41.

Specifically, in the operation corresponding to step S4002 in FIG. 41 (i.e. step S4202 in FIG. 47), the sequencer 170 determines whether a program loop number stored in the status register 180 is equal to or less than a first value.

When the sequencer 170 determines that the program loop number is not equal to or less than the first value (i.e. step S4202, No), the sequencer 170 sets the signal VBSTE at the time of the erase to the voltage VERAHL in the operation corresponding to step S4003 in FIG. 41 (i.e. step S4203 in FIG. 47).

When the sequencer 170 determines that the program loop number is equal to or less than the first value (i.e. step S4202, Yes), the sequencer 170 sets the signal VBSTE at the time of the erase to the voltage VERAHH in the operation corresponding to step S4004 in FIG. 41 (i.e. step S4204 in FIG. 47).

As described above, in Modification Example 2 of the fourth embodiment, the sequencer 170 determines the degree of degradation of the transfer transistor, not based on the erase loop number, but based on the program loop number.

<4-6> Modification Example 3 of the Fourth Embodiment

Figure 48:
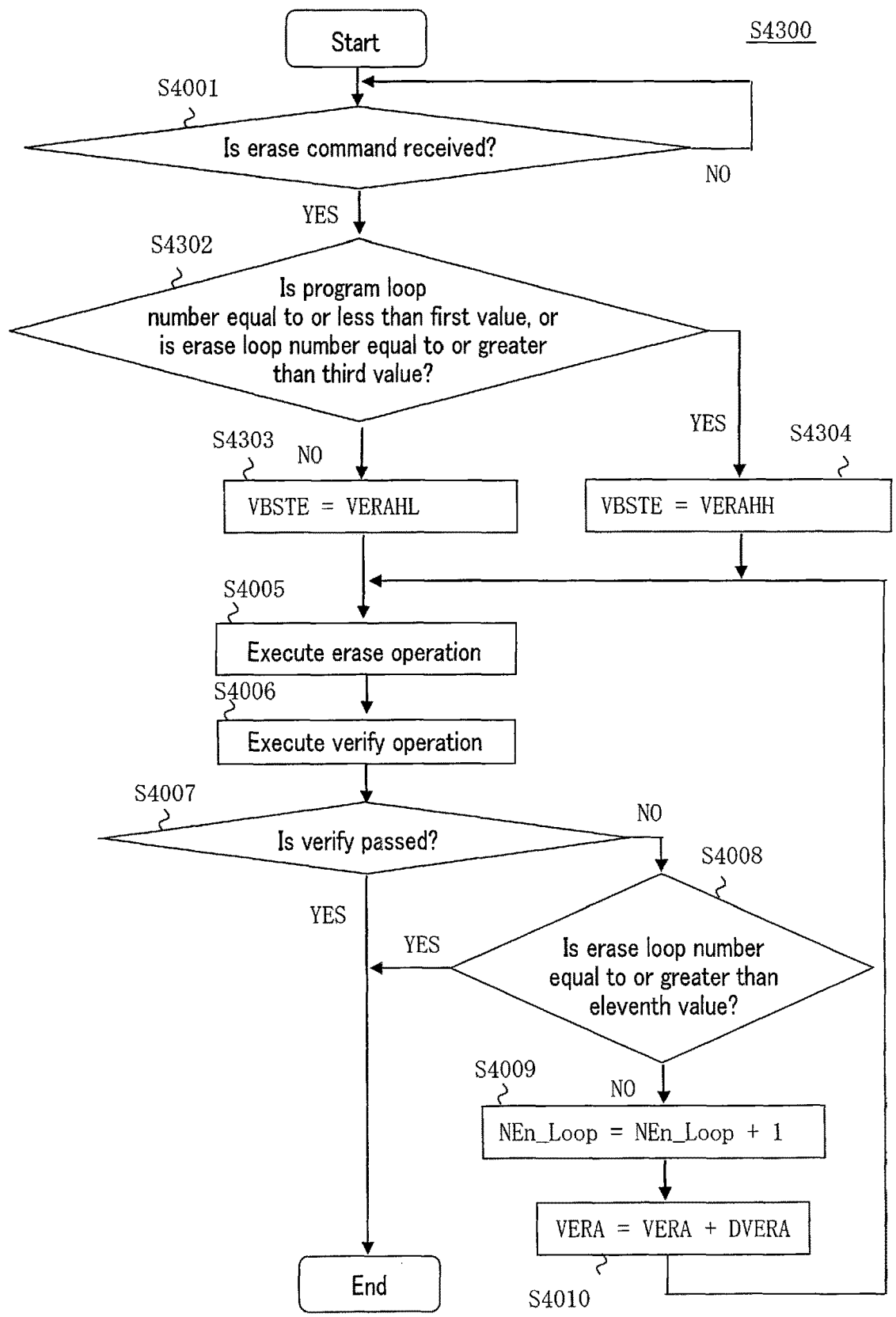
FIG. 48 is a flowchart of a data erase operation (S4300) of a memory system according to Modification Example 3 of the fourth embodiment.

Referring to FIG. 48, an operation S4300 of Modification Example 3 of the fourth embodiment will be described.

The operations S4300 differ from the operations of FIG. 41 with respect to the operations of steps S4002 to S4004 in FIG. 41.

Specifically, in the operation corresponding to step S4002 in FIG. 41 (i.e. step S4302 in FIG. 48), the sequencer 170 determines whether the program loop number stored in the status register 180 is equal to or less than a first value, or the erase loop number stored in the status register 180 is equal to or more than a third value.

If the sequencer 170 determines that the program loop number is not equal to or less than the first value, and further that the erase loop number is not equal to or more than the third value (i.e. step S4302, No), the sequencer 170 sets the signal VBSTE at the time of the erase to the voltage VERAHL in the operation corresponding to step S4003 in FIG. 41 (i.e. step S4303 in FIG. 48).

If the sequencer 170 determines that the program loop number is equal to or less than the first value, or that the erase loop number is equal to or more than the third value (i.e. step S4302, Yes), the sequencer 170 sets the signal VBSTE at the time of the erase to the voltage VERAHH in the operation corresponding to step S4004 in FIG. 41 (i.e. step S4304 in FIG. 48).

In step S4302, the sequencer 170 may determine whether the program loop number is equal to or less than the first value, and further, the erase loop number is equal to or more than the third value.

In this case, if the sequencer 170 determines that the program loop number is not equal to or less than the first value, or that the erase loop number is not equal to or more than the third value (i.e. step S4302, No), the sequencer 170 sets, in step S4303, the signal VBSTE at the time of the erase to the voltage VERAHL. Further, if the sequencer 170 determines that the program loop number is equal to or less than the first value, and that the erase loop number is equal to or more than the third value (i.e. step S4302, Yes), the sequencer 170 sets, in step S4304, the signal VBSTE at the time of the erase to the voltage VERAHH.

<4-7> Modification Example 4 of the Fourth Embodiment

Figure 49:
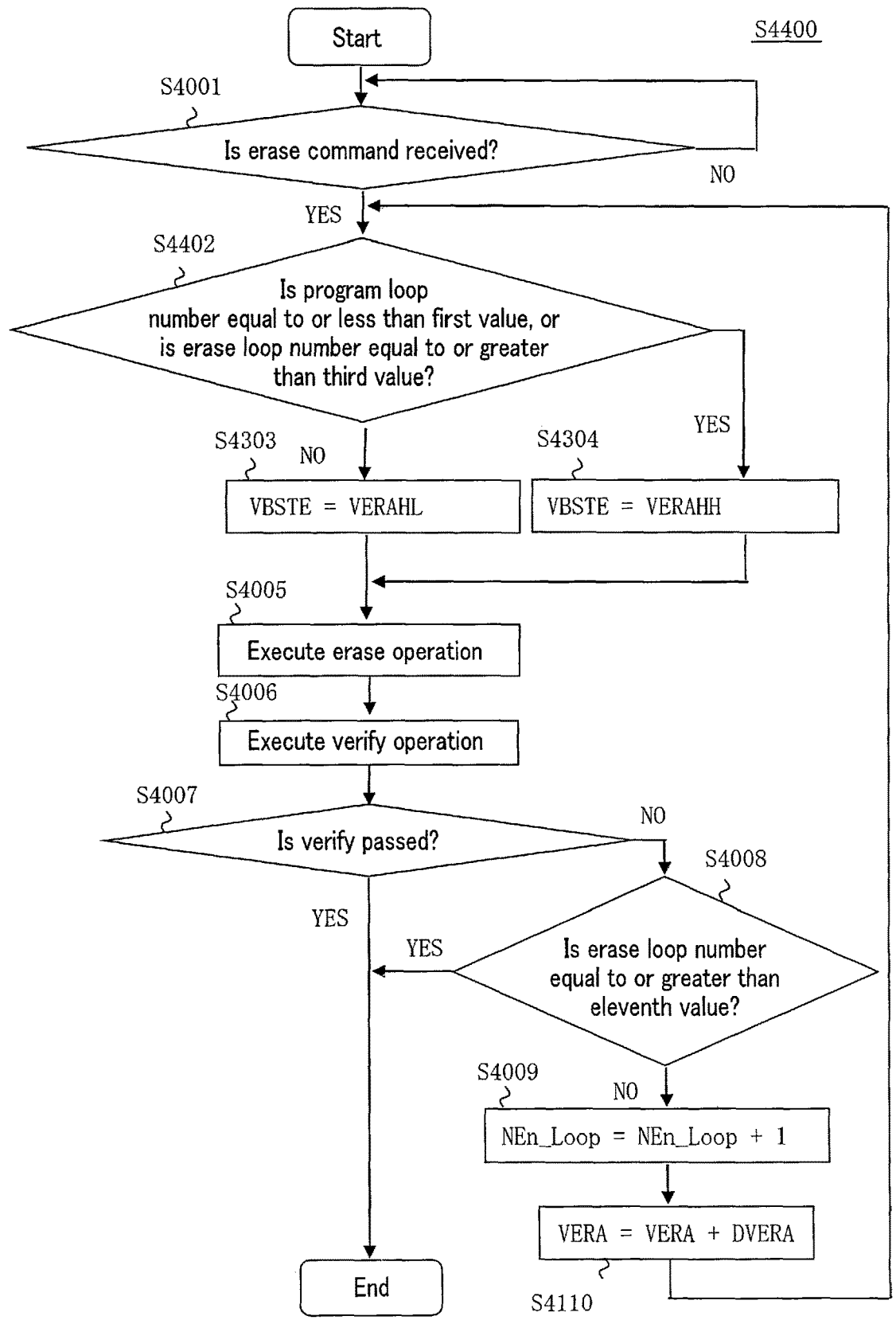
FIG. 49 is a flowchart of a data erase operation (S4400) of a memory system according to Modification Example 4 of the fourth embodiment.

Referring to FIG. 49, operations S4400 of Modification Example 4 of the fourth embodiment will be described.

The operations S4400 differ from the operations of FIG. 48 with respect to the operations after step S4010 in FIG. 48.

Specifically, after step S4010 in FIG. 48 (i.e. step S4110 in FIG. 49), the sequencer 170 executes not the step S4005 in FIG. 48, but the step S4302 in FIG. 48 (i.e. step S4402 in FIG. 49).

The step S4402 in FIG. 49 is similar to step S4302 in FIG. 48, and the step S4110 in FIG. 49 is similar to step S4010 in FIG. 48.

In step S4402, the sequencer 170 may determine whether the program loop number is equal to or less than the first value, and further, the erase loop number is equal to or more than the third value.

<4-8> Modification Example 5 of the Fourth Embodiment

Figure 50:
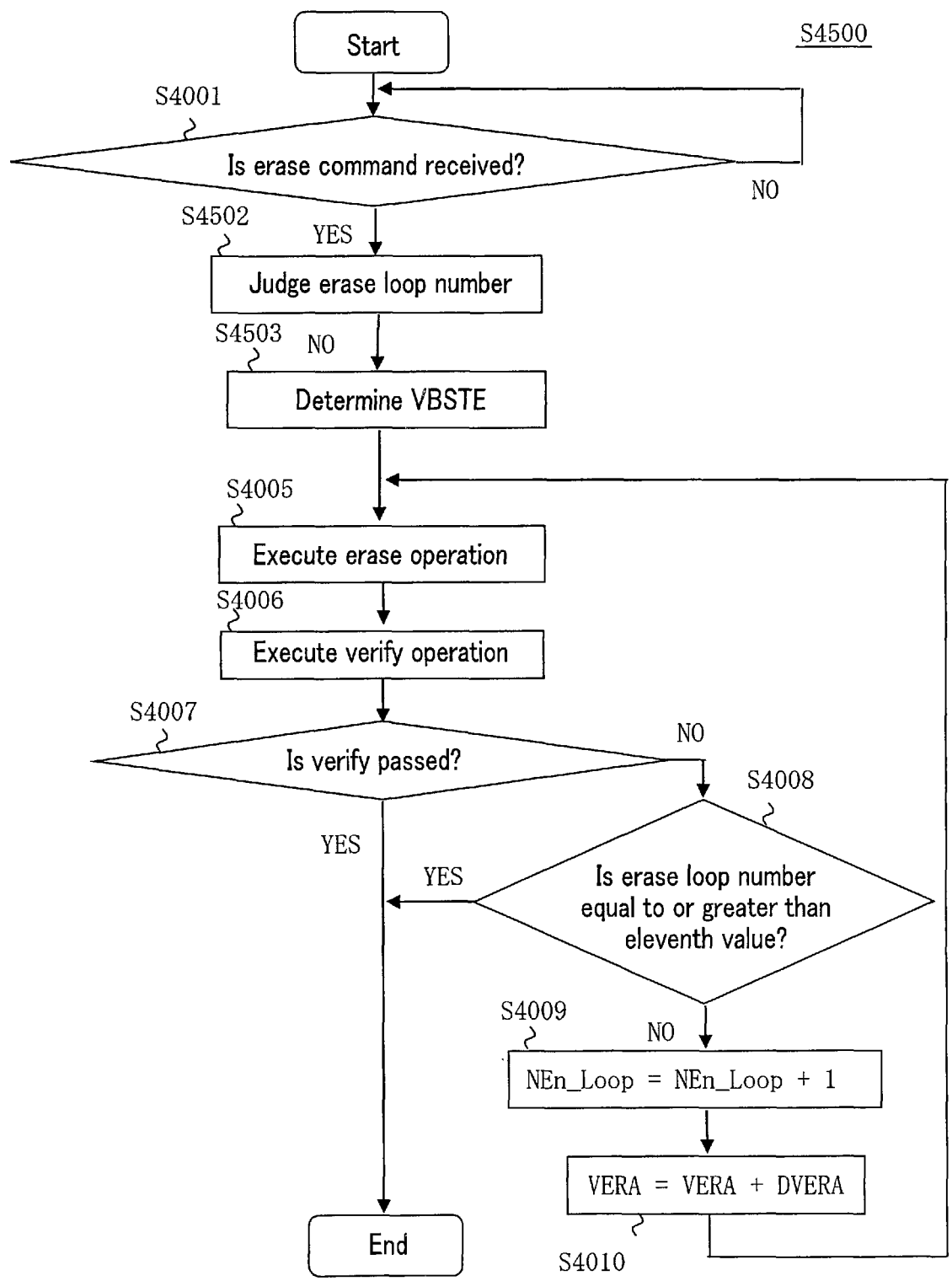
FIG. 50 is a flowchart of a data erase operation (S4500) of a memory system according to Modification Example 5 of the fourth embodiment.

Referring to FIG. 50, a description will be given of a case of generating three kinds of voltages as voltages for conducting or transferring the voltage VERA, based on the erase loop number.

[S4502]

When the sequencer 170 determines that the erase command is received from the memory controller 200 (i.e. step S4001, Yes), the sequencer 170 determines which of a plurality of ranges (e.g. three ranges in this example) the erase loop number stored in the status register 180 belongs to.

For an example, three ranges, namely a 28th range, a 29th range and a 30th range, are provided. When the erase loop number is equal to or less than a value S, the sequencer 170 determines that the erase loop number is in the 28th range. When the erase loop number is more than the value S and is equal to or less than a value T, the sequencer 170 determines that the erase loop number is in the 29th range. When the erase loop number is more than the value T, the sequencer 170 determines that the erase loop number is in the 30th range. The value S and value T may be preset, or may be arbitrarily set by a user.

[S4503]

Upon determination of which of the ranges the erase loop number belongs to, the sequencer 170 determines the voltage of the signal VBSTE at the time of the erase.

Specifically, when the sequencer 170 determines that the erase loop number belongs to the 28th range, the sequencer 170 sets the signal VBSTE to a voltage VERAH28 (VERA<VERAH28). If the sequencer 170 determines that the erase loop number belongs to the 29th range, the sequencer 170 sets the signal VBSTE to a voltage VERAH29 (VERAH28<VERAH29). When the sequencer 170 determines that the erase loop number belongs to the 30th range, the sequencer 170 sets the signal VBSTE to a voltage VERAH30 (VERAH29<VERAH30).

In this manner, the configuration may generate the three kinds of voltages as the voltages for conducting or transferring the voltage VERA.

Although the method of generating the three kinds of voltages as the voltages for conducting or transferring the voltage VERA is described herein for simplicity, four or more kinds of voltages may be generated similarly.

The above-described step S4502 may be replaced with step S4102 in FIG. 46. In addition, the step S4503 may be replaced with step S4003 and step S4004 in FIG. 46.

<4-9> Modification Example 6 of the Fourth Embodiment

Figure 51:
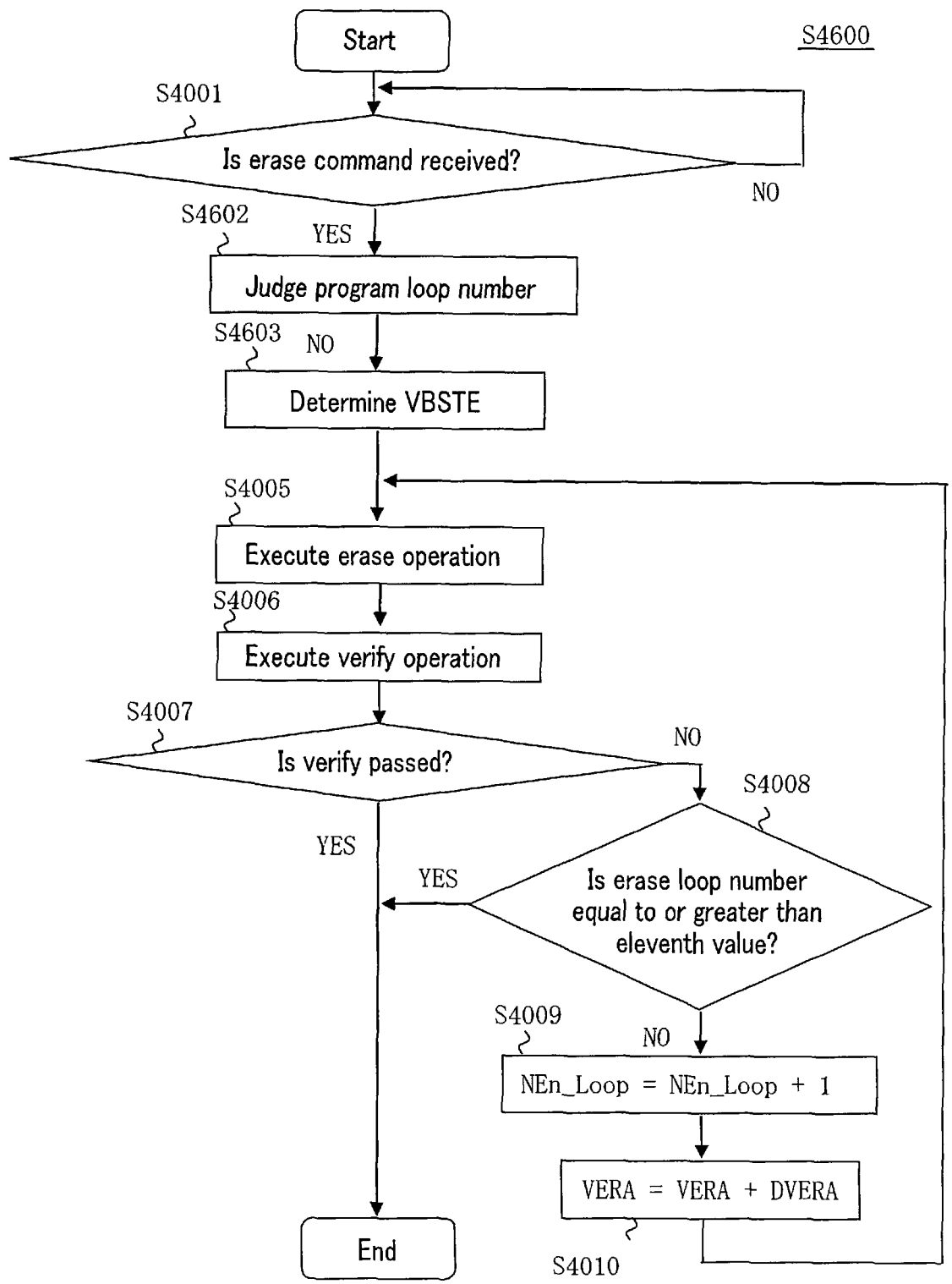
FIG. 51 is a flowchart of a data erase operation (S4600) of a memory system according to Modification Example 6 of the fourth embodiment.

Referring to FIG. 51, a description will be given of a case of generating three kinds of voltages as voltages for conducting or transferring the voltage VERA, based on the program loop number.

[S4602]

If the sequencer 170 determines that the erase command is received from the memory controller 200 (i.e. step S4001, Yes), the sequencer 170 determines which of a plurality of ranges (e.g. three ranges in this example) the program loop number stored in the status register 180 belongs to.

For an example, three ranges, namely a 31st range, a 32nd range and a 33rd range, are provided. When the program loop number is equal to or less than a value U, the sequencer 170 determines that the program loop number is in the 31st range. When the program loop number is more than the value U and is equal to or less than a value V, the sequencer 170 determines that the program loop number is in the 32nd range. When the program loop number is more than the value V, the sequencer 170 determines that the program loop number is in the 33rd range. The value U and value V may be preset, or may be arbitrarily set by a user.

[S4603]

Upon determination of which of the ranges the program loop number belongs to, the sequencer 170 determines the voltage of the signal VBSTE at the time of the erase.

Specifically, if the sequencer 170 determines that the program loop number belongs to the 33rd range, the sequencer 170 sets the signal VBSTE to a voltage VERAH33 (VERA<VERAH33). If the sequencer 170 determines that the program loop number belongs to the 32nd range, the sequencer 170 sets the signal VBSTE to a voltage VERAH32 (VERAH33<VERAH32). If the sequencer 170 determines that the program loop number belongs to the 31st range, the sequencer 170 sets the signal VBSTE to a voltage VERAH31 (VERAH32<VERAH31).

In this manner, the configuration may generate the three kinds of voltages as the voltages for conducting or transferring the voltage VERA.

Although the method of generating the three kinds of voltages as the voltages for conducting or transferring the voltage VERA is described herein for simplicity, four or more kinds of voltages may be generated similarly.

<5> Fifth Embodiment

A fifth embodiment will be described. In the fifth embodiment, a description is given of a case in which the memory controller controls the signal VBSTE. The typical configuration and typical operation of the memory device according to the fifth embodiment are similar to those of the memory devices according to the above-described first embodiment and fourth embodiment. Accordingly, descriptions are omitted of the matters described in the first embodiment and the fourth embodiment, and matters which are easily guessed from the first embodiment and the fourth embodiment.

<5-1> Operation

Figure 52:
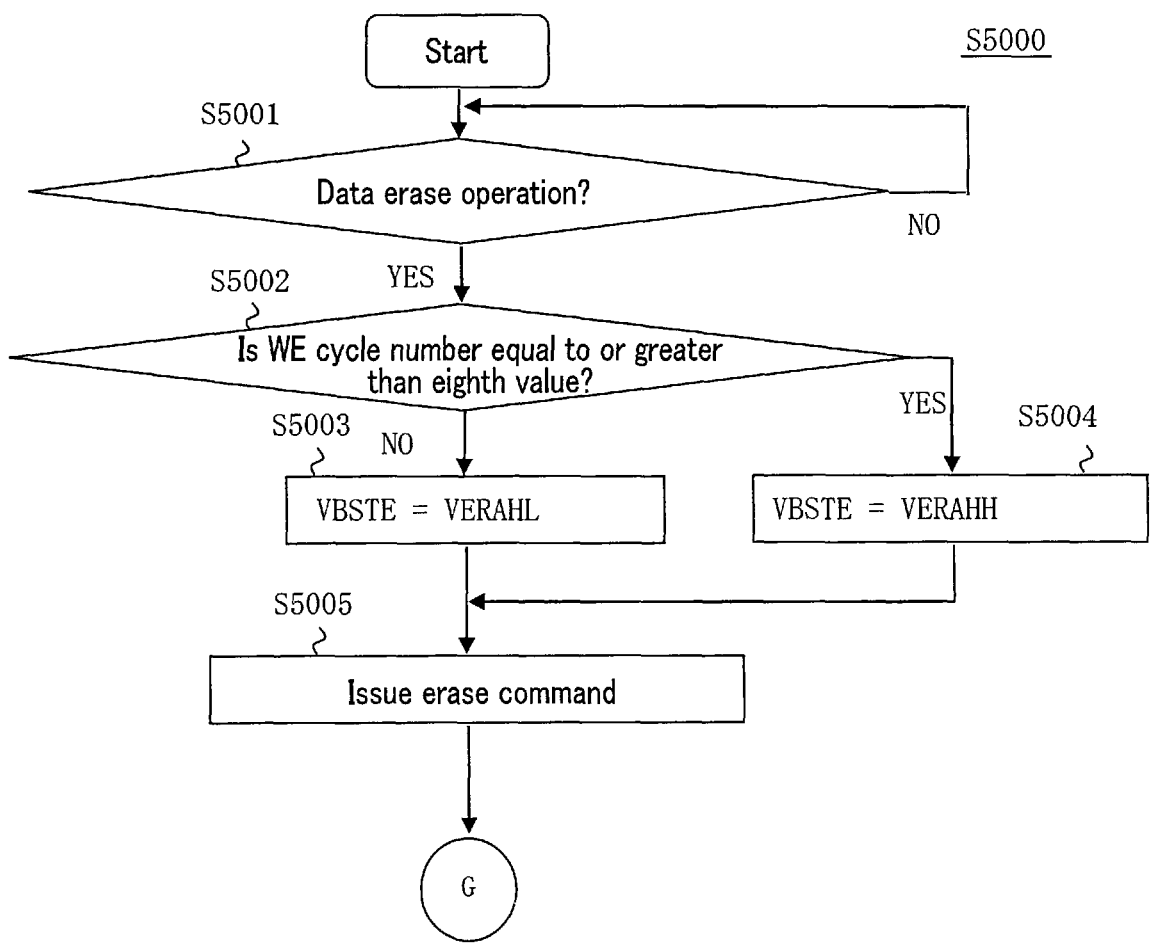
FIG. 52 is a flowchart of a data erase operation (S5000) of a memory system according to a fifth embodiment.

Flowcharts of a data erase operation (S5000, S5100) according to the fifth embodiment will be described. To begin with, referring to FIG. 52, the operations (S5000) of the memory controller 200 are described. Here, for simplicity, the main entity which executes the operations is a processor 230, but the configuration is not limited to it.

[S5001]

The processor 230 determines whether to execute a data erase operation.

[S5002]

If the processor 230 determines to execute the data erase operation (i.e. step S5001, Yes), the processor 230 determines whether the write/erase (WE) cycle number (WE cycle number) is equal to or more than an eighth value.

[S5003]

If the processor 230 determines that the write/erase cycle number is not equal to or more than the eighth value, the processor 230 sets the signal VBSTE to the voltage VERAHL. Specifically, when the processor 230 issues a data erase command to the NAND flash memory 100, the processor 230 provides the information "Set signal VBSTE to voltage VERAHL" to the sequencer 170.

[S5004]

If the processor 230 determines that the write/erase cycle number is equal to or greater than the eighth value, the processor 230 sets the signal VBSTE to the voltage VERAHH. Specifically, when the processor 230 issues a data erase command to the NAND flash memory 100, the processor 230 provides the information "Set signal VBSTE to voltage VERAHH" to the sequencer 170.

[S5005]

The processor 230 issues to the NAND flash memory 100 an erase command sequence including the information obtained by the step S5003 or S5004.

Figure 53:
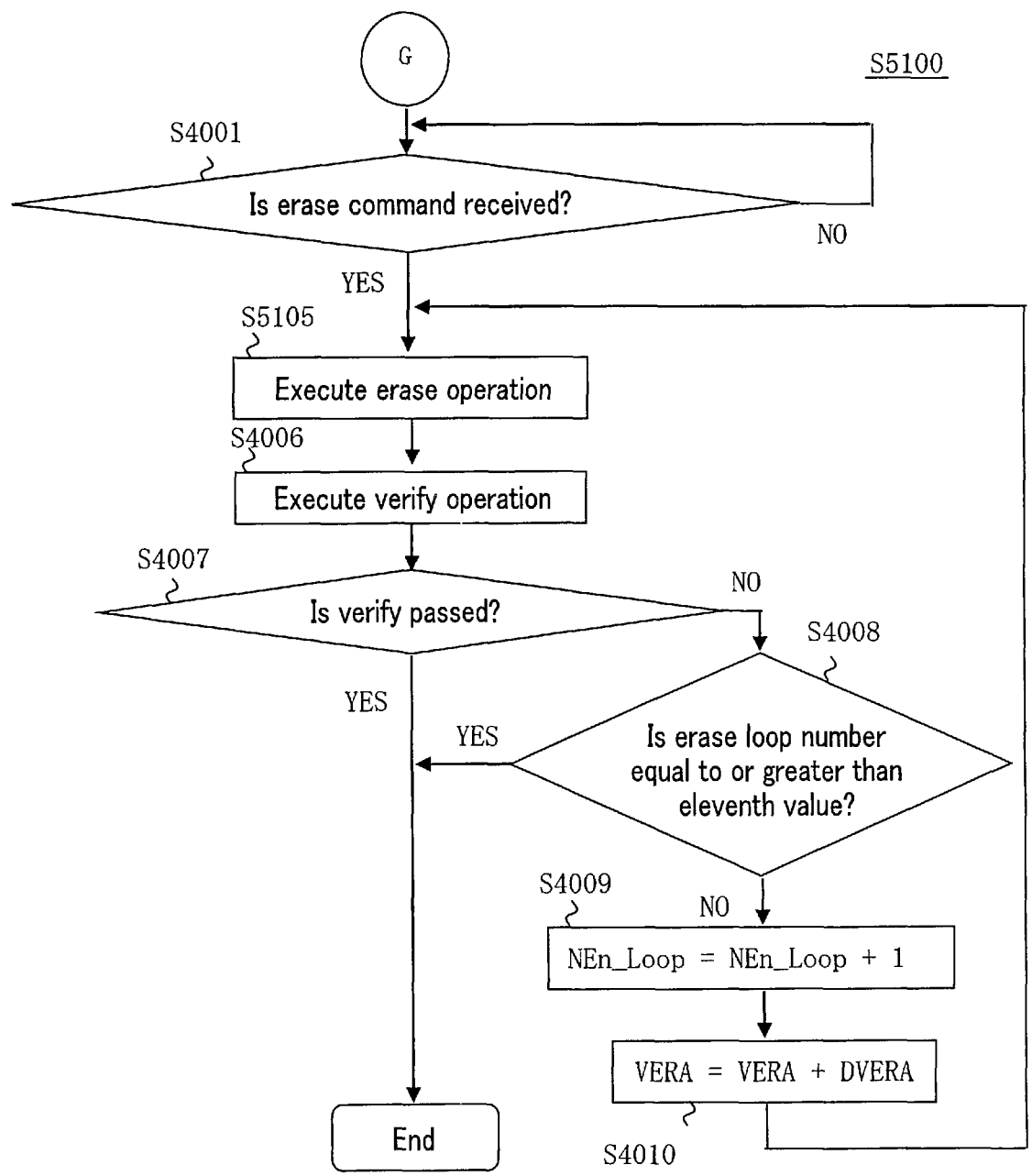
FIG. 53 is a flowchart of a data erase operation (S5100) of the memory system according to the fifth embodiment.

Next, referring to FIG. 53, the operations S5100 of the NAND flash memory 100 will be described.

[S4001]

The sequencer 170 executes operations similar to the above-described step S4001.

[S5105]

The sequencer 170 executes the erase based on the settings determined by the processor 230.

[S4006]~[S4010]

The sequencer 170 executes operations similar to the above-described steps S4006 to S4010.

<5-2> Command Sequence

Referring to FIG. 54, a command sequence at the time of the data erase operation will be described. As illustrated in FIG. 54, the memory controller 200 issues a data erase command GGH, and asserts the signal CLE ("H" level). For example, this data erase command GGH includes the information relating to the signal VBSTE determined in steps S5002 to S5004. Needless to say, since it should suffice if the NAND flash memory 100 is notified of the information relating to the signal VBSTE determined in steps S5002 to S5004, this information may be issued at a different timing from the command GGH.

The subsequent command sequence is similar to the sequence described with reference to FIG. 43. A command IIH shown in FIG. 54 corresponds to the command FFH in FIG. 43.

<5-3> Advantageous Effects

According to the above-described embodiment, the sequencer 170 varies the voltage of the signal VBSTE in accordance with the write/erase cycle number. Thereby, it causes the transfer transistor to properly conduct or transfer a voltage.

As described above, there is a tendency that the degradation of the transfer transistor progresses as the number of times of write (or the number of times of erase) in the memory cell transistor becomes larger. Thus, in the present embodiment, by determining whether the write/erase (WE) cycle number is equal to or more than a certain value, the sequencer 170 determines the frequency of use of the transfer transistor, that is, the degree of degradation of the transfer transistor.

<5-4> Modification Example of the Fifth Embodiment

Figure 55:
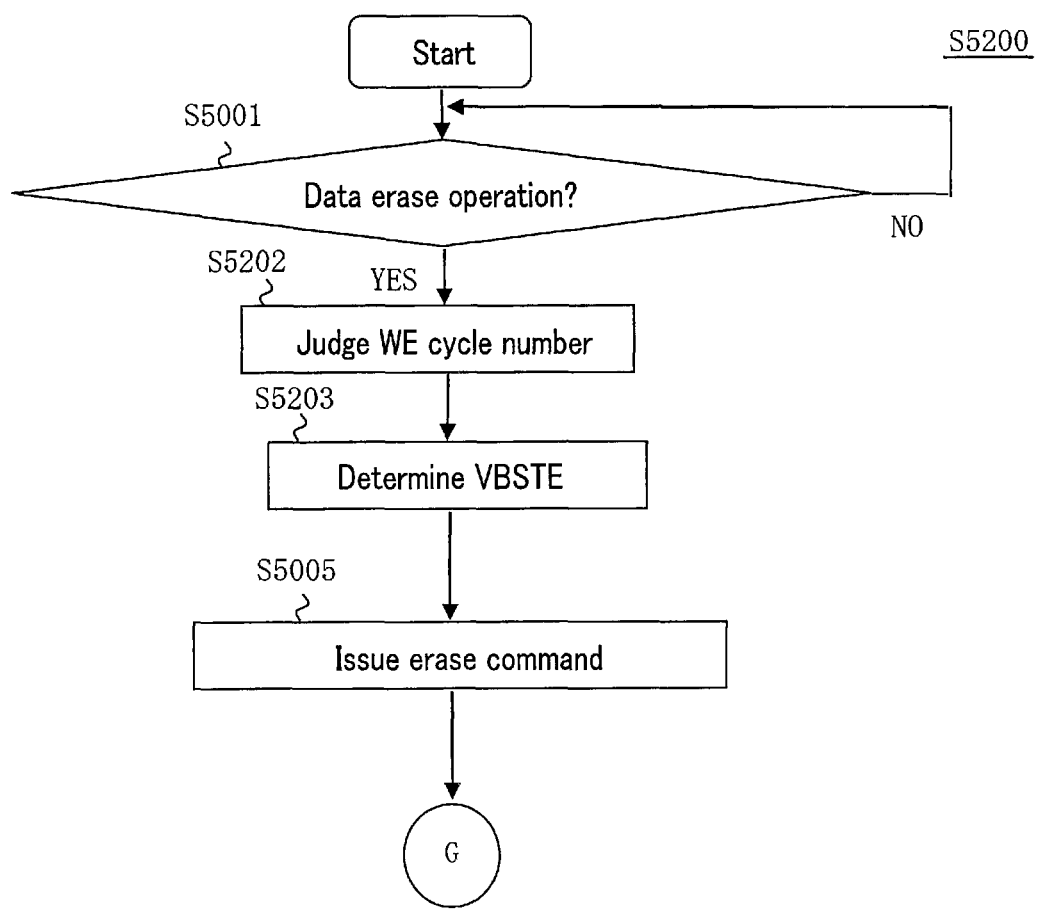
FIG. 55 is a flowchart of a data erase operation (S5200) of a memory system according to a Modification Example of the fifth embodiment.

Referring to FIG. 55, a description will be given of operations in a case of generating three kinds of voltages as voltages for conducting or transferring the voltage VERA.

[S5202]

When the processor 230 determines to execute the data erase operation (i.e. step S5001, Yes), the processor 230 determines which of a plurality of ranges (e.g. three ranges in this example) the write/erase (WE) cycle number stored in the internal memory 220 belongs to.

For an example, three ranges, namely a 34th range, a 35th range and a 36th range, are provided. When the write/erase cycle number is equal to or less than a value W, the sequencer 230 determines that the write/erase cycle number is in the 34th range. When the write/erase cycle number is more than the value W and is equal to or less than a value X, the processor 230 determines that the write/erase cycle number is in the 35th range. When the write/erase cycle number is more than the value X, the processor 230 determines that the write/erase cycle number is in the 36th range. The value W and value X may be preset, or may be arbitrarily set by a user.

[S5203]

Upon determination of which of the ranges the write/erase cycle number belongs to, the processor 230 determines the voltage of the signal VBSTE at the time of the erase.

Specifically, when the processor 230 determines that the write/erase cycle number belongs to the 34th range, the processor 230 sets the signal VBSTE to a voltage VERAH34 (VERA<VERAH34). When the processor 230 determines that the write/erase cycle number belongs to the 35th range, the processor 230 sets the signal VBSTE to a voltage VERAH35 (VERAH34<VERAH35). When the processor 230 determines that the write/erase cycle number belongs to the 36th range, the processor 230 sets the signal VBSTE to a voltage VERAH36 (VERAH35<VERAH36).

The configuration may generate the three kinds of voltages as the voltages for conducting or transferring the voltage VERA.

Although the method of generating the three kinds of voltages as the voltages for conducting or transferring the voltage VERA is described herein for simplicity, four or more kinds of voltages may be generated similarly.

<6> Additional Description

In the above-described embodiments and modification examples, the case is discussed in which a memory cell array 110 of a three-dimensionally stacked-type memory is provided. However, even when they are applied to a memory cell array of a planar-type memory, the advantageous effects similar to the above-described embodiments and modification examples are obtained.

The configuration of the memory cell array 110 is disclosed, for example, in U.S. patent application Ser. No. 12/397,711 filed Mar. 3, 2009 and entitled "SEMICONDUCTOR MEMORY DEVICE HAVING PLURALITY OF TYPES OF MEMORIES INTEGRATED ON ONE CHIP". The configuration of the memory cell array 110 is also disclosed in U.S. patent application Ser. No. 13/451,185 filed Apr. 19, 2012, and entitled "SEMICONDUCTOR MEMORY DEVICE INCLUDING STACKED GATE HAVING CHARGE ACCUMULATION LAYER AND CONTROL GATE AND METHOD OF WRITING DATA TO SEMICONDUCTOR MEMORY DEVICE", U.S. patent application Ser. No. 12/405,626 filed Mar. 17, 2009 and entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT", and U.S. patent application Ser. No. 09/956,986 filed Sep. 21, 2001 and entitled "NONVOLATILE SEMICONDUCTOR MEMORY DEVICE HAVING ELEMENT ISOLATING REGION OF TRENCH TYPE AND METHOD OF MANUFACTURING THE SAME". The entirety of these patent applications is incorporated in the present specification by reference.

In each of the above-described embodiments and modification examples, the memory system 1 which is configured to include a single NAND flash memory 100 is described, but the configurations are not limited to it. Even when the memory system 1 includes a plurality of NAND flash memories 100, the similar advantageous effects are obtained.

In each of the above-described embodiments and modification examples, the NAND flash memory 100 which is configured to include a single memory cell array 110 is described, but the configuration is not limited to it. Even when the NAND flash memory 100 includes a plurality of memory cell arrays 110, the similar advantageous effects are obtained.

The above-described operations of the program, program verify, erase and erase verify are discussed by way of example. The waveforms, other than the waveforms of the signals VBST, VRDEC and VBSTE, may be variously modified.

The term "connect", "connected" or "connection" in each of the above-described embodiments and modification examples includes a state of "indirect connection" via one or more elements such as a transistor or a resistor.

What is claimed is:

1. A memory device comprising:
a first memory cell configured to store data;
a first word line connected to the first memory cell;
a first circuit configured to supply a voltage to the first word line;
a second circuit configured to control the first circuit; and
a memory unit configured to store a number of times of data erase of the first memory cell; and
a sequencer configured to control the first circuit and the second circuit,
wherein the sequencer, when data is written to the first memory cell,
determines whether the number of times of data erase, which is stored in the memory unit, is equal to or more than a given number,
causes the second circuit to generate a first voltage, when the sequencer determines that the number of times of data erase is not equal to or more than the given number, and
causes the second circuit to generate a second voltage which is higher than the first voltage, when the sequencer determines that the number of times of data erase is equal to or more than the given number, and
wherein the first circuit supplies, based on the first voltage or the second voltage, a third voltage, which is lower than the second voltage, to the first word line.

2. A memory device comprising:
a first memory cell configured to store data;
a first word line connected to the first memory cell;
a first circuit configured to supply a voltage to the first word line;
a second circuit configured to control the first circuit;
a third circuit configured to conduct a voltage supplied by the first circuit to the first word line, wherein the second circuit further controls the third circuit;
a memory unit configured to store a number of times of data erase of the first memory cell; and
a sequencer configured to control the first circuit and the second circuit,
wherein the sequencer, when data is written to the first memory cell,
determines whether the number of times of data erase stored in the memory unit is equal to or more than a first number and whether the number of times of data erase is equal to or more than a second number,
causes the second circuit to generate a first voltage for a voltage to be supplied to the first circuit, when the sequencer determines that the number of times of data erase is not equal to or more than the first number,
causes the second circuit to generate the first voltage for a voltage to be supplied to the third circuit, when the sequencer determines that the number of times of data erase is not equal to or more than the second number,
causes the second circuit to generate a second voltage, which is higher than the first voltage, for a voltage to be supplied to the first circuit, when the sequencer determines that the number of times of data erase is equal to or more than the first number, and
causes the second circuit to generate the second voltage for a voltage to be supplied to the third circuit, when the sequencer determines that the number of times of program is equal to or more than the second number, and
wherein the first circuit supplies, based on the first voltage or the second voltage, a third voltage, which is lower than the second voltage, to the first word line.

3. A memory device comprising:
a semiconductor substrate;
a first word line;
a first memory cell including a gate connected to the first word line, and including one end connected to the semiconductor substrate;
a fourth circuit configured to supply a voltage to the semiconductor substrate;
a fifth circuit configured to control the fourth circuit; and
a sequencer configured to control the fourth circuit and the fifth circuit,
wherein the sequencer, in a case of erasing data stored in the first memory cell,
determines whether a condition is satisfied or not,
causes the fifth circuit to generate a fourth voltage, when the sequencer determines that the condition is not satisfied,
causes the fifth circuit to generate a fifth voltage which is higher than the fourth voltage, when the sequencer determines that the condition is satisfied, and
supplies, based on the fourth voltage or the fifth voltage, a sixth voltage, which is lower than the fourth voltage, to the semiconductor substrate.

4. The memory device of claim 3, further comprising a first memory unit configured to store a number of times of program in a case of writing data in the first memory cell, and wherein the sequencer, when data stored in the first memory cell is erased,
determines whether the number of times of program stored in the first memory unit is equal to or less than a first number,
causes the fifth circuit to generate the fourth voltage, when the sequencer determines that the number of times of program is not equal to or less than the first number, and
causes the fifth circuit to generate the fifth voltage, when the sequencer determines that the number of times of program is equal to or less than the first number.

5. The memory device of claim 3, further comprising a third memory unit configured to store a number of times of program in a case of writing data in the first memory cell and the number of times of erase in a case of erasing data stored in the first memory cell, and
wherein the sequencer, when data stored in the first memory cell is erased,
determines whether the number of times of program stored in the third memory unit is equal to or less than a first number or whether the number of times of erase stored in the third memory unit is equal to or more than a second number,
causes the fifth circuit to generate the fourth voltage, when the sequencer determines that the number of times of program is not equal to or less than the first number or that the number of times of erase is not equal to or more than the second number, and
causes the fifth circuit to generate the fifth voltage, when the sequencer determines that the number of times of program is equal to or less than the first number or that the number of times of erase is equal to or more than the second number.

6. A memory system comprising:
a memory device which includes:
a semiconductor substrate;
a first word line;
a first memory cell including a gate connected to the first word line, and including one end connected to the semiconductor substrate;
a fourth circuit configured to supply a voltage to the semiconductor substrate;
a fifth circuit configured to control the fourth circuit; and
a sequencer configured to control the fourth circuit and the fifth circuit; and
a controller configured to control the memory device, and
wherein the controller, in a case of erasing data stored in the first memory cell,
determines whether a condition is satisfied or not,
causes the fifth circuit to generate a fourth voltage, when the controller determines that the condition is not satisfied,
causes the fifth circuit to generate a fifth voltage which is higher than the fourth voltage, when the controller determines that the condition is satisfied, and
wherein the fourth circuit supplies, based on the fourth voltage or the fifth voltage, a sixth voltage, which is lower than the fourth voltage, to the semiconductor substrate.

7. The memory system of claim 6, further comprising a fourth memory unit configured to store a number of times of data write and erase to the first memory cell, and
wherein the controller, when data stored in the first memory cell is erased,
determines whether the number of times of data write and erase stored in the fourth memory unit is equal to or more than a second number,
causes the fifth circuit to generate the fourth voltage, when the controller determines that the number of times of data write and erase is not equal to or more than the second number, and
causes the fifth circuit to generate the fifth voltage, when the controller determines that the number of times of data write and erase is equal to or more than the second number.

* * * * *